US010937791B1

(12) United States Patent
Huang

(10) Patent No.: US 10,937,791 B1
(45) Date of Patent: Mar. 2, 2021

(54) METHOD FOR FABRICATING AND SEMICONDUCTOR DEVICE HAVING THE SECOND BIT LINE CONTACT HIGHER THAN THE TOP SURFACE OF THE FIRST BIT LINE

(71) Applicant: NANYA TECHNOLOGY CORPORATION, New Taipei (TW)

(72) Inventor: Chih-Wei Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/552,209

(22) Filed: Aug. 27, 2019

(51) Int. Cl.
*H01L 27/108* (2006.01)
*H01L 23/528* (2006.01)
*H01L 23/532* (2006.01)

(52) U.S. Cl.
CPC ...... *H01L 27/10885* (2013.01); *H01L 23/528* (2013.01); *H01L 23/53271* (2013.01); *H01L 27/10814* (2013.01); *H01L 27/10852* (2013.01); *H01L 27/10873* (2013.01); *H01L 27/10888* (2013.01)

(58) Field of Classification Search
CPC ......... H01L 27/10885; H01L 27/10888; H01L 27/10811; H01L 27/10814; H01L 23/528; H01L 23/53271
See application file for complete search history.

(56) References Cited

U.S. PATENT DOCUMENTS

2017/0125439 A1* 5/2017 Choi ................. H01L 27/11573

* cited by examiner

*Primary Examiner* — Hoai V Pham
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate having an upper surface; a plurality of first bit line contacts contacting the upper surface of the substrate; a plurality of first bit lines respectively correspondingly positioned on the plurality of first bit line contacts; a plurality of second bit line contacts contacting the upper surface of the substrate; and a plurality of second bit lines respectively correspondingly positioned on the plurality of first bit line contacts. In some embodiments, the top surfaces of the plurality of second bit line contacts are positioned at a vertical level higher than the top surfaces of the plurality of first bit lines.

20 Claims, 93 Drawing Sheets

METHOD FOR FABRICATING AND SEMICONDUCTOR DEVICE HAVING THE SECOND BIT LINE CONTACT HIGHER THAN THE TOP SURFACE OF THE FIRST BIT LINE

TECHNICAL FIELD

The present disclosure relates to a semiconductor device and a method for fabricating the semiconductor device, and more particularly, to a semiconductor device with bit lines having different vertical levels and a method for fabricating the semiconductor device with bit lines having different vertical levels.

DISCUSSION OF THE BACKGROUND

Semiconductor devices are used in a variety of electronic applications, such as personal computers, cell phones, digital cameras, and other electronic equipment. The dimensions of semiconductor devices are continuously being scaled down to meet the increasing demand of computing ability. However, a variety of issues arise during the scaling-down process and impact the final electrical characteristics, quality, and yield. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate having an upper surface; a plurality of first bit line contacts contacting the upper surface of the substrate; a plurality of first bit lines respectively correspondingly positioned on the plurality of first bit line contacts; a plurality of second bit line contacts contacting the upper surface of the substrate; and a plurality of second bit lines respectively correspondingly positioned on the plurality of first bit line contacts. In some embodiments, the top surfaces of the plurality of second bit line contacts are positioned at a vertical level higher than the top surfaces of the plurality of first bit lines.

In some embodiments, the plurality of first bit lines are separated from each other and parallel to each other.

In some embodiments, the plurality of second bit lines are positioned between adjacent pairs of the plurality of first bit lines.

In some embodiments, the plurality of first bit line contacts are formed of doped polysilicon, a metal, or a metal silicide.

In some embodiments, the plurality of second bit lines are formed of copper, nickel, cobalt, aluminum, or tungsten.

In some embodiments, at least one of the plurality of first bit lines comprises a bottom bit line electrode layer, a top bit line electrode layer, and a mask pattern, wherein the bottom bit line electrode layer is correspondingly positioned on one of the plurality of first bit line contacts, the top bit line electrode layer is positioned on the bottom bit line electrode layer, and the mask pattern is positioned on the top bit line electrode layer.

In some embodiments, the bottom bit line electrode layer is formed of polysilicon.

In some embodiments, the top bit line electrode layer is formed of copper, nickel, cobalt, aluminum, or tungsten.

In some embodiments, the mask pattern is formed of silicon oxide or silicon nitride.

In some embodiments, bottom surfaces of the plurality of second bit lines are positioned at a vertical level higher than the top surfaces of the plurality of first bit lines.

Another aspect of the present disclosure provides a method for fabricating a semiconductor device including: providing a substrate having an upper surface; forming a plurality of first bit line contacts contacting the upper surface of the substrate; forming a plurality of first bit lines respectively correspondingly positioned on the plurality of first bit line contacts; forming a plurality of second bit line contacts contacting the upper surface of the substrate; and forming a plurality of second bit lines respectively correspondingly positioned on the plurality of first bit line contacts. In some embodiments, the top surfaces of the plurality of second bit line contacts are positioned at a vertical level higher than the top surfaces of the plurality of first bit lines.

In some embodiments, the plurality of first bit line contacts are formed of doped polysilicon, a metal, or a metal silicide.

In some embodiments, bottom surfaces of the plurality of second bit lines are positioned at a vertical level higher than the top surfaces of the plurality of first bit lines.

In some embodiments, the plurality of first bit lines are separated from each other and parallel to each other.

In some embodiments, the plurality of second bit lines are positioned between adjacent pairs of the plurality of first bit lines.

In some embodiments, the plurality of first bit line contacts are formed of doped polysilicon, a metal, or a metal silicide.

In some embodiments, the plurality of second bit lines are formed of copper, nickel, cobalt, aluminum, or tungsten.

In some embodiments, the plurality of second bit line contacts are formed of doped polysilicon, a metal, or a metal silicide.

In some embodiments, the method further comprises: forming a plurality of plugs contacting the upper surface of the substrate.

In some embodiments, the method further comprises: forming a plurality of capacitors respectively correspondingly positioned on the plurality of plugs.

Due to the design of the semiconductor device of the present disclosure, the distance between one of the plurality of first bit lines and an adjacent one of the plurality of second bit lines may be extended as compared to the prior art; therefore, the resistive-capacitive delay induced by the parasitic capacitance originating from adjacent bit lines may be alleviated.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
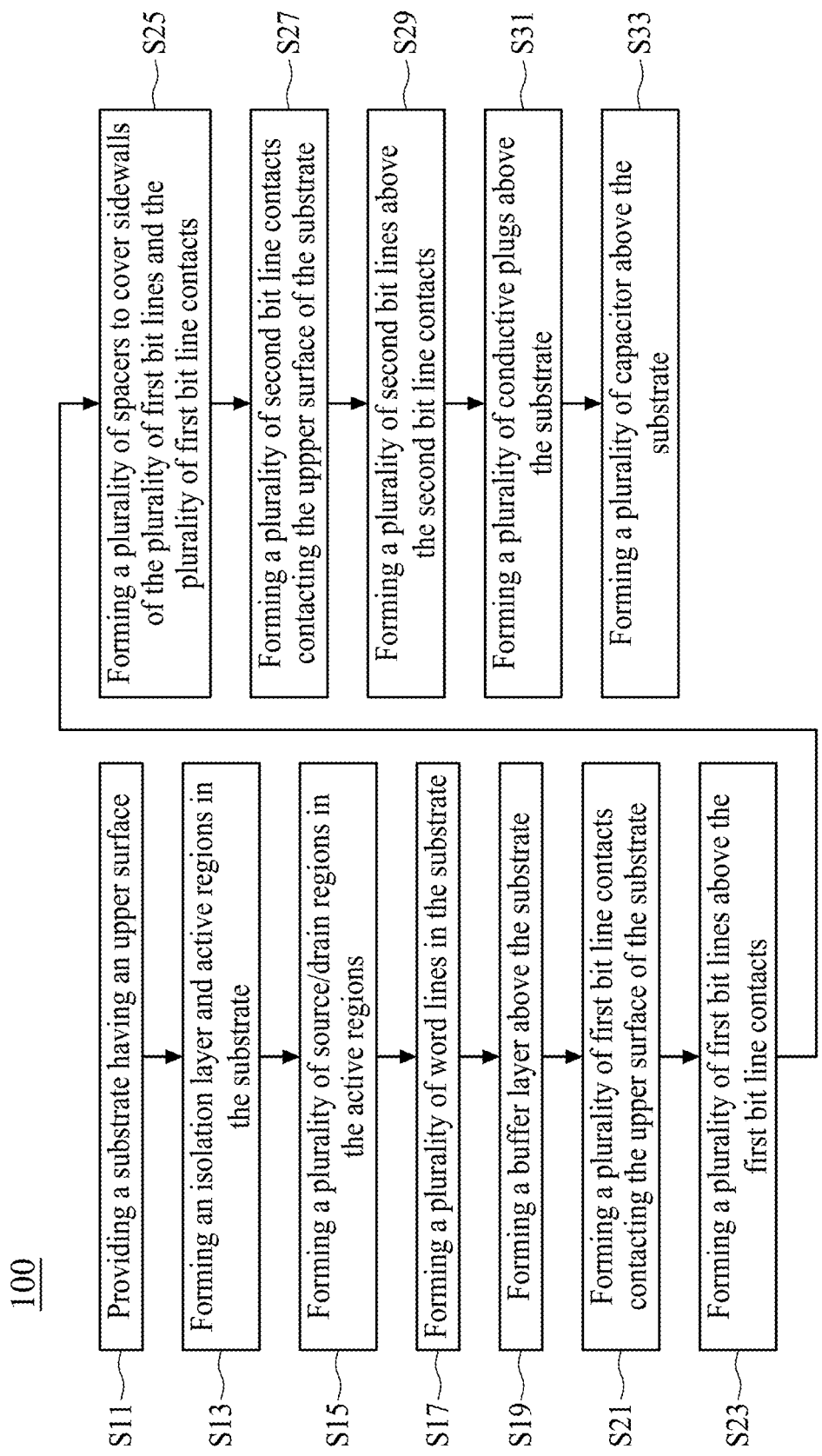
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure.

These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

It should be noted that, in the description of the present disclosure, above (or up) corresponds to the direction of the arrow of the direction Z, and below (or down) corresponds to the opposite direction of the arrow of the direction Z.

Figure 2:
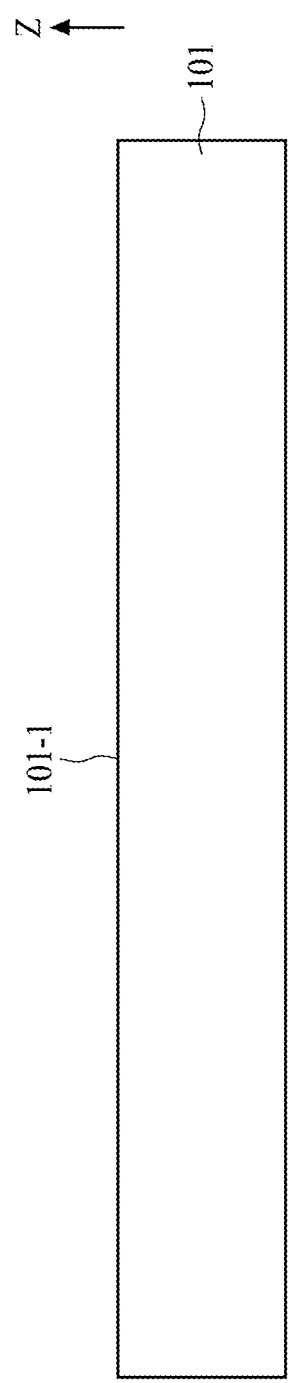
FIG. 2 illustrates, in a schematic cross-sectional diagram, part of a flow of fabricating a semiconductor device in accordance with one embodiment of the present disclosure.

FIG. 1 illustrates, in a flowchart diagram form, a method 100 for fabricating a semiconductor device in accordance with one embodiment of the present disclosure. FIG. 2 illustrates, in a schematic cross-sectional diagram, part of a flow of fabricating a semiconductor device in accordance with one embodiment of the present disclosure.

With reference to FIG. 1 and FIG. 2, at step S11, a substrate 101 having an upper surface 101-1 may be provided. The substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Figure 3:
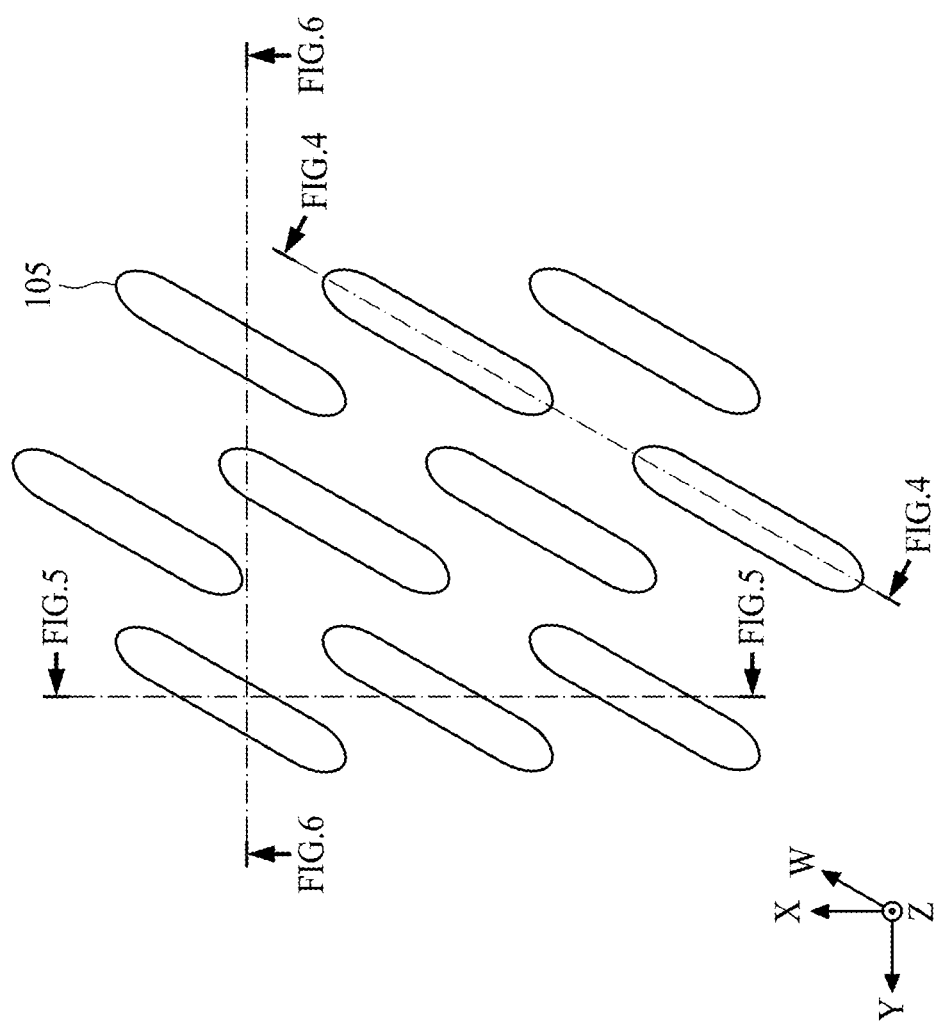
FIG. 3 illustrates, in a schematic top-view diagram, part of the flow of fabricating the semiconductor device in accordance with one embodiment of the present disclosure.
Figure 4:
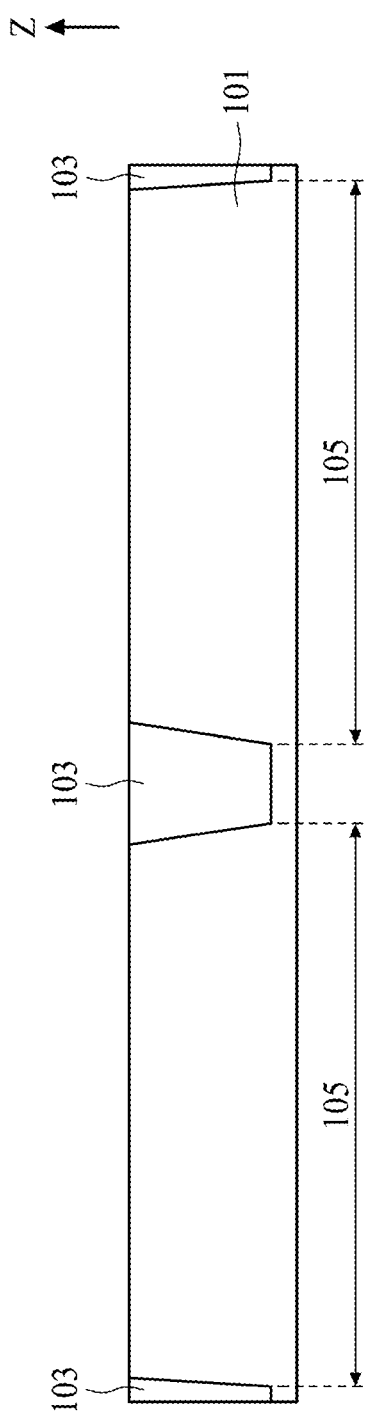
FIGS. 4 to 6 illustrate, in schematic cross-sectional diagrams, part of the flow of fabricating the semiconductor device in accordance with FIG. 3.
Figure 5:
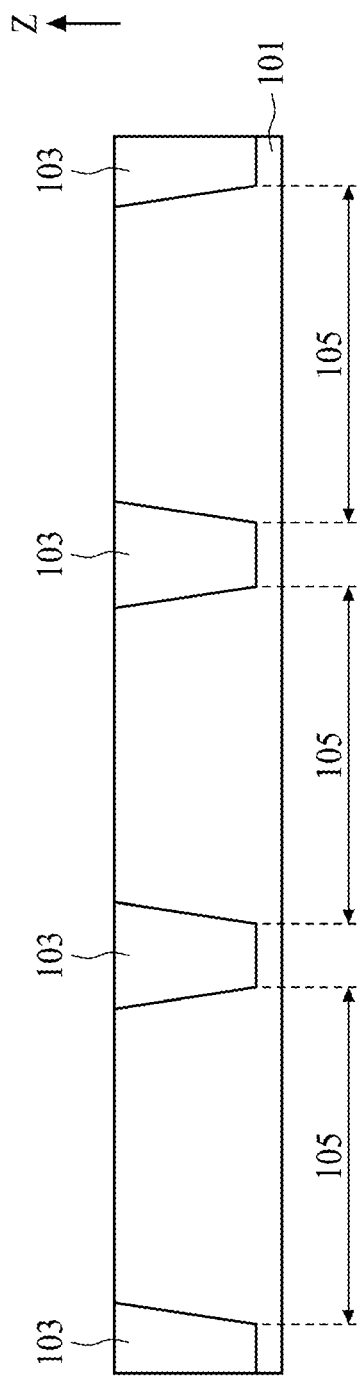
Figure 6:
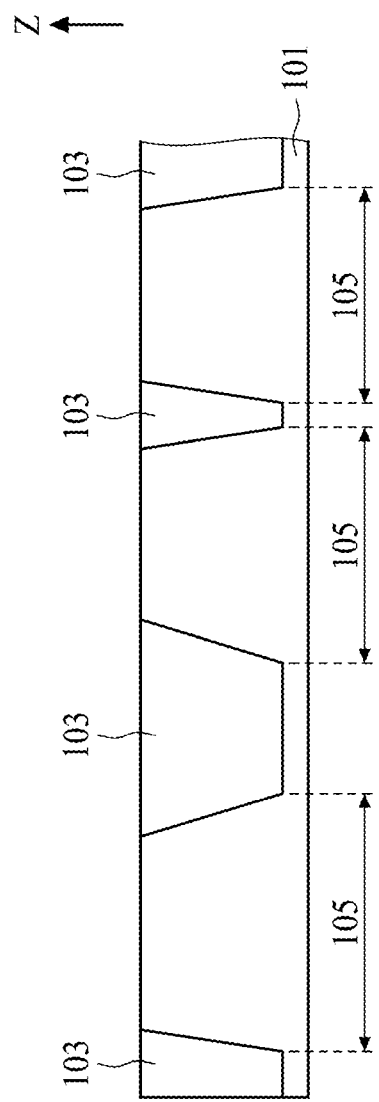

FIG. 3 illustrates, in a schematic top-view diagram, part of the flow of fabricating the semiconductor device in accordance with one embodiment of the present disclosure. FIGS. 4 to 6 illustrate, in schematic cross-sectional diagrams, part of the flow of fabricating the semiconductor device in accordance with FIG. 3.

With reference to FIG. 1 and FIGS. 3 to 6, at step S13, an isolation layer 103 may be formed in the substrate 101 and a plurality of active regions 105 of the substrate 101 may be defined by the isolation layer 103. A photolithography process may be performed to pattern the substrate 101 to define positions of the plurality of active regions 105. An etch process may be performed after the photolithography process to form a plurality of trenches in the substrate 101. After the etch process, an insulating material such as silicon oxide, silicon nitride, silicon oxynitride, silicon nitride oxide, or fluoride-doped silicate, may be used to fill the plurality of trenches by a deposition process. A planarization process, such as chemical mechanical polishing, may be performed after the deposition process to remove excess material and provide a substantially flat surface for subsequent processing steps and conformally form the isolation layer 103 and the plurality of active regions 105. For simplicity, the isolation layer 103 is not shown in FIG. 3. The plurality of active regions 105 may have bar shapes, which extend in a direction W as viewed from above. The plurality of active regions 105 may be parallel to each other.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

Figure 7:
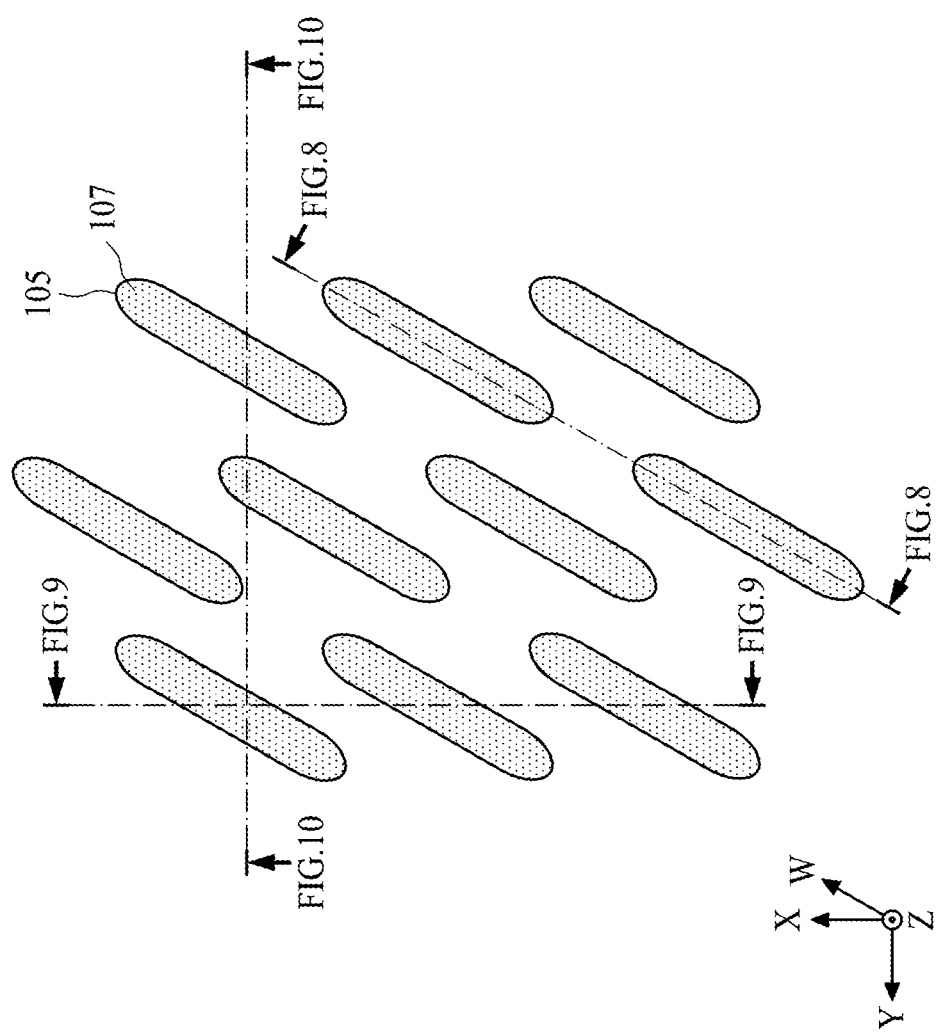
FIG. 7 illustrates, in a schematic top-view diagram, part of the flow of fabricating the semiconductor device in accordance with one embodiment of the present disclosure.
Figure 8:
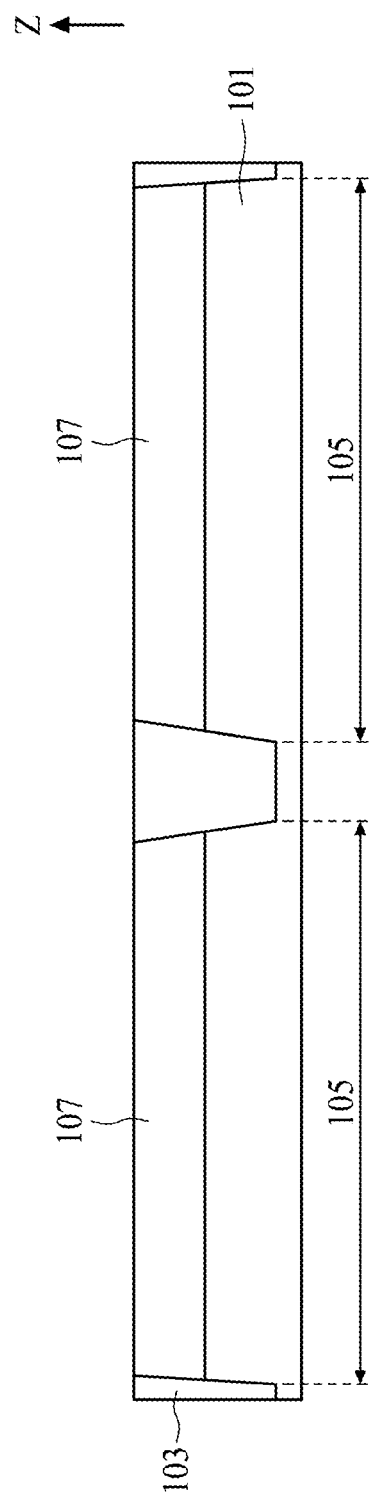
FIGS. 8 to 10 illustrate, in schematic cross-sectional diagrams, part of the flow of fabricating the semiconductor device in accordance with FIG. 7.
Figure 9:
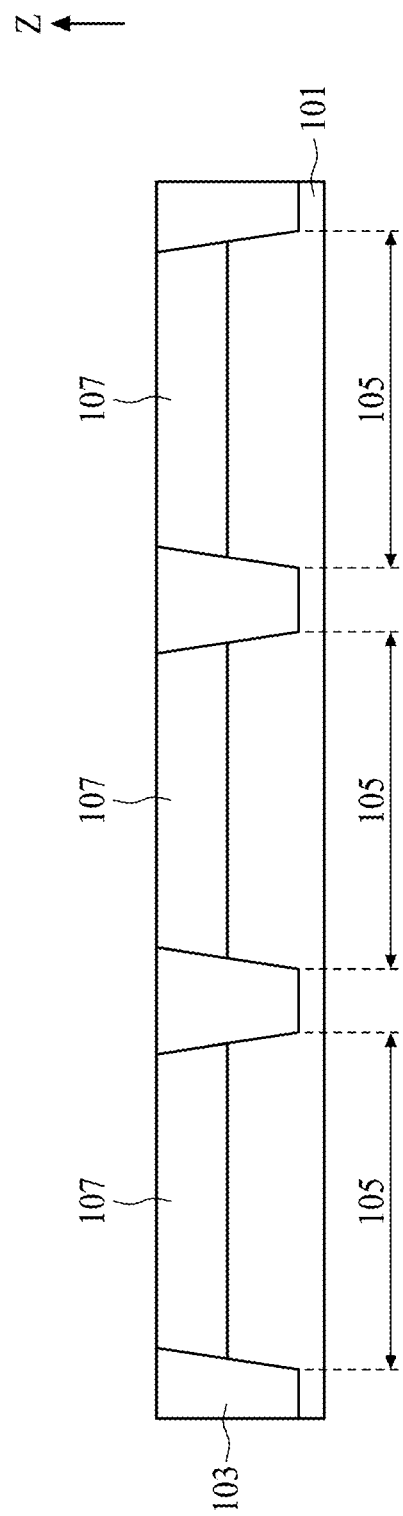
Figure 10:
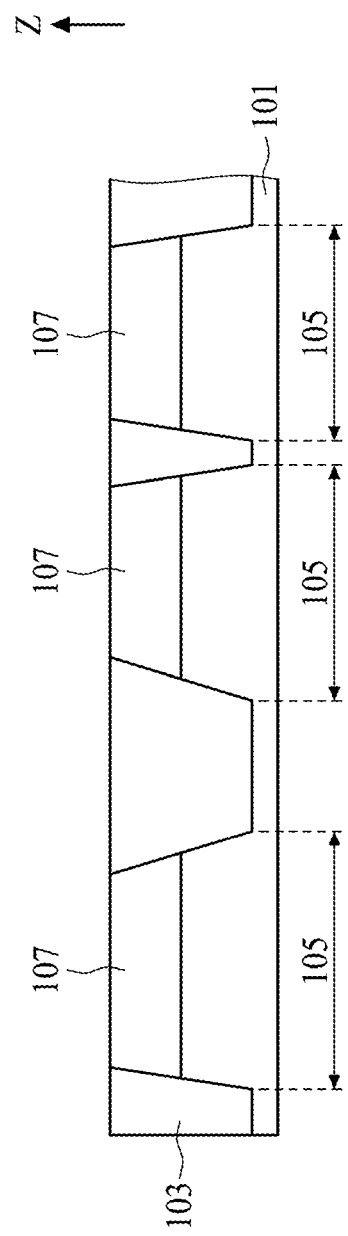

FIG. 7 illustrates, in a schematic top-view diagram, part of the flow of fabricating the semiconductor device in accordance with one embodiment of the present disclosure. FIGS. 8 to 10 illustrate, in schematic cross-sectional diagrams, part of the flow of fabricating the semiconductor device in accordance with FIG. 7. For simplicity, the isolation layer 103 is not shown in FIG. 7.

With reference to FIG. 1 and FIGS. 7 to 10, at step S15, a plurality of source/drain regions 107 may be formed in the plurality of active regions 105. The plurality of source/drain regions 107 may be formed by an implantation process using dopant such as phosphorus, arsenic, or antimony. The plurality of source/drain regions 107 may respectively have a dopant concentration ranging from about 1E17 atoms/cm$^3$ to about 1E19 atoms/cm$^3$.

Figure 11:
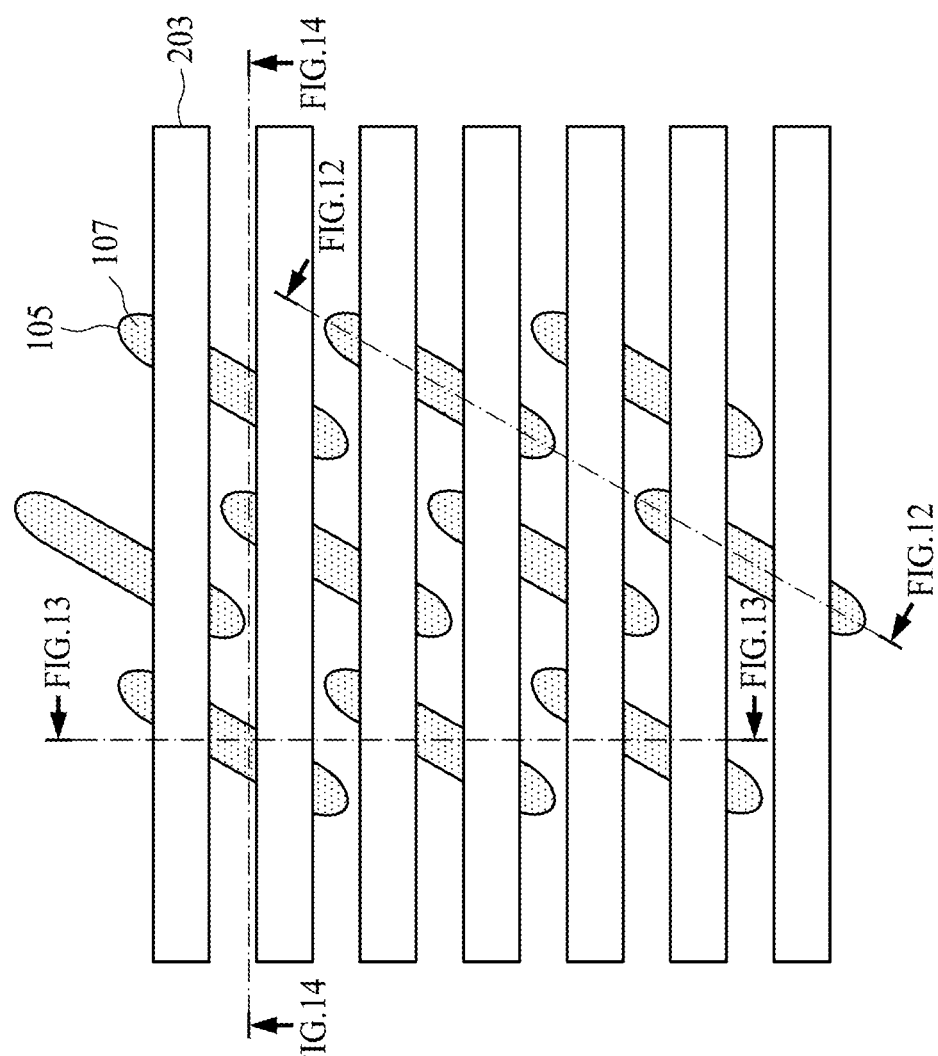
FIG. 11 illustrates, in a schematic top-view diagram, part of the flow of fabricating the semiconductor device in accordance with one embodiment of the present disclosure.
Figure 12:
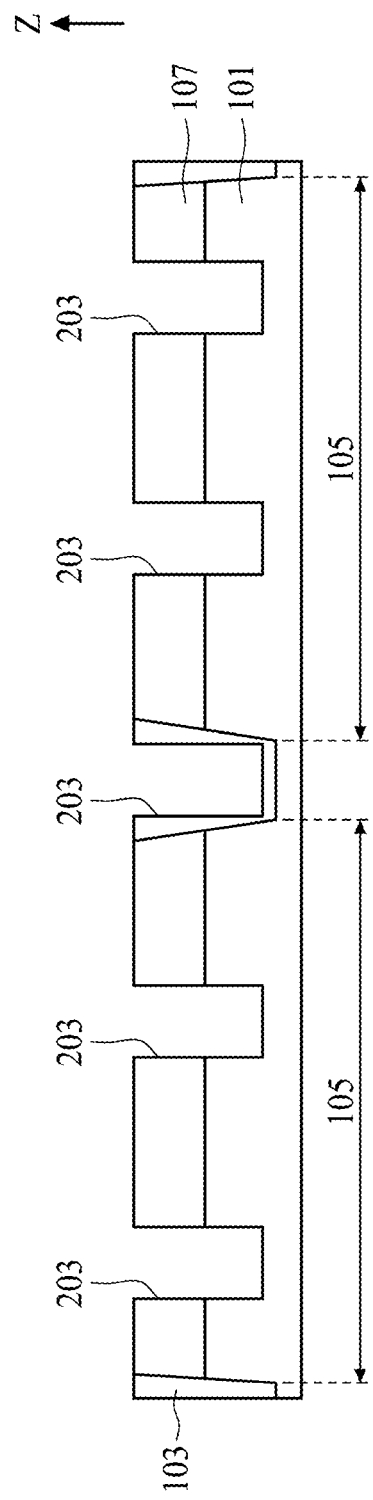
FIGS. 12 to 14 illustrate, in schematic cross-sectional diagrams, part of the flow of fabricating the semiconductor device in accordance with FIG. 11.
Figure 13:
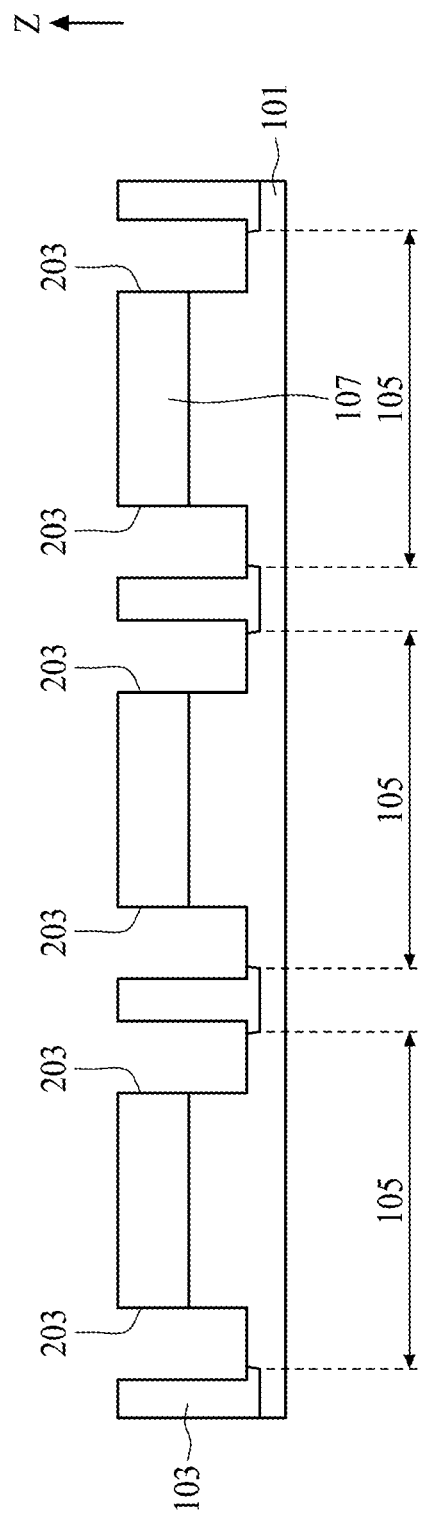
Figure 14:
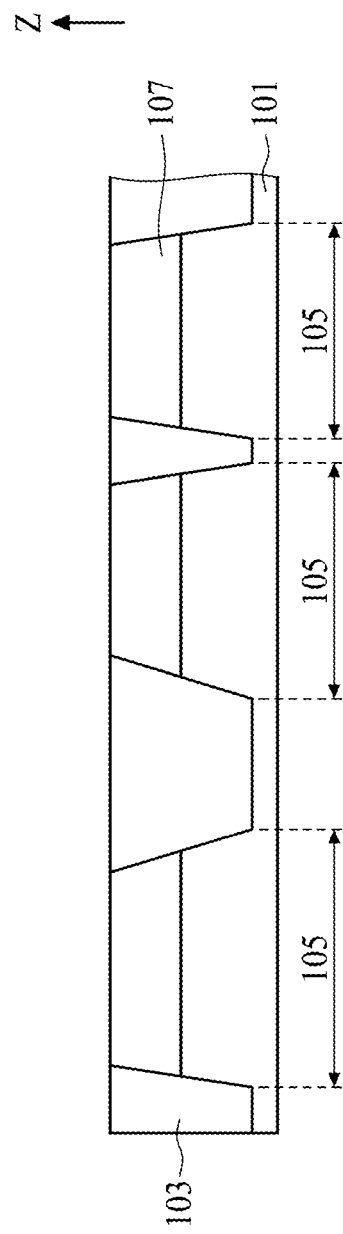

FIG. 11 illustrates, in a schematic top-view diagram, part of the flow of fabricating the semiconductor device in accordance with one embodiment of the present disclosure. FIGS. 12 to 14 illustrate, in schematic cross-sectional diagrams, part of the flow of fabricating the semiconductor device in accordance with FIG. 11. For simplicity, the isolation layer 103 is not shown in FIG. 11.

Figure 15:
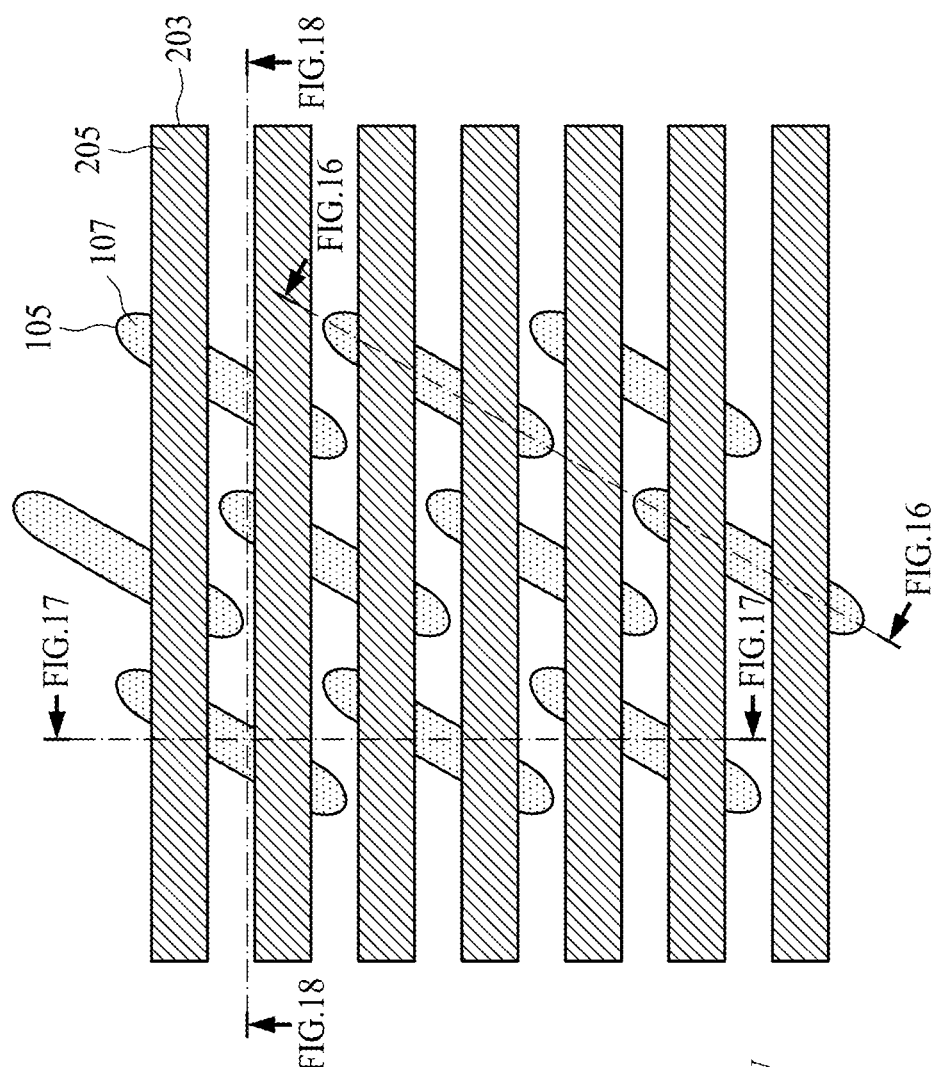
FIG. 15 illustrates, in a schematic top-view diagram, part of the flow of fabricating the semiconductor device in accordance with one embodiment of the present disclosure.
Figure 16:
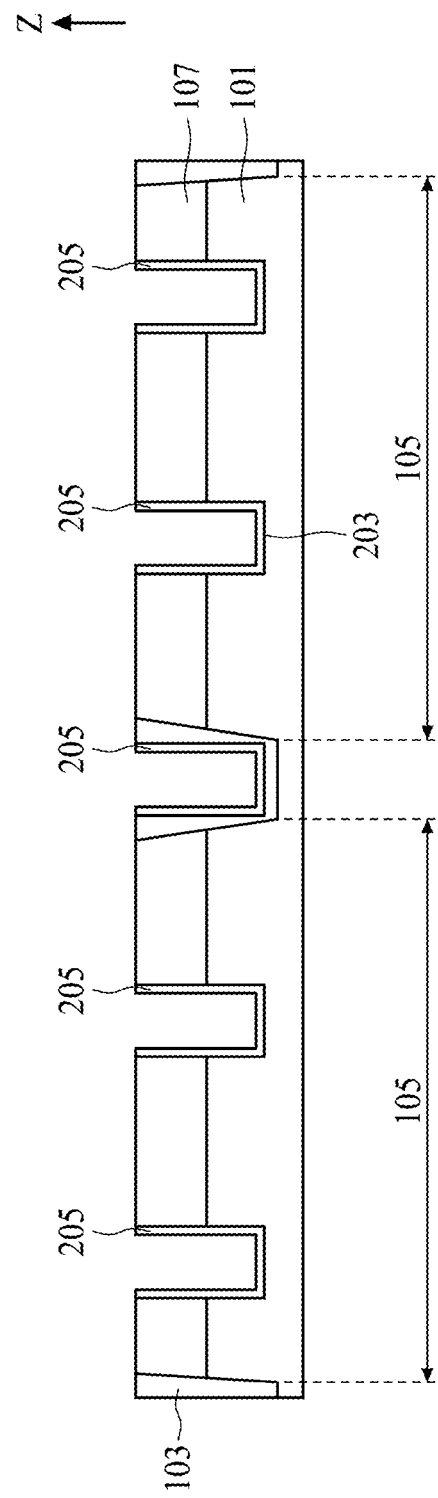
FIGS. 16 to 18 illustrate, in schematic cross-sectional diagrams, part of the flow of fabricating the semiconductor device in accordance with FIG. 15.
Figure 17:
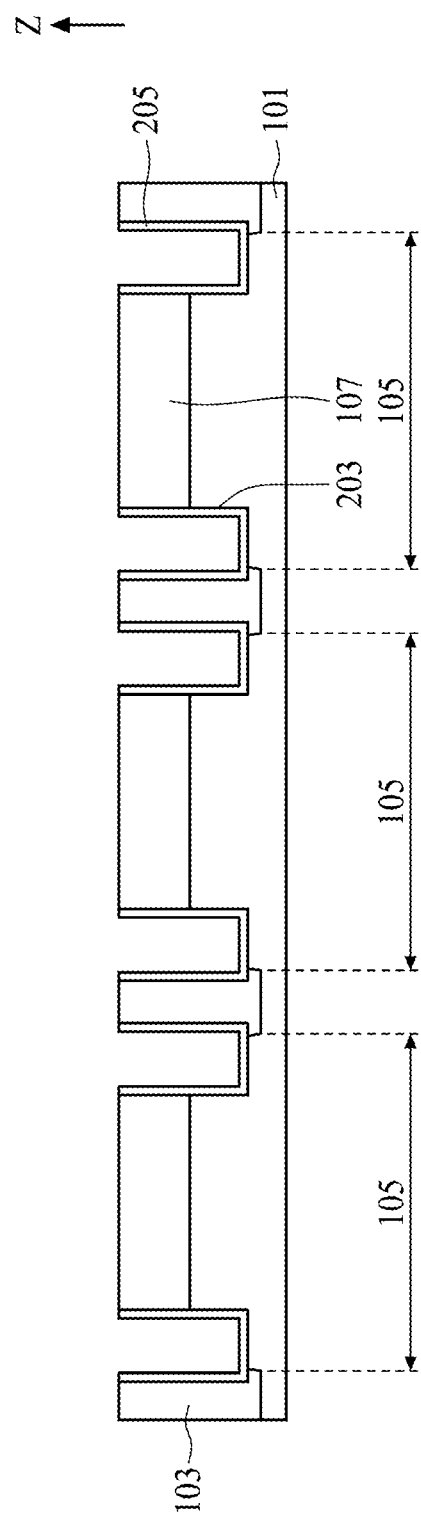
Figure 18:
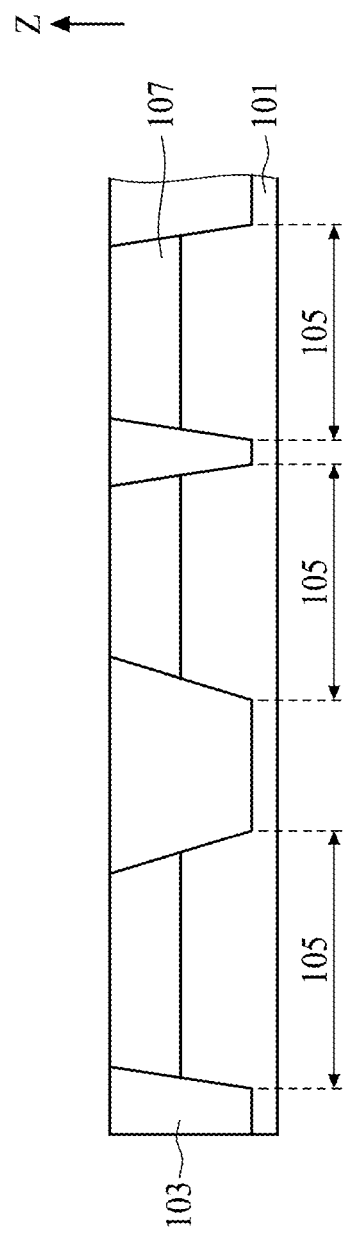

FIG. 15 illustrates, in a schematic top-view diagram, part of the flow of fabricating the semiconductor device in accordance with one embodiment of the present disclosure. FIGS. 16 to 18 illustrate, in schematic cross-sectional diagrams, part of the flow of fabricating the semiconductor device in accordance with FIG. 15. For simplicity, the isolation layer 103 is not shown in FIG. 15.

Figure 19:
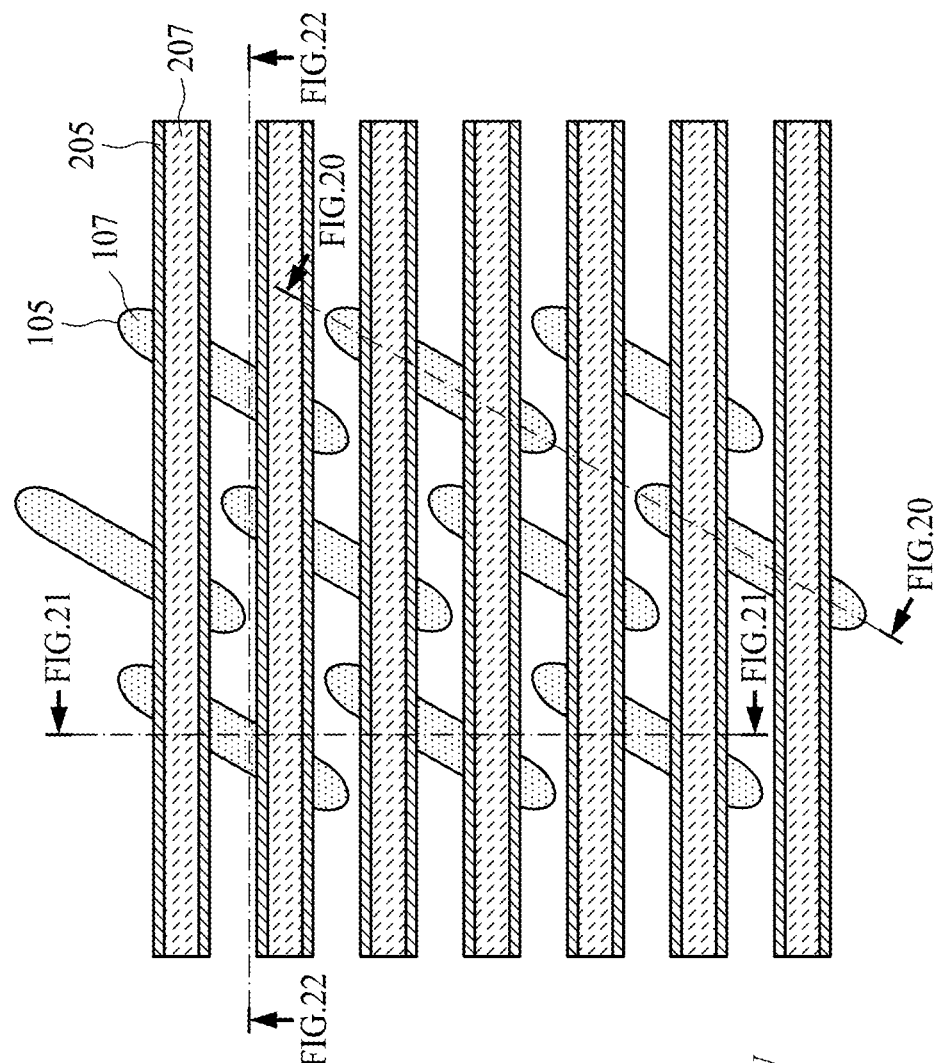
FIG. 19 illustrates, in a schematic top-view diagram, part of the flow of fabricating the semiconductor device in accordance with one embodiment of the present disclosure.
Figure 20:
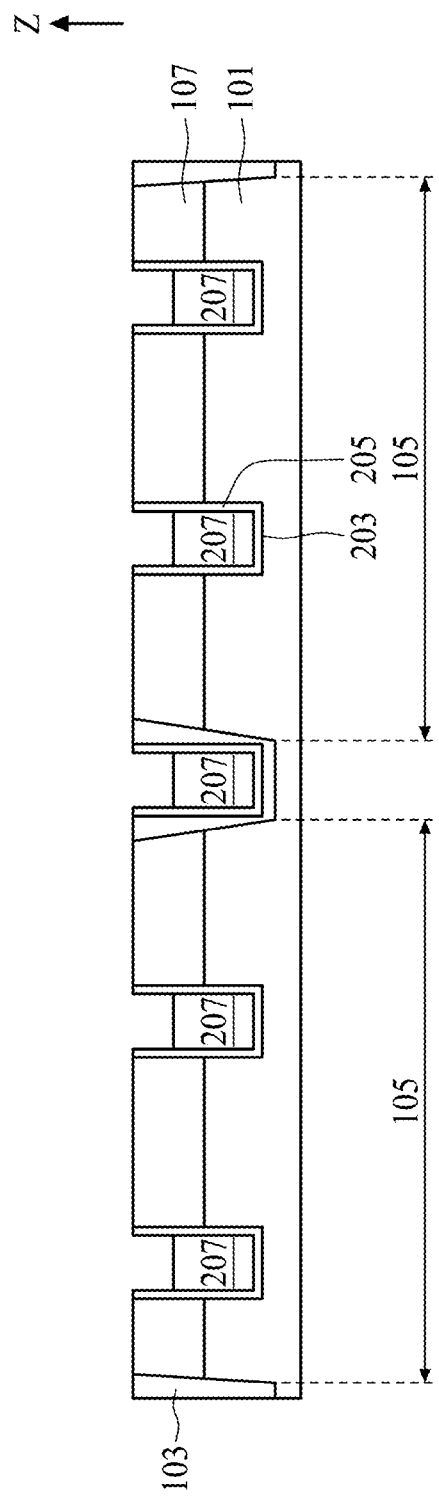
FIGS. 20 to 22 illustrate, in schematic cross-sectional diagrams, part of the flow of fabricating the semiconductor device in accordance with FIG. 19.
Figure 21:
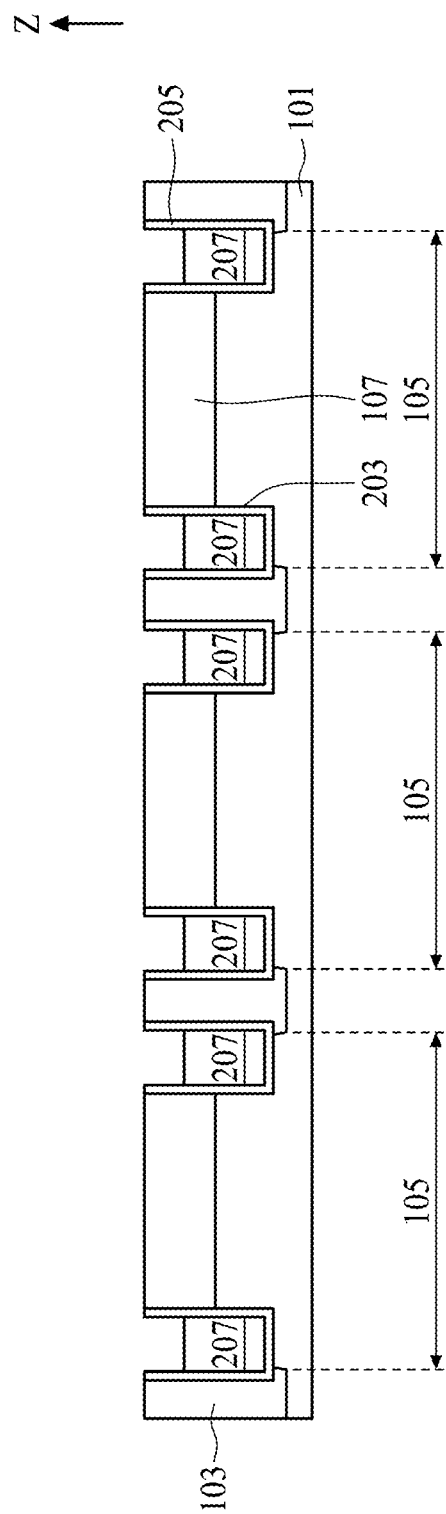
Figure 22:
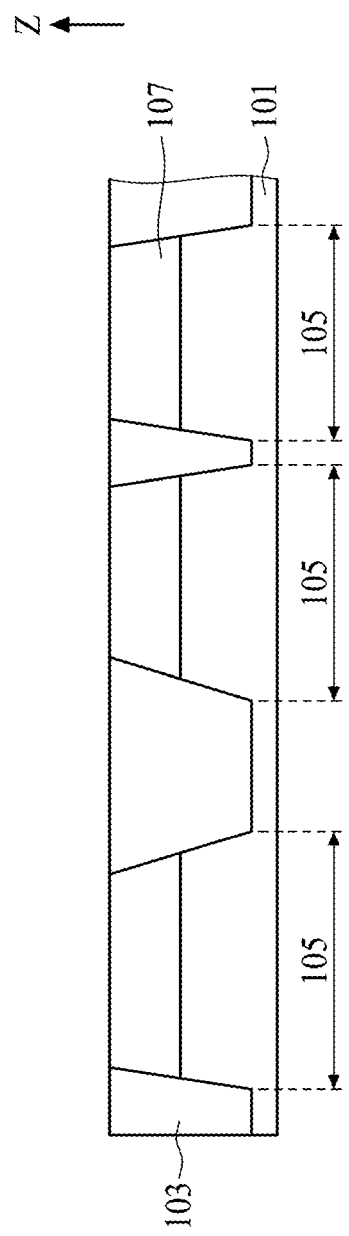

FIG. 19 illustrates, in a schematic top-view diagram, part of the flow of fabricating the semiconductor device in accordance with one embodiment of the present disclosure. FIGS. 20 to 22 illustrate, in schematic cross-sectional diagrams, part of the flow of fabricating the semiconductor device in accordance with FIG. 19. For simplicity, the isolation layer 103 is not shown in FIG. 19.

Figure 23:
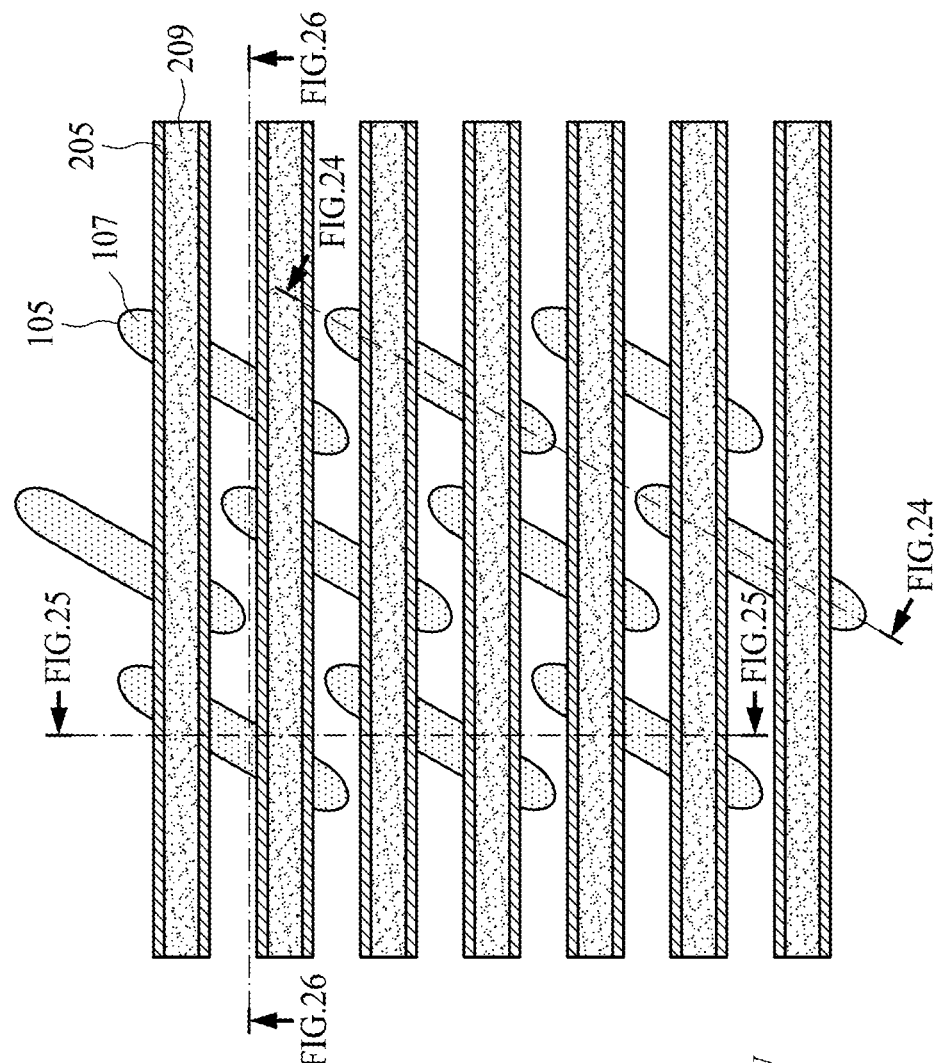
FIG. 23 illustrates, in a schematic top-view diagram, part of the flow of fabricating the semiconductor device in accordance with one embodiment of the present disclosure.
Figure 24:
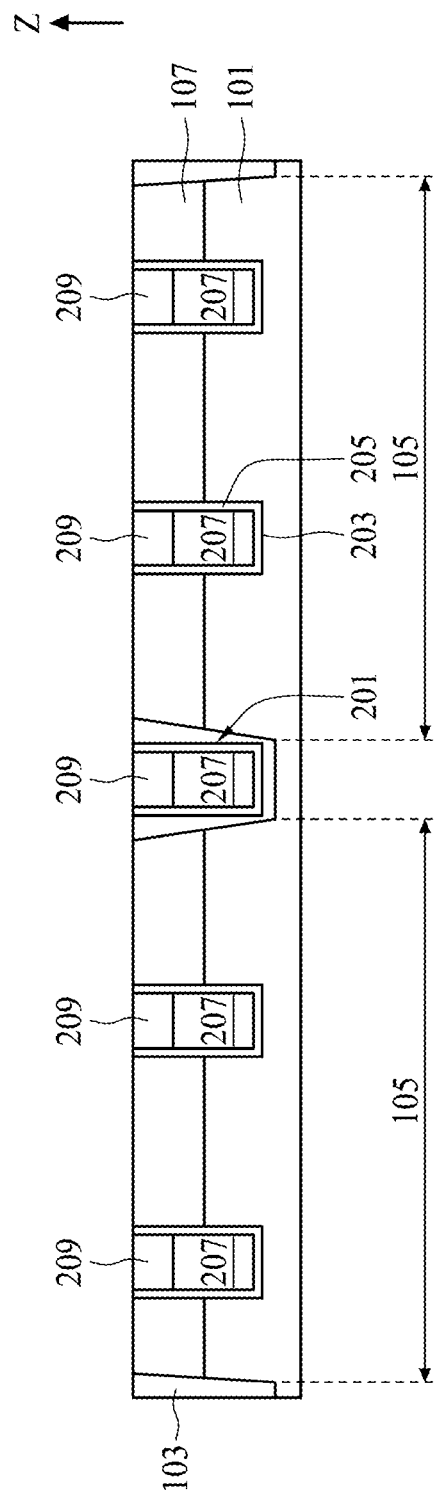
FIGS. 24 to 26 illustrate, in schematic cross-sectional diagrams, part of the flow of fabricating the semiconductor device in accordance with FIG. 23.
Figure 25:
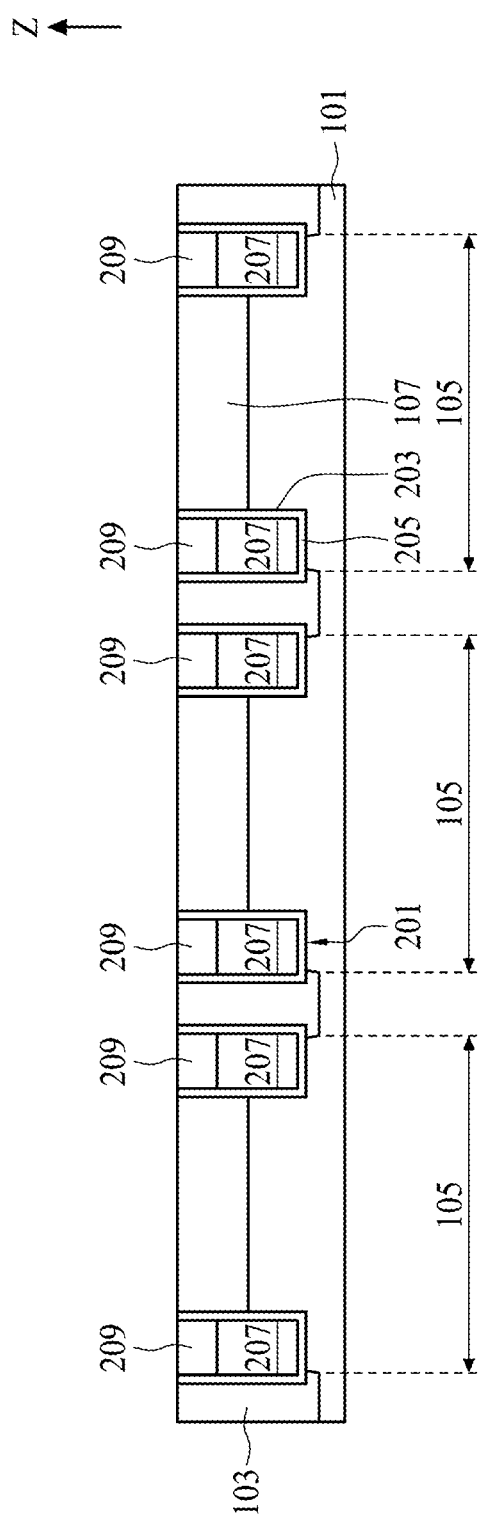
Figure 26:
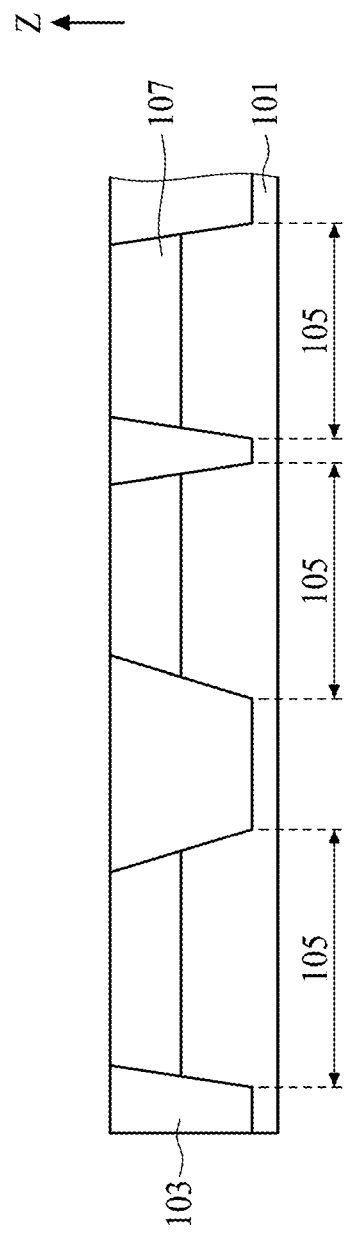

FIG. 23 illustrates, in a schematic top-view diagram, part of the flow of fabricating the semiconductor device in accordance with one embodiment of the present disclosure. FIGS. 24 to 26 illustrate, in schematic cross-sectional diagrams, part of the flow of fabricating the semiconductor device in accordance with FIG. 23. For simplicity, the isolation layer 103 is not shown in FIG. 23.

With reference to FIG. 1 and FIGS. 11 to 26, at step S17, a plurality of word lines 201 may be formed in the substrate 101. With reference to FIGS. 11 to 14, a plurality of word line trenches 203 may be formed in the substrate 101. A photolithography process may be performed to pattern the substrate 101 to define positions of the plurality of word line trenches 203. An etch process may be performed after the photolithography process to form the plurality of word line trenches 203 in the substrate 101. The plurality of word line trenches 203 may extend in a direction Y diagonally intersecting the direction W to intersect the plurality of active regions 105. In the embodiment depicted, each of the plurality of active regions 105 may intersect two of the plurality of word line trenches 203.

With reference to FIGS. 15 to 18, a plurality of word line insulating layers 205 may be respectively correspondingly formed to conformally cover inner surfaces of the plurality of word line trenches 203. In the embodiment depicted, the plurality of word line insulating layers 205 may be formed of, for example, silicon oxide, silicon nitride, silicon oxynitride, silicon nitride oxide, fluoride-doped silicate, or the like. Alternatively, in another embodiment depicted, the plurality of word line insulating layers 205 may be formed of, for example, barium strontium titanate, lead zirconium titanate, titanium oxide, aluminum oxide, hafnium oxide, yttrium oxide, zirconium oxide, or the like.

With reference to FIGS. 19 to 22, a plurality of word line electrodes 207 may be respectively correspondingly formed on the plurality of word line insulating layers 205 in the plurality of word line trenches 203. In the embodiment depicted, a metal layer formed of a conductive material, for example, doped polysilicon, a metal, or a metal silicide, may be disposed into the plurality of word line trenches 203 by a metallization process. After the metallization process, an etch process may be performed on the metal layer to leave a lower portion of the metal layer in the plurality of word line trenches 203; therefore, the plurality of word line electrodes 207 may be respectively correspondingly formed on the plurality of word line insulating layers 205 in the plurality of word line trenches 203. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

With reference to FIGS. 23 to 26, a plurality of word line capping structures 209 may be respectively correspondingly formed on the plurality of word line electrodes 207 in the plurality of word line trenches 203. The plurality of word line capping structures 209 may respectively correspondingly fill the plurality of word line trenches 203. Top surfaces of the capping structures 209 may be at the same vertical level as a vertical level of a top surface of the substrate 101. Each of the plurality of word line capping structures 209 may be formed as a stacked layer or a single layer. For example, in the embodiment depicted, the plurality of word line capping structures 209 may be formed of single layers including barium strontium titanate, lead zirconium titanate, titanium oxide, aluminum oxide, hafnium oxide, yttrium oxide, zirconium oxide, or the like. Alternatively, in another embodiment depicted, the plurality of word line capping structures 209 may be formed of stacked layers. Each stacked layer may include a bottom layer and a top layer. The bottom layers may be respectively correspondingly disposed on the plurality of word line electrodes 207. The top layers may be disposed on the bottom layer and top surfaces of the top layers may be at the same vertical as the vertical level of the top surface of the substrate 101. The bottom layers may be formed of, for example, a high dielectric-constant material such as barium strontium titanate, lead zirconium titanate, titanium oxide, aluminum oxide, hafnium oxide, yttrium oxide, zirconium oxide, or the like. The top layers may be formed of, for example, a low dielectric-constant material such as silicon oxide, silicon nitride, silicon oxynitride, silicon nitride oxide, fluoride-doped silicate, or the like. The top layers formed of the low dielectric-constant material may reduce an electric field at the top surface of the substrate 101; therefore, leakage current may be reduced. The plurality of word line trenches 203, the plurality of word line insulating layers 205, the plurality of word line electrodes 207, and the plurality of word line capping structures 209 together form the plurality of word lines 201.

Figure 27:
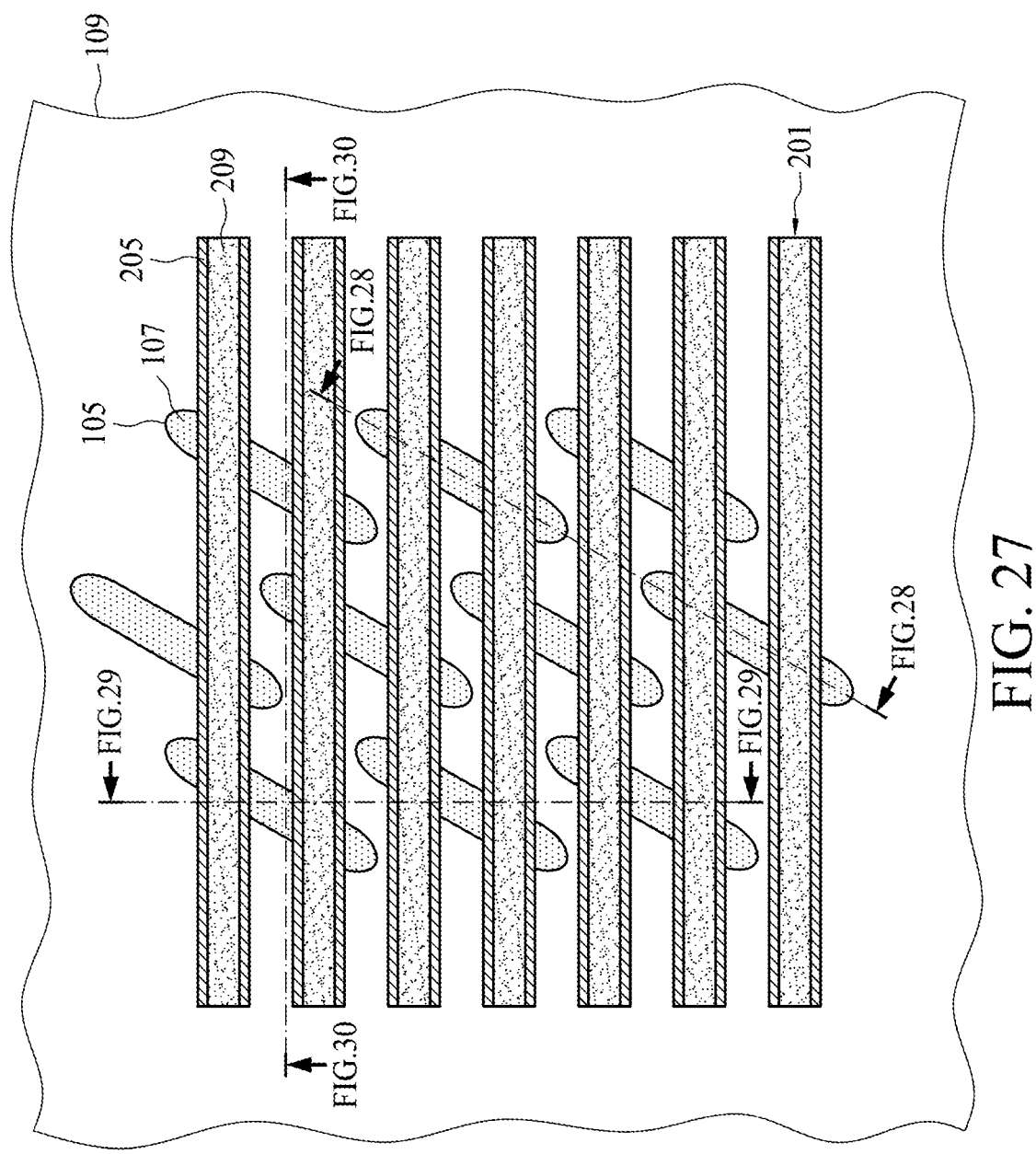
FIG. 27 illustrates, in a schematic top-view diagram, part of the flow of fabricating the semiconductor device in accordance with one embodiment of the present disclosure.
Figure 28:
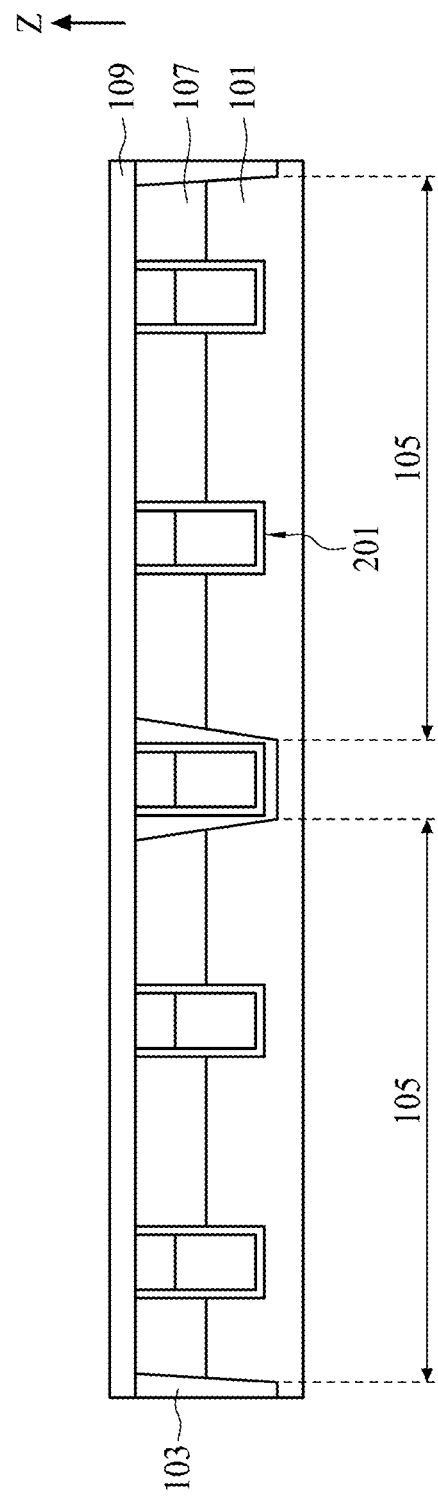
FIGS. 28 to 30 illustrate, in schematic cross-sectional diagrams, part of the flow of fabricating the semiconductor device in accordance with FIG. 27.
Figure 29:
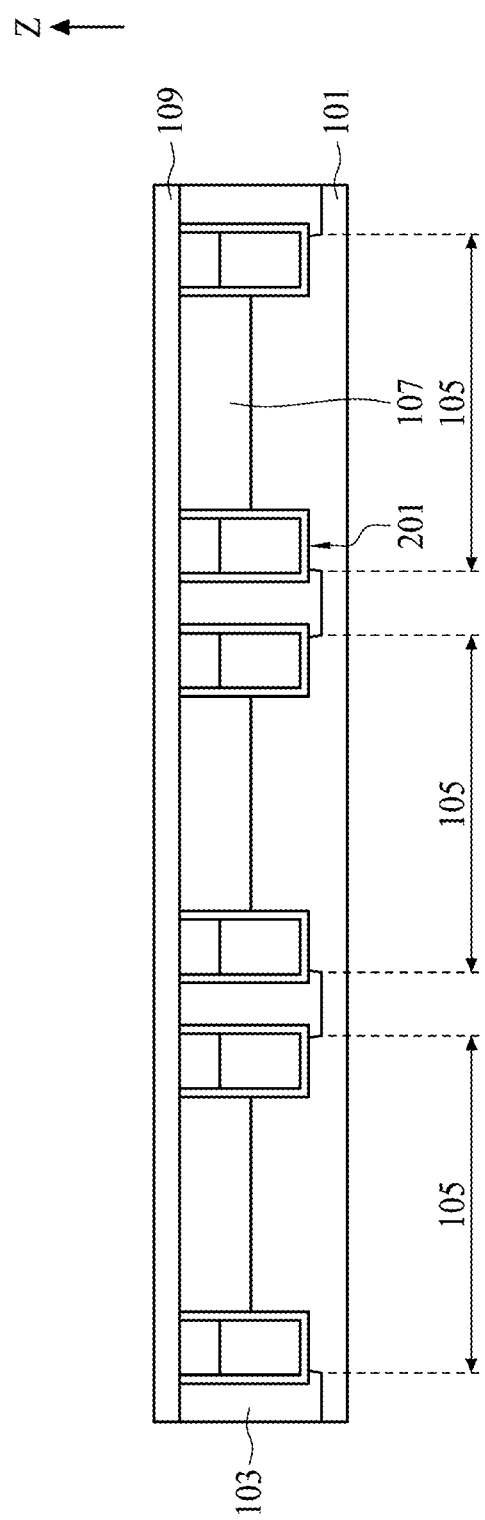
Figure 30:
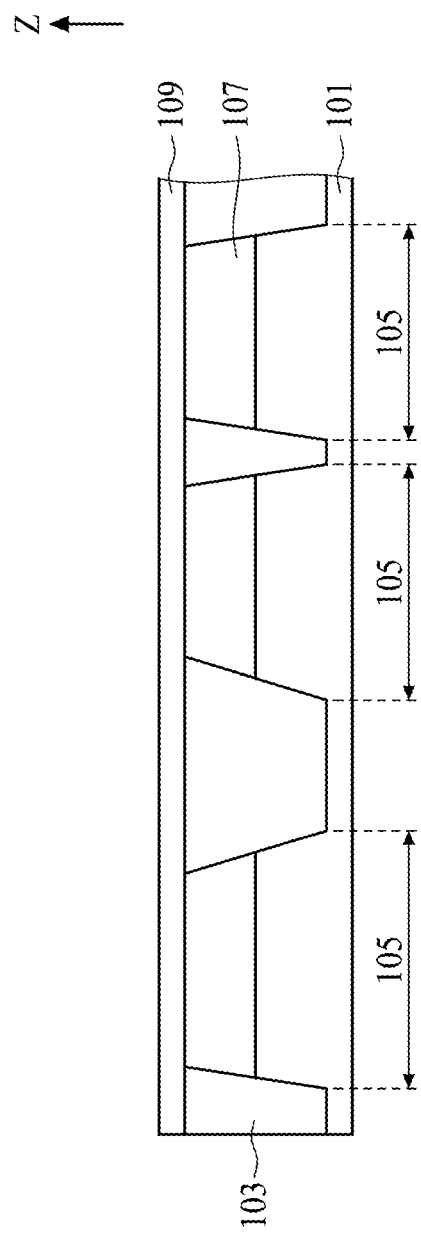

FIG. 27 illustrates, in a schematic top-view diagram, part of the flow of fabricating the semiconductor device in accordance with one embodiment of the present disclosure. FIGS. 28 to 30 illustrate, in schematic cross-sectional diagrams, part of the flow of fabricating the semiconductor device in accordance with FIG. 27.

With reference to FIG. 1 and FIGS. 27 to 30, at step S19, a buffer layer 109 may be formed on the substrate 101. The buffer layer 109 may be formed as a stacked layer or a single layer including silicon oxide, silicon nitride, silicon oxynitride, silicon nitride oxide, fluoride-doped silicate, or the like. For simplicity, the isolation layer 103 is not shown in FIG. 27.

Figure 31:
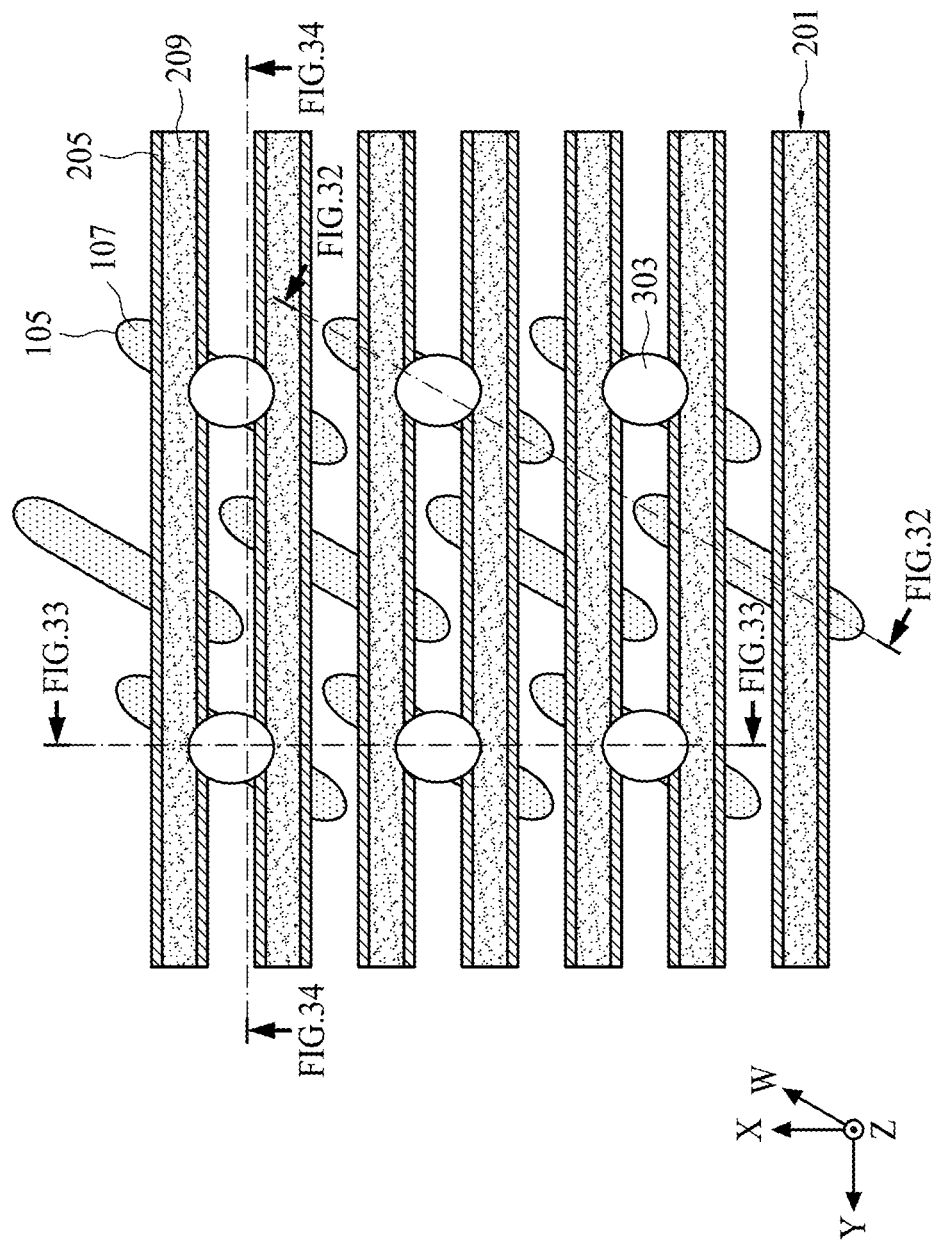
FIG. 31 illustrates, in a schematic top-view diagram, part of the flow of fabricating the semiconductor device in accordance with one embodiment of the present disclosure.
Figure 32:
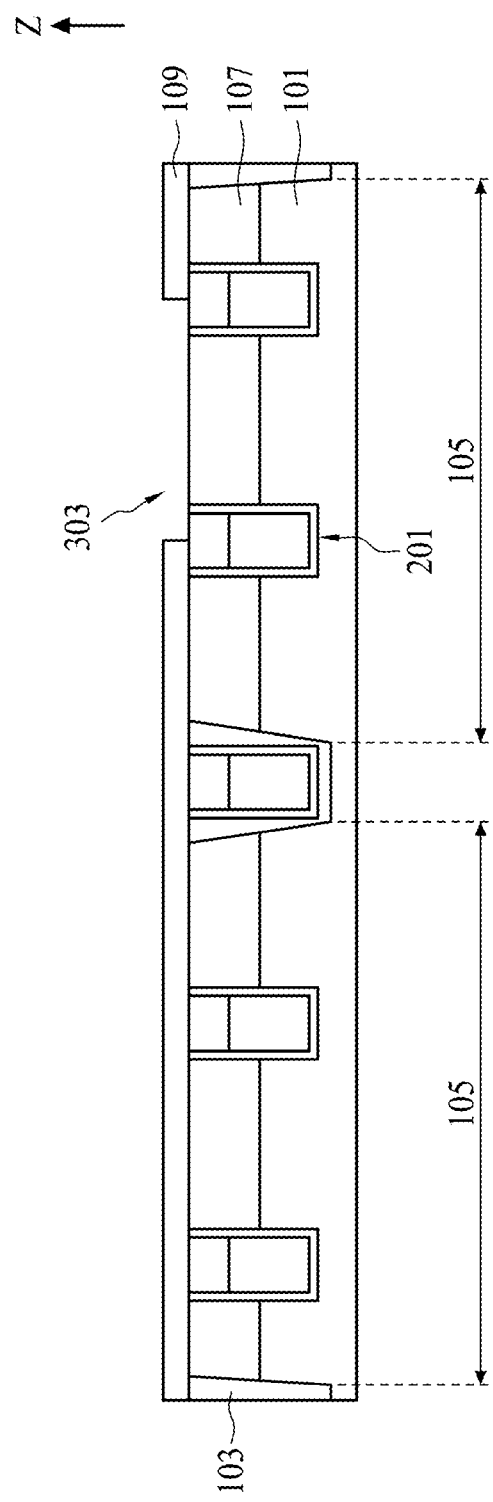
FIGS. 32 to 34 illustrate, in schematic cross-sectional diagrams, part of the flow of fabricating the semiconductor device in accordance with FIG. 31.
Figure 33:
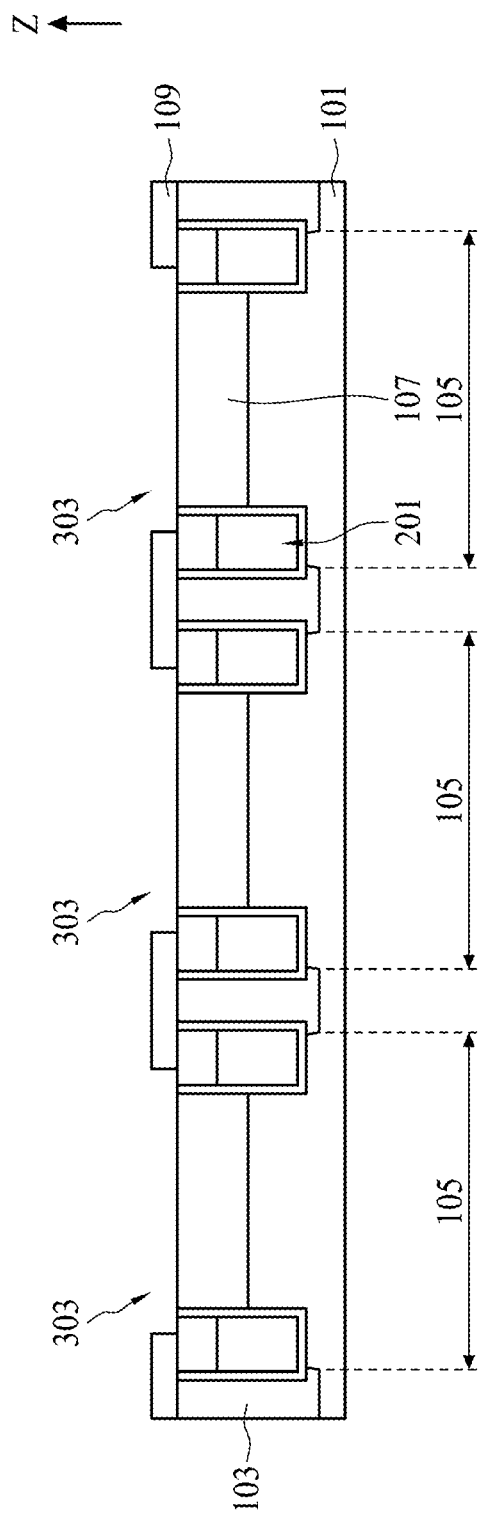
Figure 34:
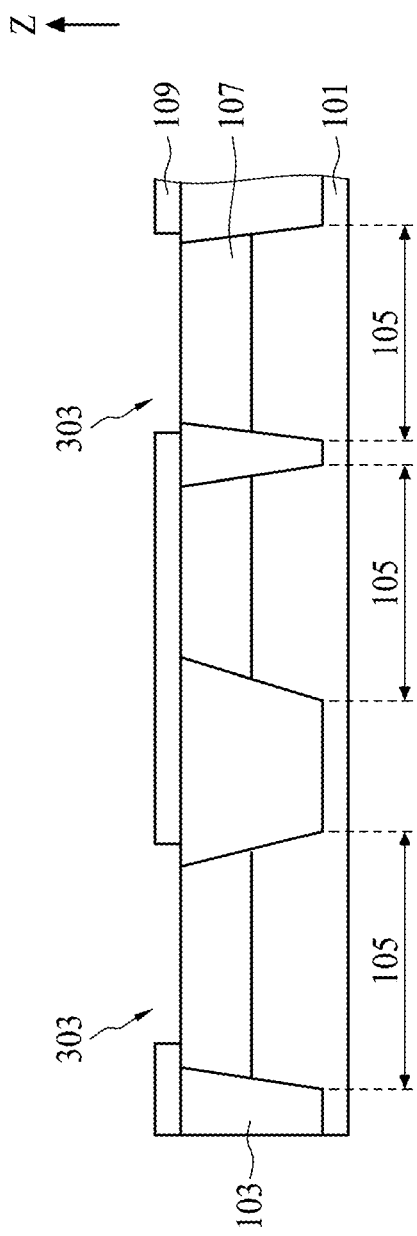

FIG. 31 illustrates, in a schematic top-view diagram, part of the flow of fabricating the semiconductor device in accordance with one embodiment of the present disclosure. FIGS. 32 to 34 illustrate, in schematic cross-sectional diagrams, part of the flow of fabricating the semiconductor device in accordance with FIG. 31. For simplicity, the isolation layer 103 and the buffer layer 109 are not shown in FIG. 31.

Figure 35:
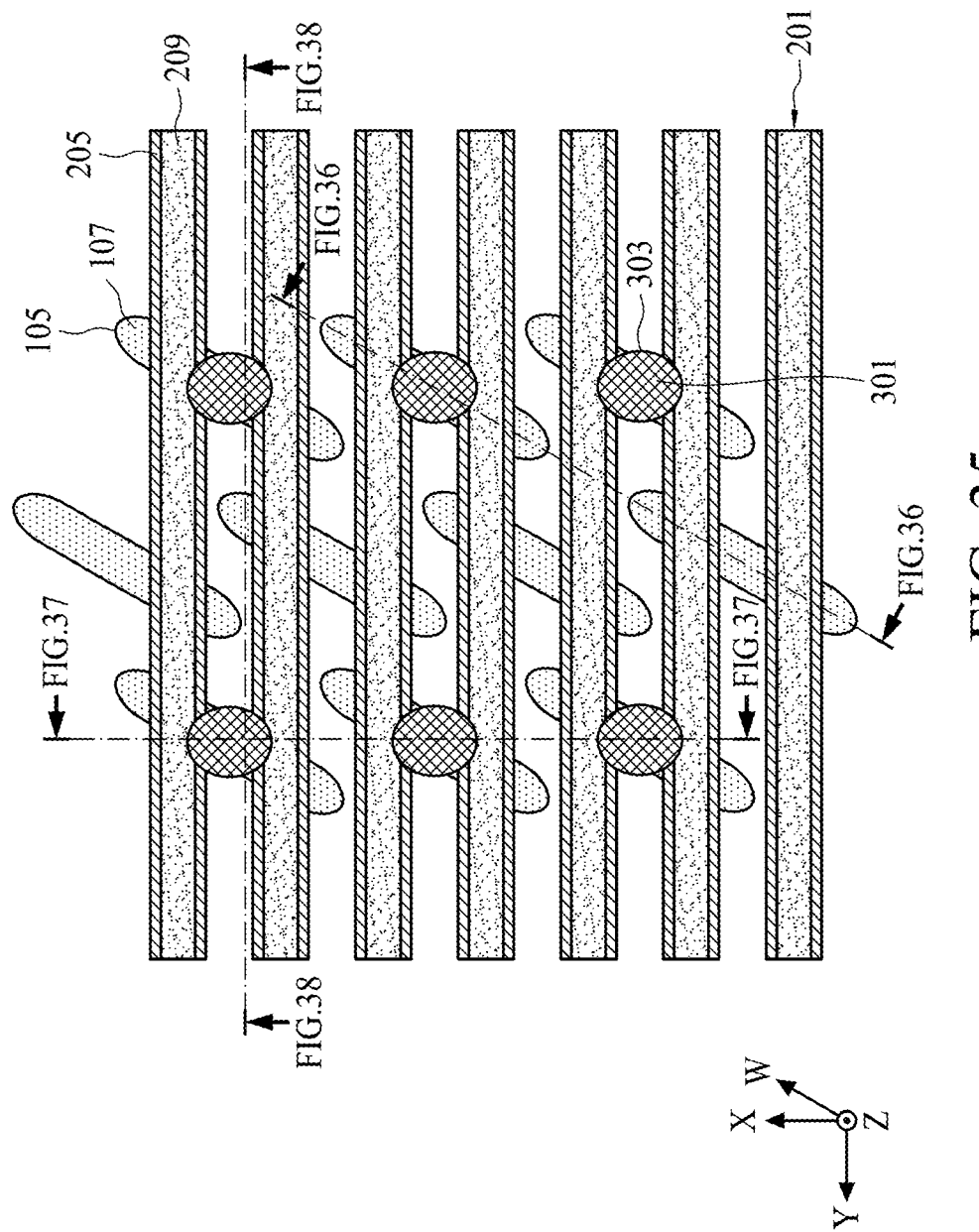
FIG. 35 illustrates, in a schematic top-view diagram, part of the flow of fabricating the semiconductor device in accordance with one embodiment of the present disclosure.
Figure 36:
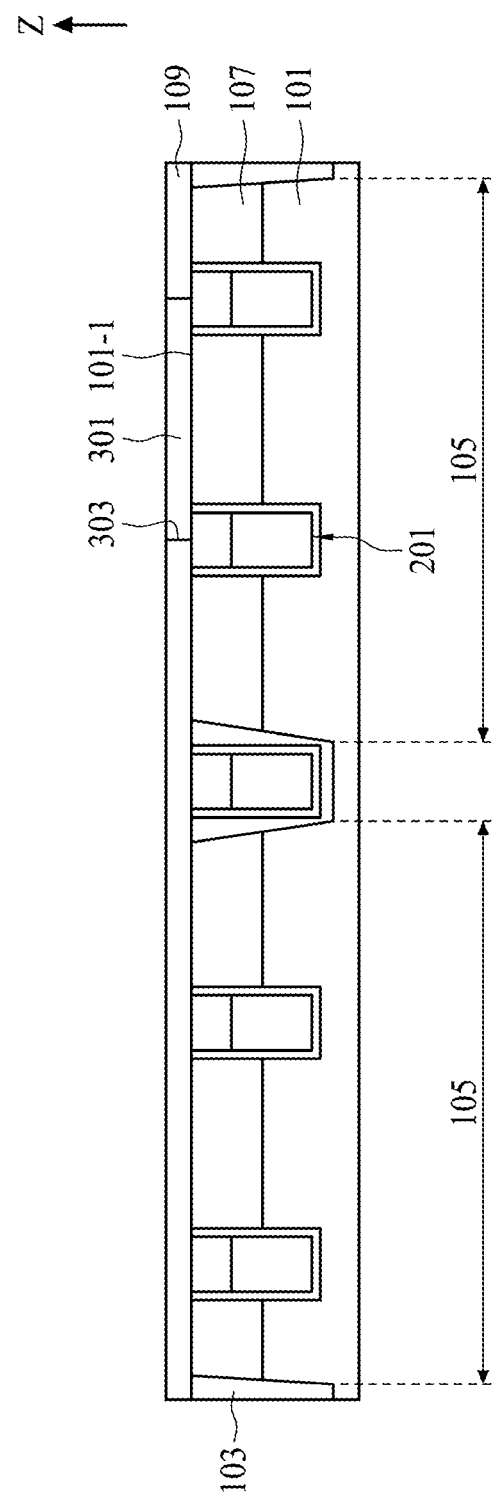
FIGS. 36 to 38 illustrate, in schematic cross-sectional diagrams, part of the flow of fabricating the semiconductor device in accordance with FIG. 35.
Figure 37:
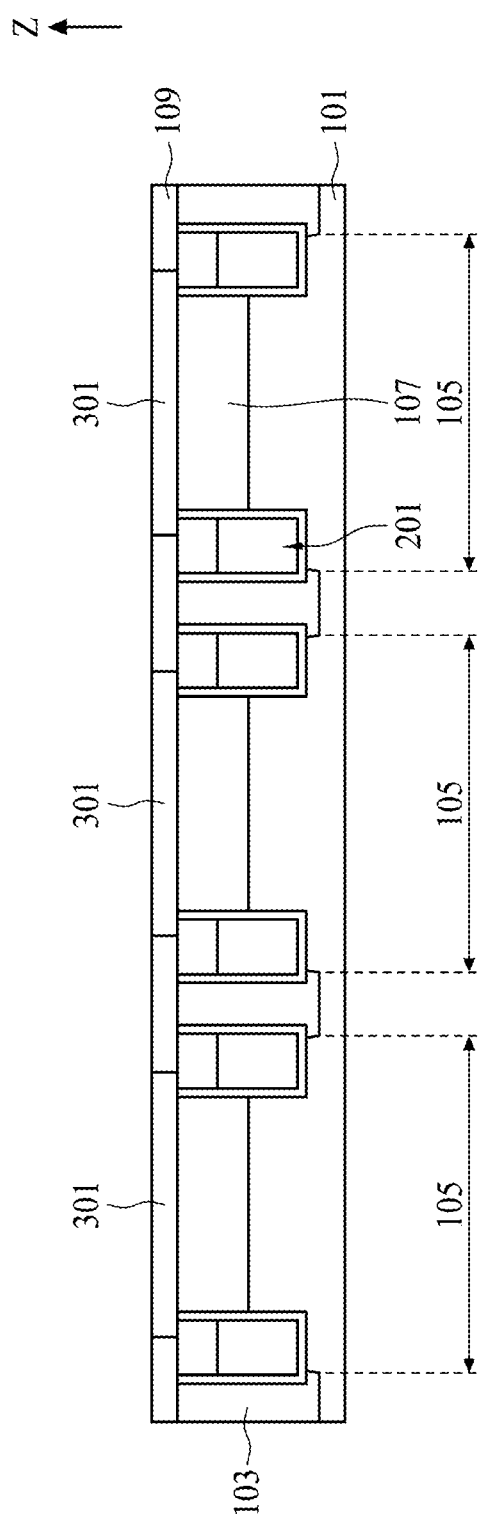
Figure 38:
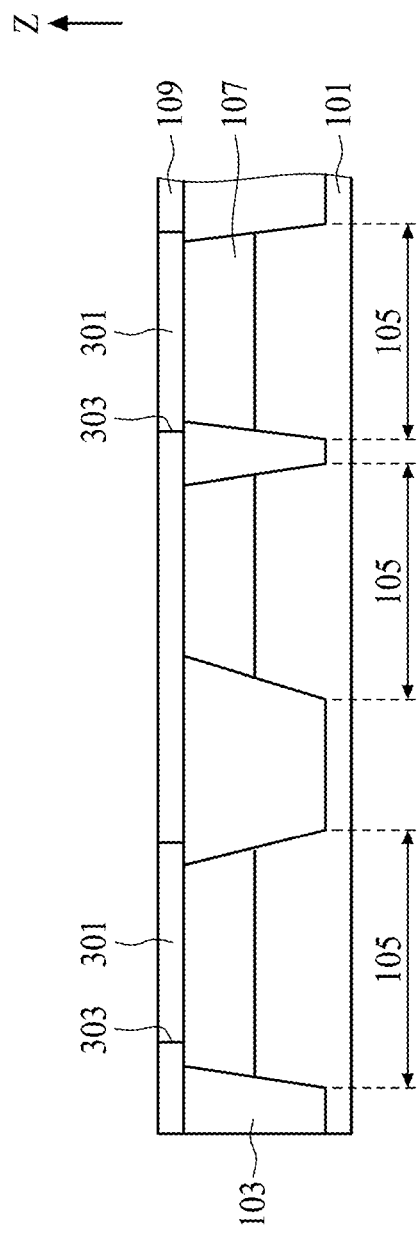

FIG. 35 illustrates, in a schematic top-view diagram, part of the flow of fabricating the semiconductor device in accordance with one embodiment of the present disclosure. FIGS. 36 to 38 illustrate, in schematic cross-sectional diagrams, part of the flow of fabricating the semiconductor device in accordance with FIG. 35. For simplicity, the isolation layer 103 and the buffer layer 109 are not shown in FIG. 35.

With reference to FIG. 1 and FIGS. 31 to 38, at step S21, a plurality of first bit line contacts 301 may be formed in the buffer layer 109 and contacting the upper surface 101-1 of the substrate 101. With reference to FIG. 31 to 34, a plurality of first bit line contact openings 303 may be formed in the buffer layer 109 and expose the upper surface of the substrate 101. The plurality of first bit line contact openings 303 may be disposed in center portions of some of the plurality of active regions 105 and between adjacent pairs of the plurality of word lines 201 as viewed from above. The plurality of first bit line contact openings 303 may expose some of the plurality of source/drain regions 107 disposed between the adjacent pairs of the plurality of word lines 201. A photolithography process may be performed to pattern the buffer layer 109 to define the positions of the plurality of first bit line contact openings 303. An etch process may be performed after the photolithography process to form the plurality of first bit line contact openings 303 in the buffer layer 109 and in an upper portion of the substrate 101.

With reference to FIGS. 35 to 38, the plurality of first bit line contacts 301 may be respectively correspondingly formed in the plurality of first bit line contact openings 303. In the embodiment depicted, a conductive material, for example, doped polysilicon, a metal, or a metal silicide may be deposited into the plurality of first bit line contact openings 303 by a metallization process. After the metallization process, a planarization process, such as chemical mechanical polishing, may be performed to remove excess material, provide a substantially flat surface for subsequent processing steps, and conformally form the plurality of first bit line contacts 301. The plurality of first bit line contacts 301 may be electrically connected to center portions of the some of the plurality of source/drain regions 107 disposed between the adjacent pairs of the plurality of word lines 201.

The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

Figure 39:
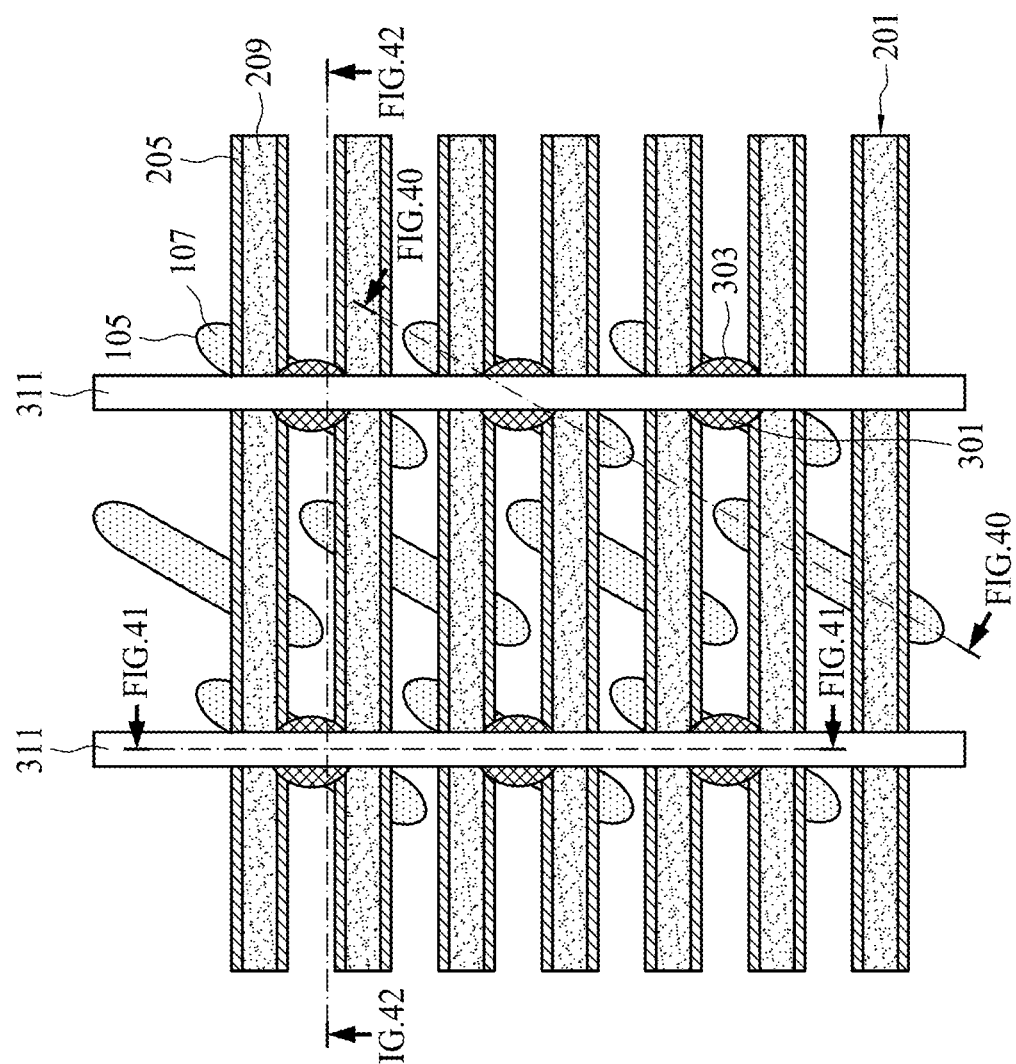
FIG. 39 illustrates, in a schematic top-view diagram, part of the flow of fabricating the semiconductor device in accordance with one embodiment of the present disclosure.
Figure 40:
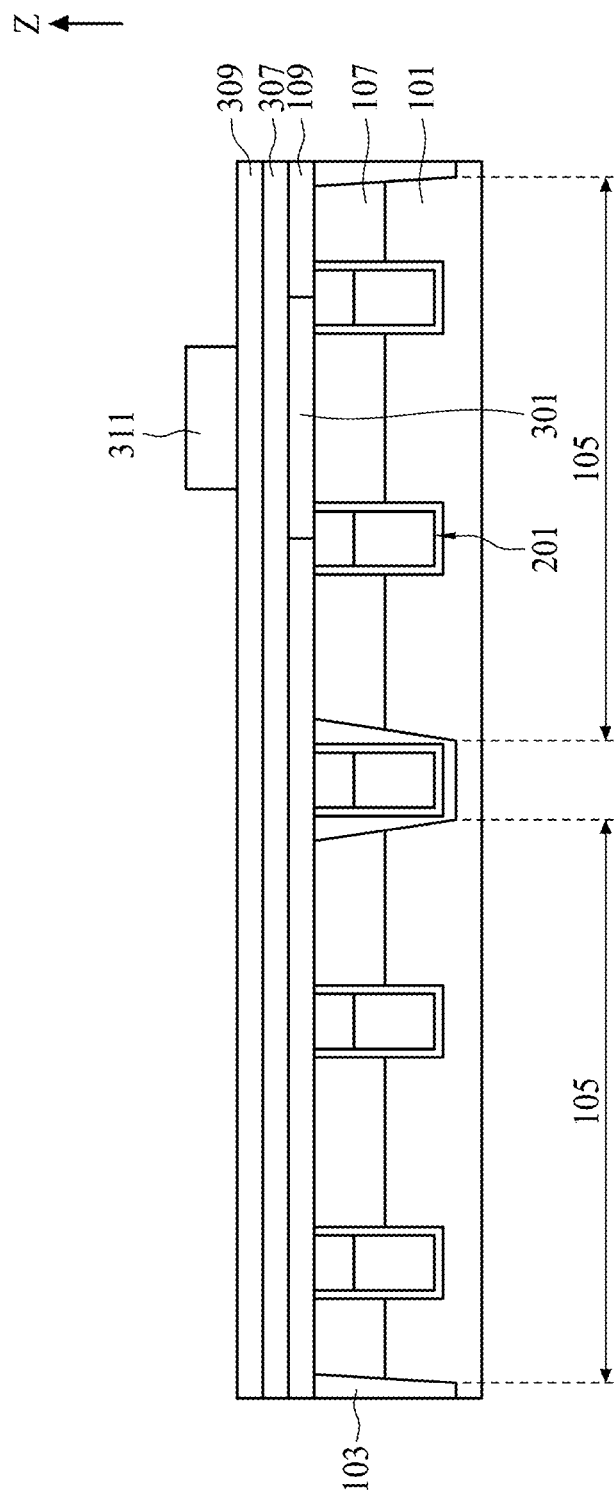
FIGS. 40 to 42 illustrate, in schematic cross-sectional diagrams, part of the flow of fabricating the semiconductor device in accordance with FIG. 39.
Figure 41:
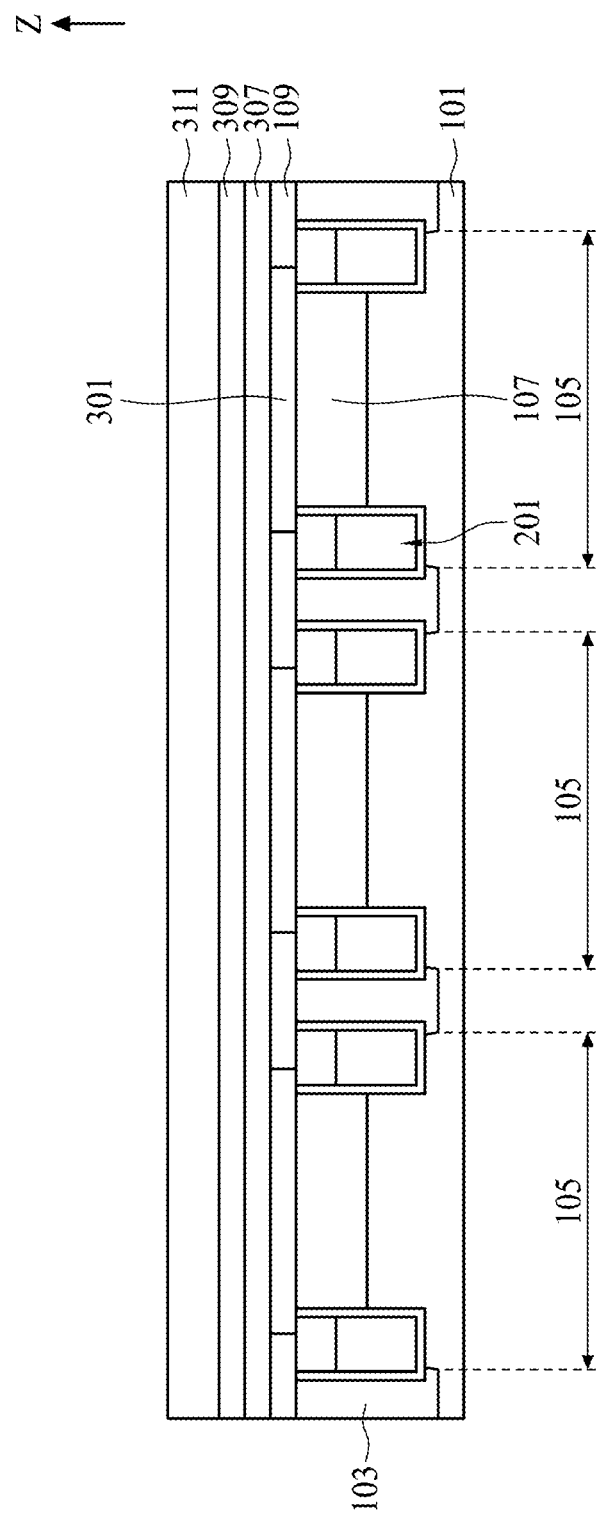
Figure 42:
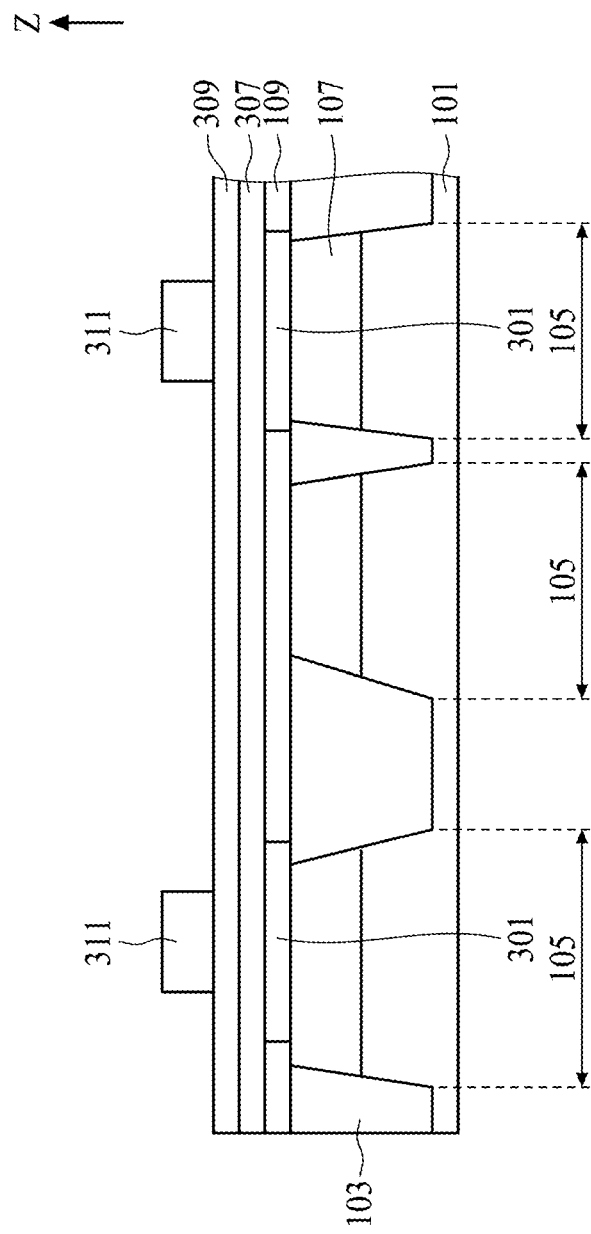

FIG. 39 illustrates, in a schematic top-view diagram, part of the flow of fabricating the semiconductor device in accordance with one embodiment of the present disclosure. FIGS. 40 to 42 illustrate, in schematic cross-sectional diagrams, part of the flow of fabricating the semiconductor device in accordance with FIG. 39.

Figure 43:
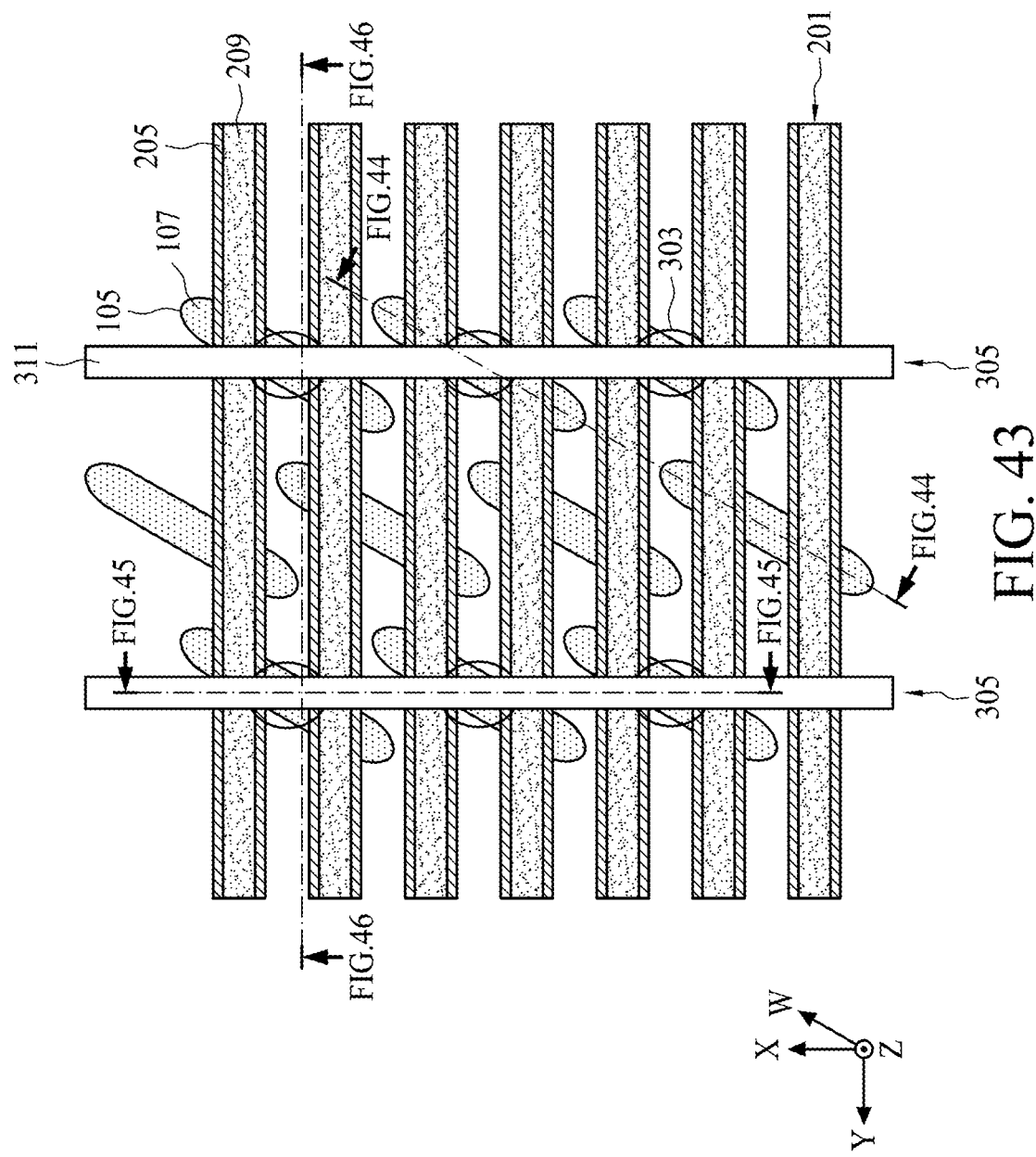
FIG. 43 illustrates, in a schematic top-view diagram, part of the flow of fabricating the semiconductor device in accordance with one embodiment of the present disclosure.
Figure 44:
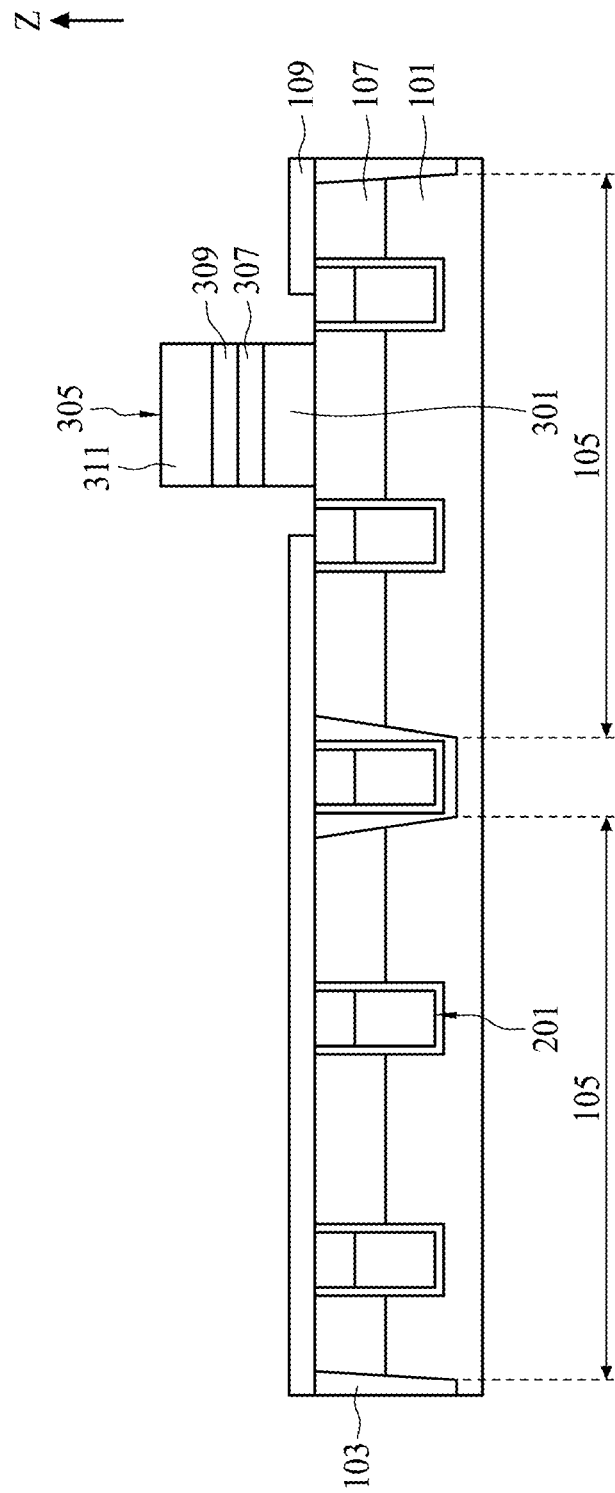
FIGS. 44 to 46 illustrate, in schematic cross-sectional diagrams, part of the flow of fabricating the semiconductor device in accordance with FIG. 43.
Figure 45:
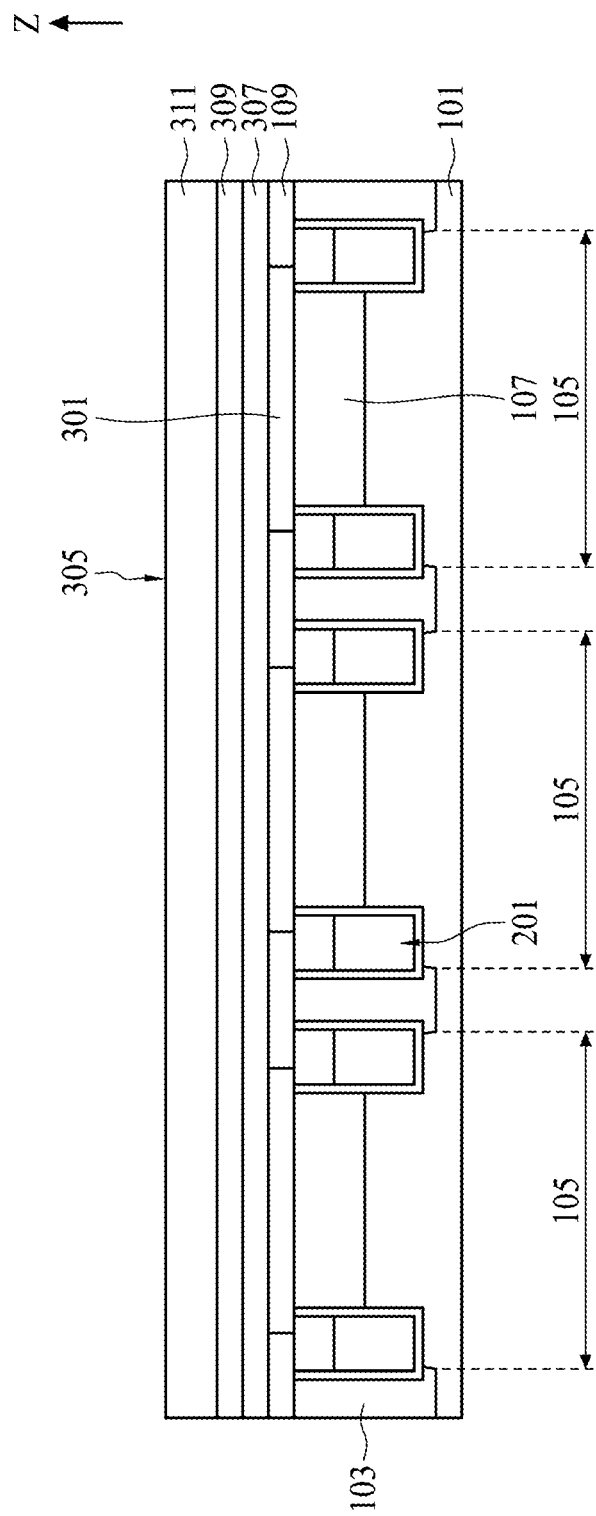
Figure 46:
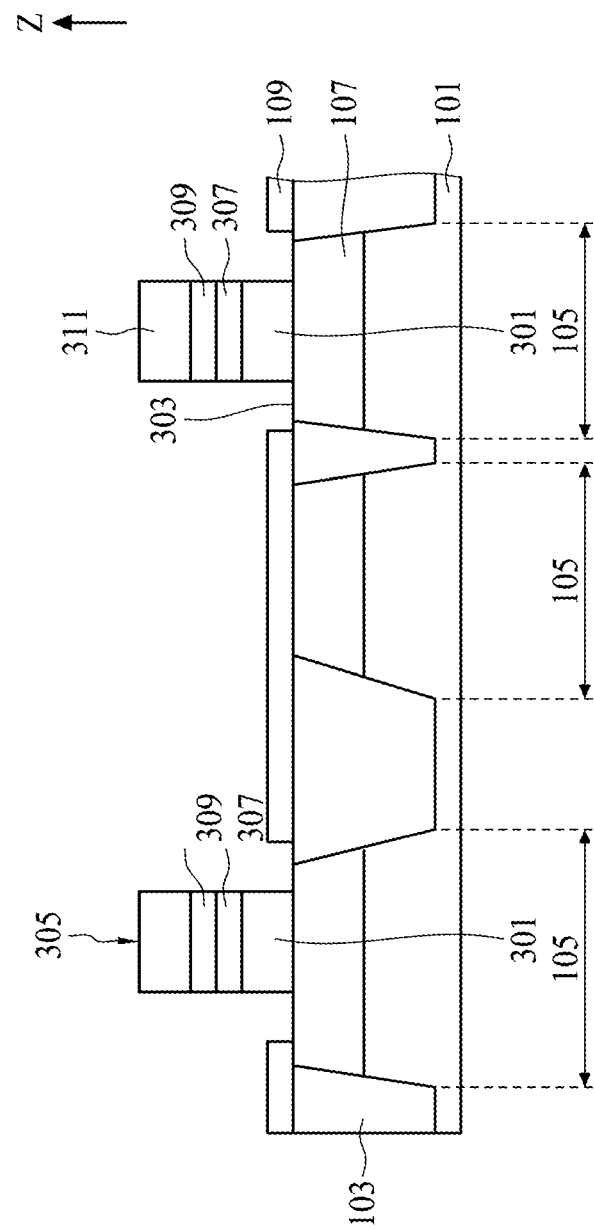

FIG. 43 illustrates, in a schematic top-view diagram, part of the flow of fabricating the semiconductor device in accordance with one embodiment of the present disclosure. FIGS. 44 to 46 illustrate, in schematic cross-sectional diagrams, part of the flow of fabricating the semiconductor device in accordance with FIG. 43.

With reference to FIG. 1 and FIGS. 39 to 46, at step S23, a plurality of first bit lines 305 may be correspondingly formed above the plurality of first bit line contacts 301. With reference to FIGS. 39 to 42, a series of deposition processes may be performed to sequentially deposit a bottom bit line electrode layer 307, a top bit line electrode layer 309, and a bit line capping layer on the buffer layer 109 and the plurality of first bit line contacts 301. The bottom bit line electrode layer 307 may be formed on the buffer layer 109 and the plurality of first bit line contacts 301. The top bit line electrode layer 309 may be formed on the bottom bit line electrode layer 307. The bit line capping layer may be formed on the bottom bit line electrode layer 307. The bottom bit line electrode layer 307 may be formed of, for example, polysilicon. The top bit line electrode layer 309 may be formed of, for example, copper, nickel, cobalt, aluminum, or tungsten. The bit line capping layer may be formed of, for example, silicon oxide or silicon nitride. A photolithography process may be performed to pattern the bit line capping layer to define the positions of the plurality of first bit lines 305. An etch process may be performed after the photolithography process to pattern the bit line capping layer to form a plurality of mask patterns 311. The plurality of mask patterns 311 may extend in a direction X diagonally intersecting the direction W and orthogonally intersecting the direction Y as viewed from above. The plurality of mask patterns 311 may protect the bottom bit line electrode layer 307 and the top bit line electrode layer 309 underneath the plurality of mask patterns 311. For simplicity, the isolation layer 103, the buffer layer 109, the bottom bit line electrode layer 307, and the top bit line electrode layer 309 are not shown in FIG. 39.

With reference to FIGS. 43 to 46, an etch process, such as an in anisotropic dry etch process, may be performed using the plurality of mask patterns 311 as masks. During the etch process, most of the bottom bit line electrode layer 307 and most of the top bit line electrode layer 309 may be removed, and only portions of the bottom bit line electrode layer 307 and the top bit line electrode layer 309 underneath the plurality of mask patterns 311 may be retained. The plurality of retained portions of the bottom bit line electrode layer 307, the plurality of retained portions of the top bit line electrode layer 309, and the plurality of mask patterns 311 may together form the plurality of bit lines 305. The plurality of bit lines 305 are separated from each other and parallel to each other. Each of the plurality of bit lines 305 extends in the direction X diagonally intersecting the direction W and orthogonally intersecting the direction Y as viewed from above. In addition, portions of the plurality of first bit line contacts 301 exposed during the etch process may be removed; in other words, widths of the plurality of first bit line contacts 301 may be reduced. Hence, the plurality of first bit line contacts 301 may be respectively correspondingly distanced from sidewalls of the plurality of first bit line contact openings 303. For simplicity, the isolation layer 103, the buffer layer 109, the bottom bit line electrode layer 307, and the top bit line electrode layer 309 are not shown in FIG. 43.

Figure 47:
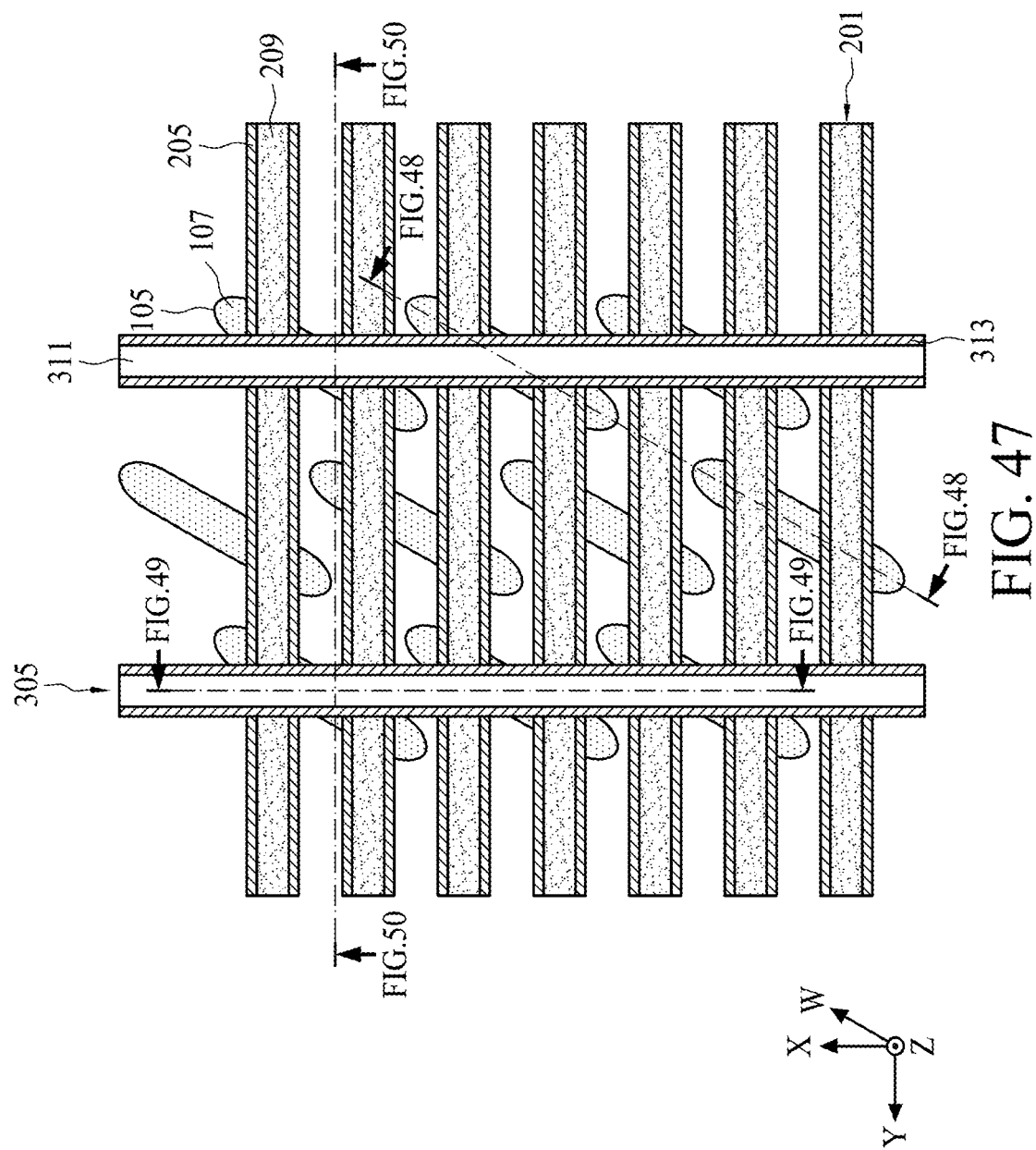
FIG. 47 illustrates, in a schematic top-view diagram, part of the flow of fabricating the semiconductor device in accordance with one embodiment of the present disclosure.
Figure 48:
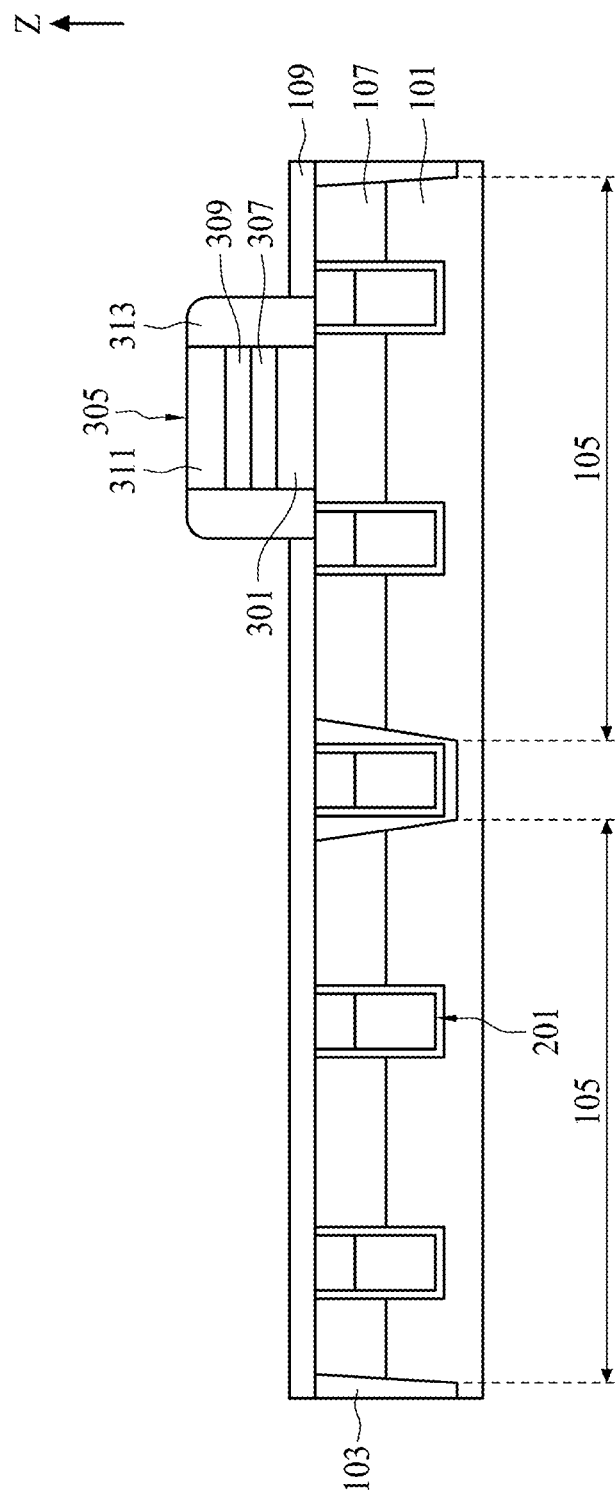
FIGS. 48 to 50 illustrate, in schematic cross-sectional diagrams, part of the flow of fabricating the semiconductor device in accordance with FIG. 47.
Figure 49:
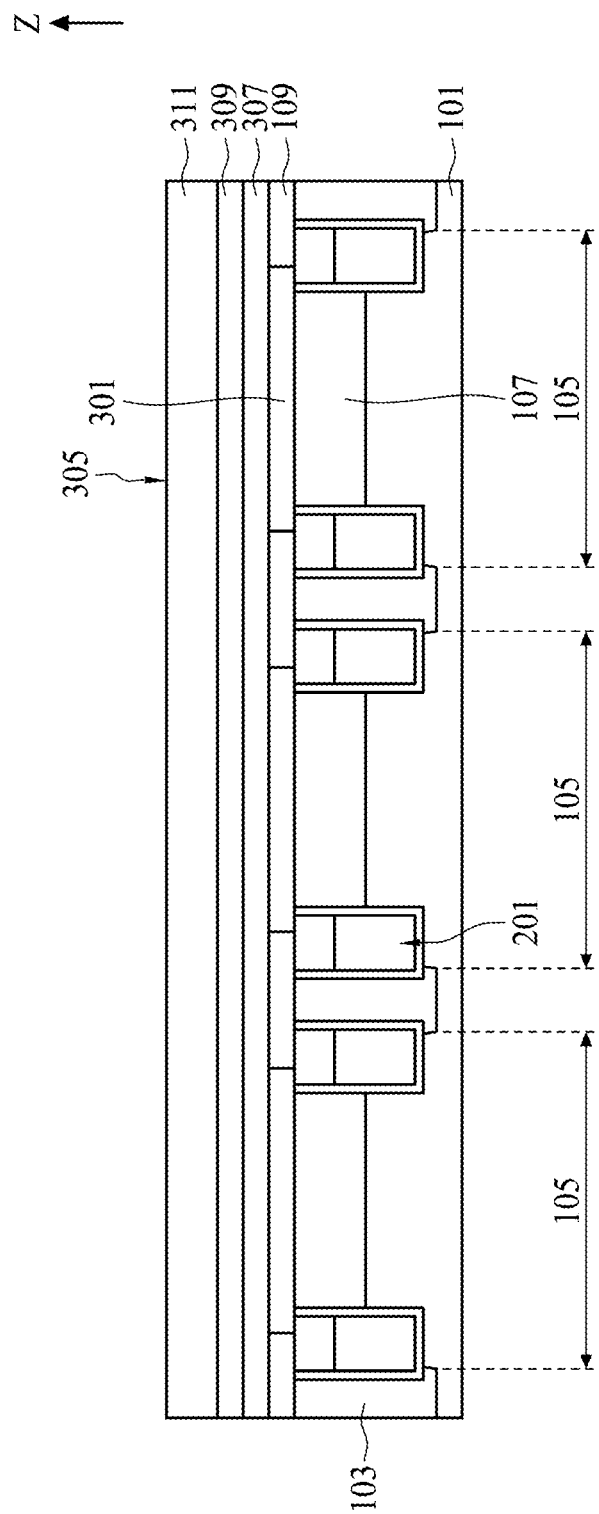
Figure 50:
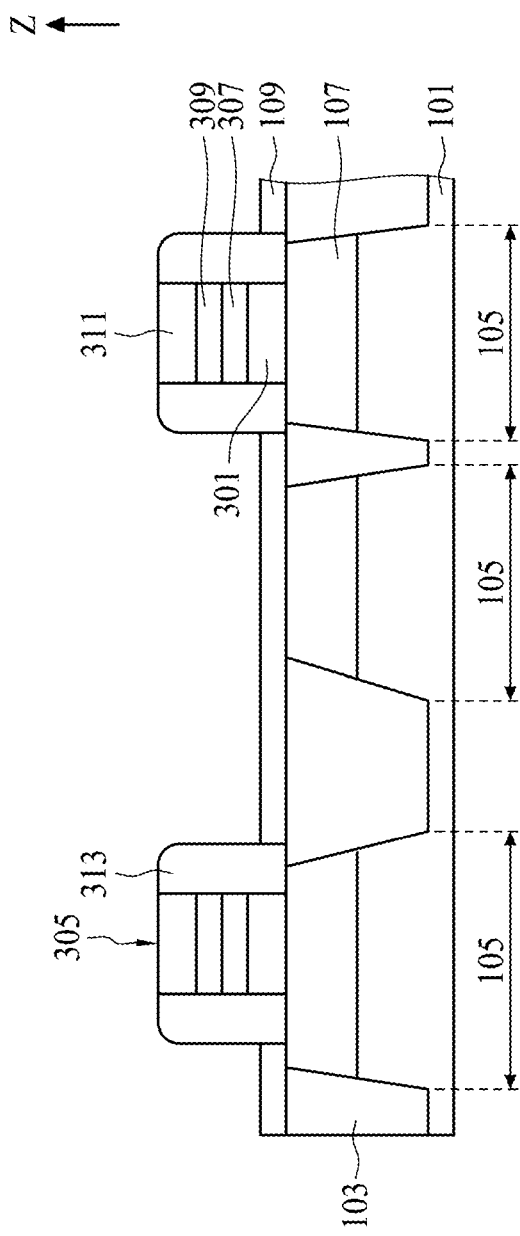

FIG. 47 illustrates, in a schematic top-view diagram, part of the flow of fabricating the semiconductor device in accordance with one embodiment of the present disclosure. FIGS. 48 to 50 illustrate, in schematic cross-sectional diagrams, part of the flow of fabricating the semiconductor device in accordance with FIG. 47. For simplicity, the isolation layer 103 and the buffer layer 109 are not shown in FIG. 47.

With reference to FIG. 1 and FIGS. 47 to 50, at step S25, a plurality of spacers 313 may be respectively correspondingly formed to cover sidewalls of the plurality of mask patterns 311, sidewalls of the plurality of top bit line electrode layers 309, sidewalls of the plurality of bottom bit line electrode layers 307, and sidewalls of the plurality of first bit line contacts 301. In the embodiment depicted, a deposition process may be performed to deposit a spacer insulating layer over the buffer layer 109 and the plurality of first bit lines 305. After the deposition process, an etch process, such as an anisotropic dry etch process, may be performed until top surfaces of the plurality of mask patterns 311 are exposed and the plurality of spacers 313 may be conformally formed. The plurality of spacers 313 may be formed of, for example, silicon oxide, silicon nitride, silicon oxynitride, or silicon nitride oxide.

Figure 51:
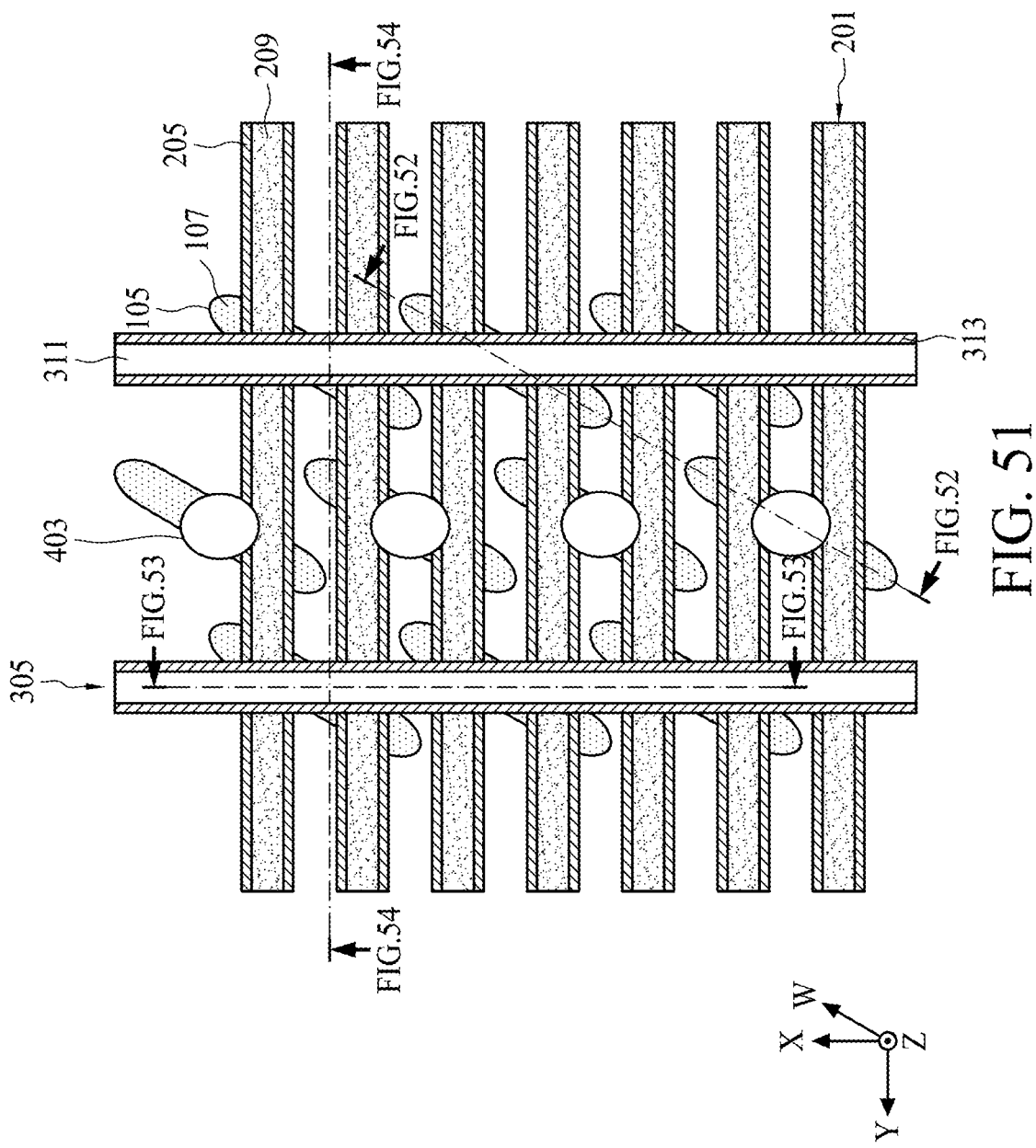
FIG. 51 illustrates, in a schematic top-view diagram, part of the flow of fabricating the semiconductor device in accordance with one embodiment of the present disclosure.
Figure 52:
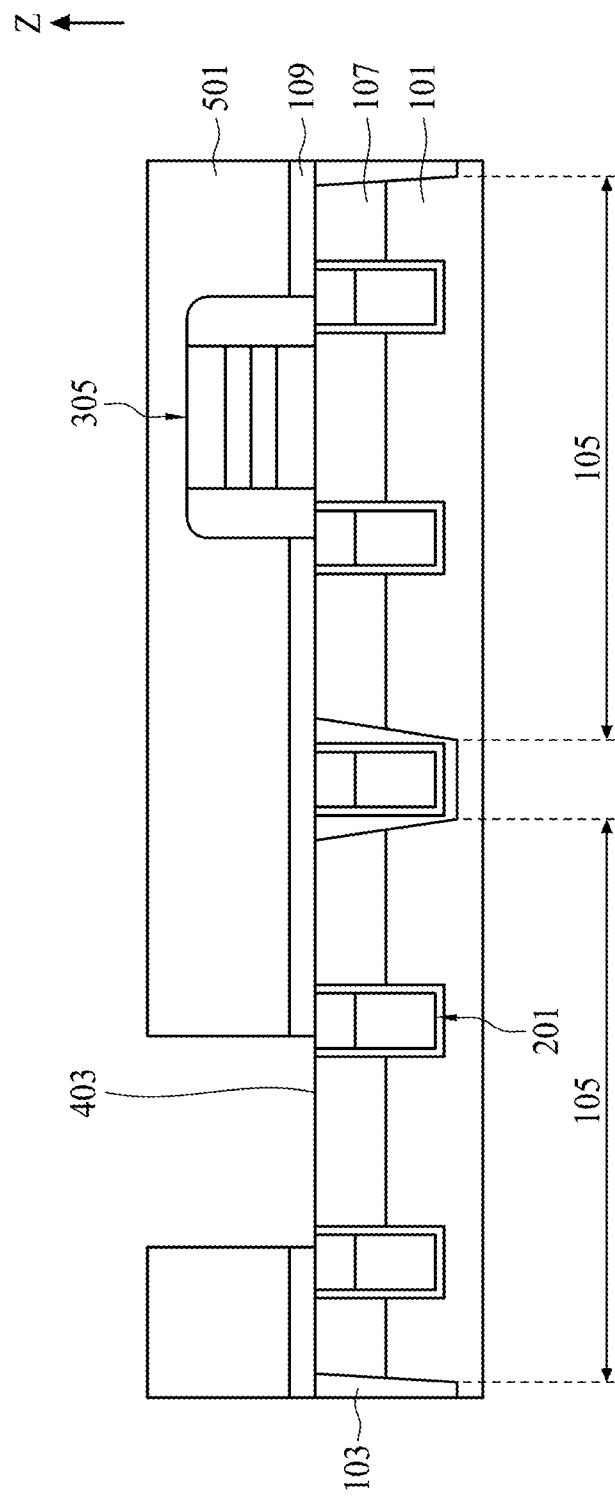
FIGS. 52 to 54 illustrate, in schematic cross-sectional diagrams, part of the flow of fabricating the semiconductor device in accordance with FIG. 51.
Figure 53:
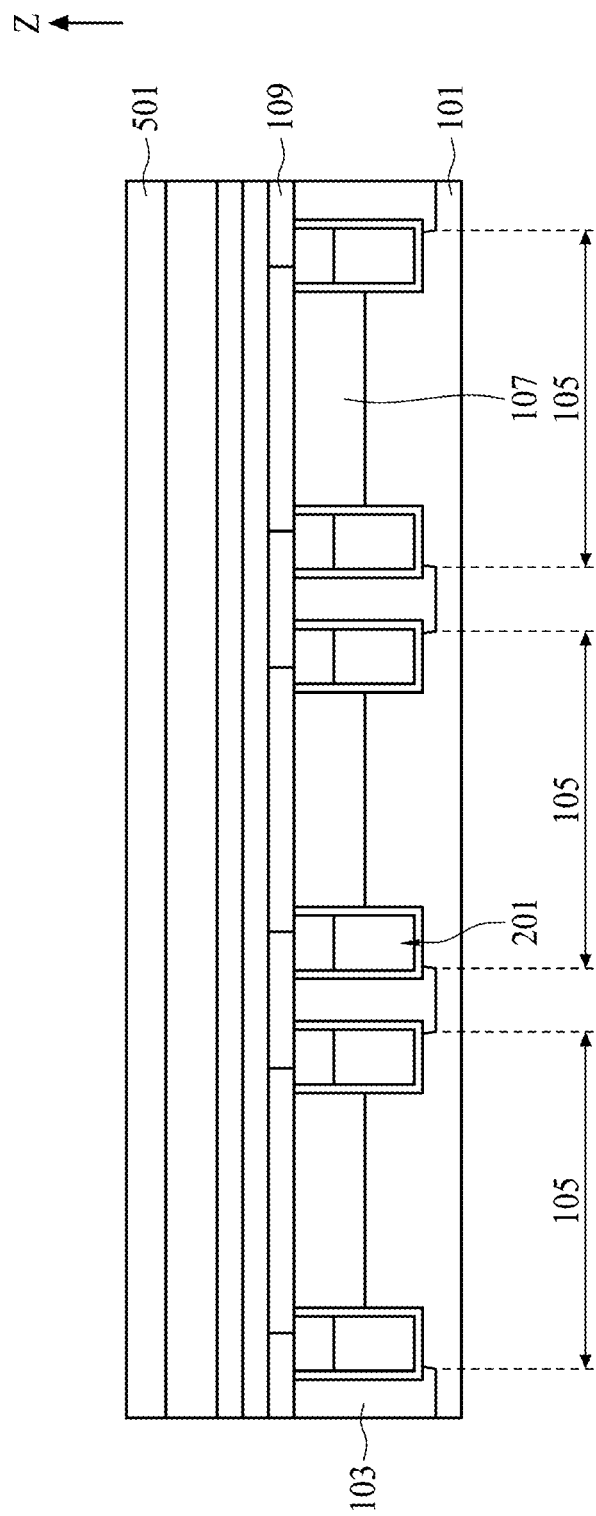
Figure 54:
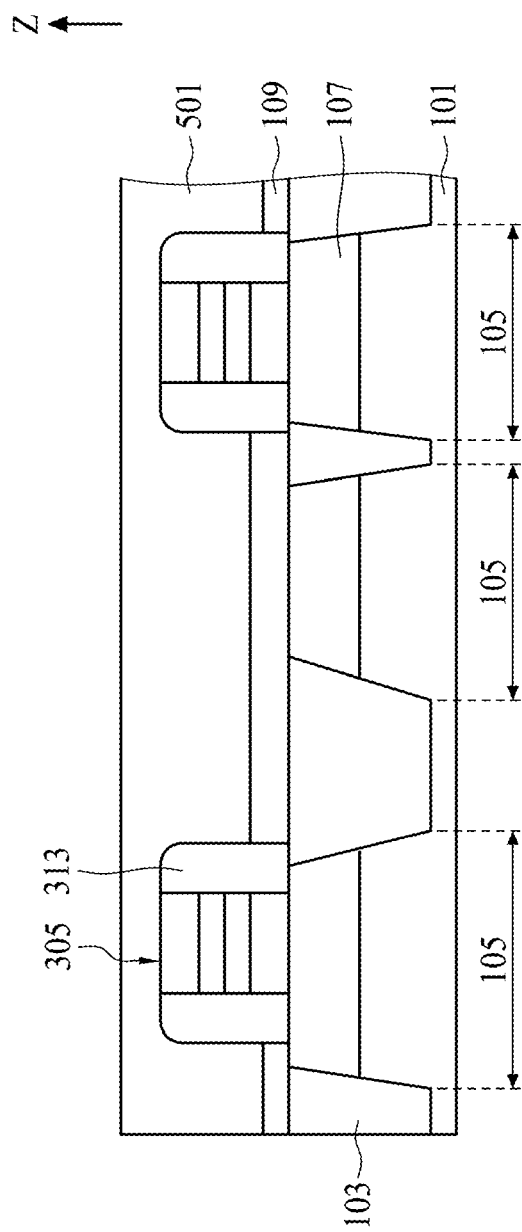

FIG. 51 illustrates, in a schematic top-view diagram, part of the flow of fabricating the semiconductor device in accordance with one embodiment of the present disclosure. FIGS. 52 to 54 illustrate, in schematic cross-sectional diagrams, part of the flow of fabricating the semiconductor device in accordance with FIG. 51.

Figure 55:
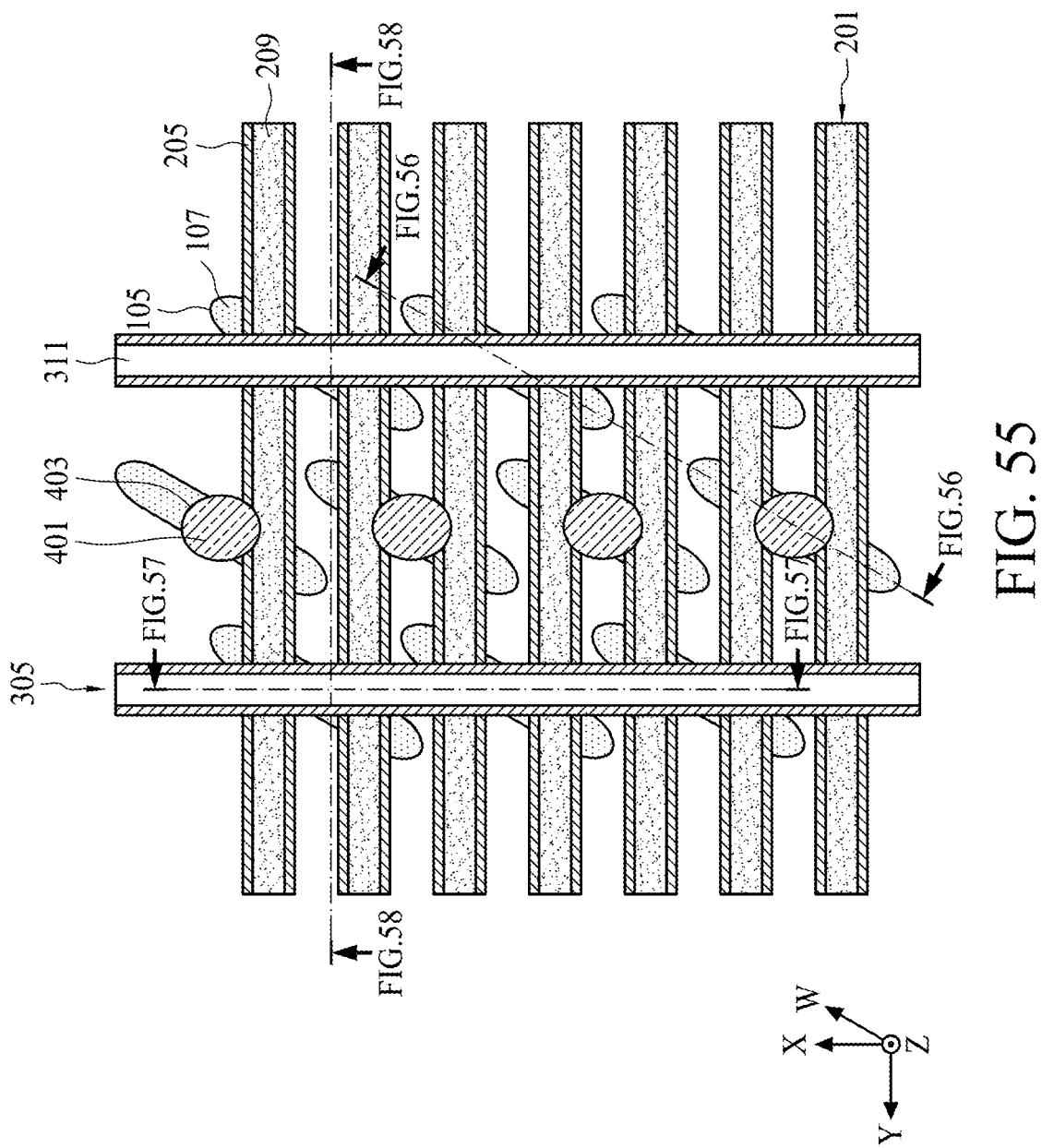
FIG. 55 illustrates, in a schematic top-view diagram, part of the flow of fabricating the semiconductor device in accordance with one embodiment of the present disclosure.
Figure 56:
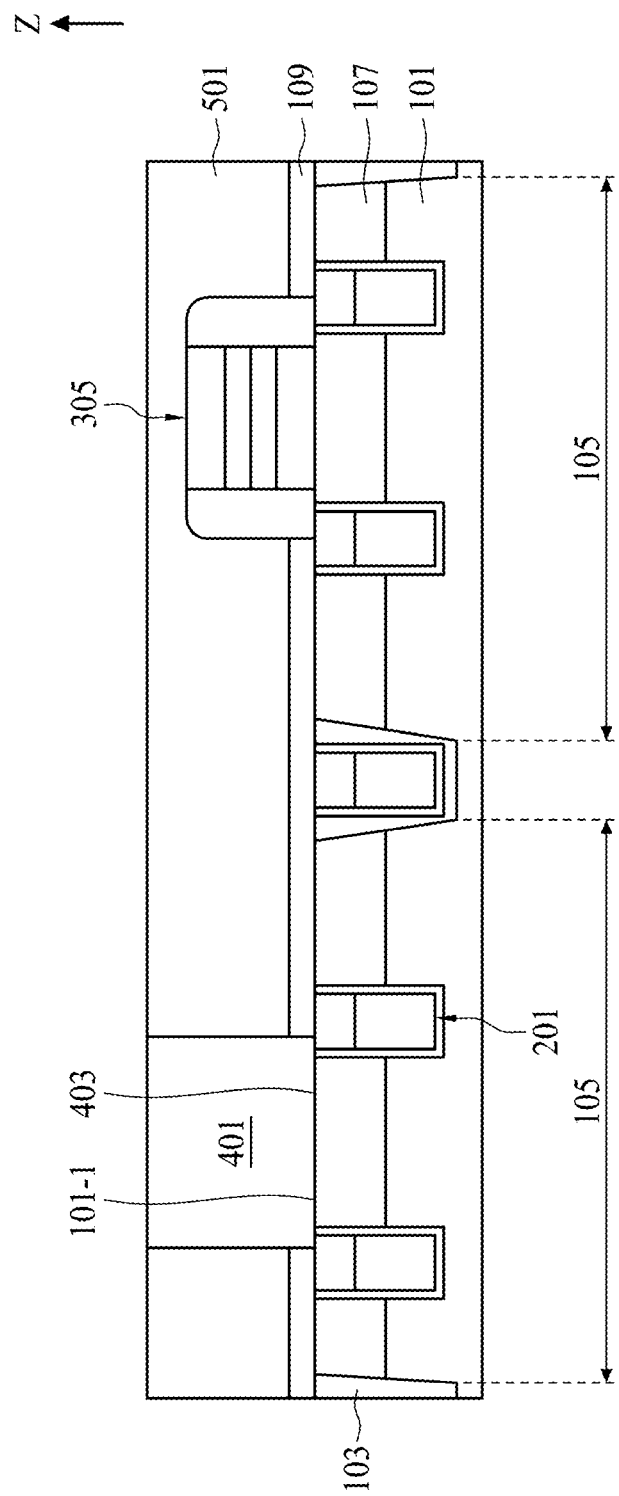
FIGS. 56 to 58 illustrate, in schematic cross-sectional diagrams, part of the flow of fabricating the semiconductor device in accordance with FIG. 55.
Figure 57:
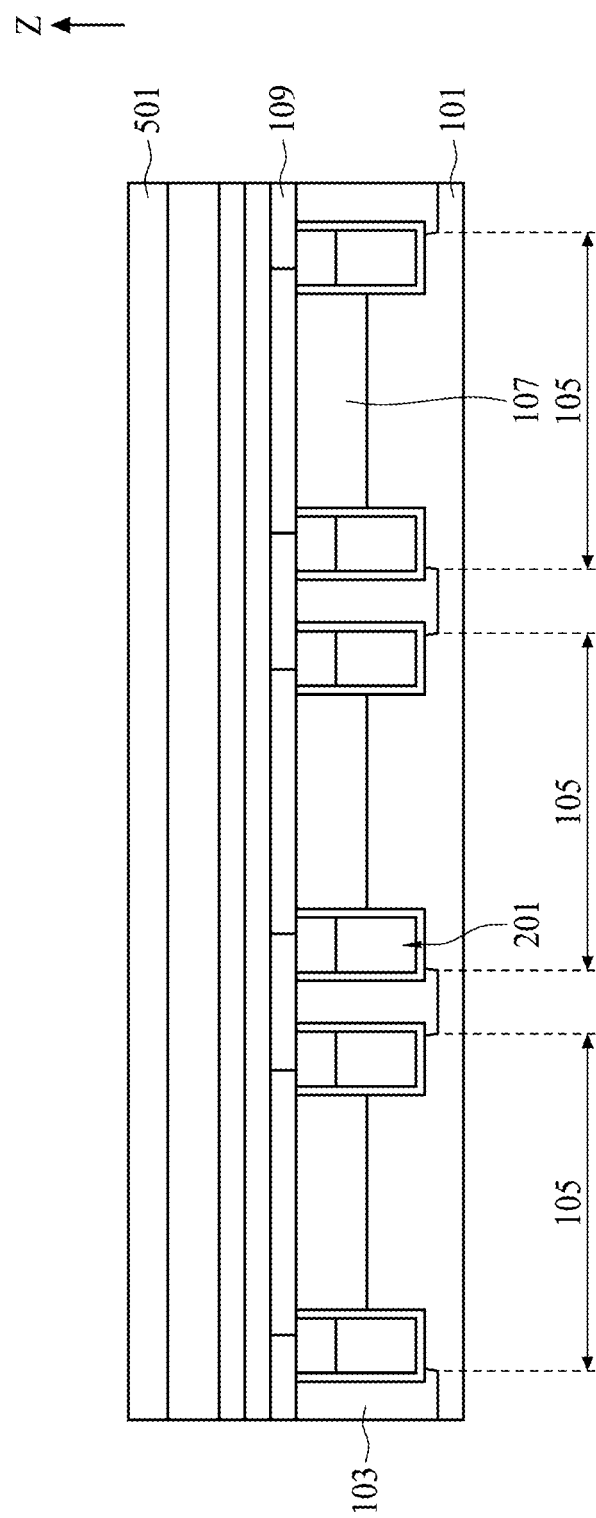
Figure 58:
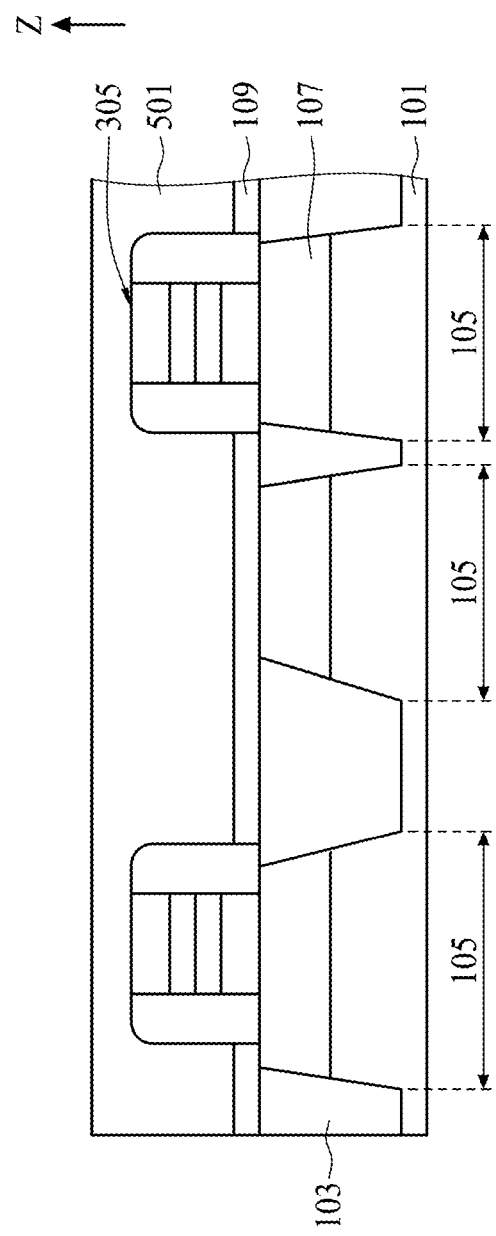

FIG. 55 illustrates, in a schematic top-view diagram, part of the flow of fabricating the semiconductor device in accordance with one embodiment of the present disclosure. FIGS. 56 to 58 illustrate, in schematic cross-sectional diagrams, part of the flow of fabricating the semiconductor device in accordance with FIG. 55.

With reference to FIG. 1 and FIGS. 51 to 58, at step S27, a plurality of second bit line contacts 401 may be formed and contacts the upper surface 101-1 of the substrate 101. With reference to FIGS. 51 to 54, a first insulating film 501 may be formed, by a deposition process, on the buffer layer 109 and encloses the plurality of bit lines 305 and the plurality of spacers 313. A planarization process, such as chemical mechanical polishing, may be performed to provide a substantially flat surface for subsequent processing steps. The first insulating film 501 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. After the planarization process, a photolithography process may be performed to pattern the first insulating film 501 to define positions of the plurality of second bit line contacts 401. An etch process may be performed after the photolithography process to form a plurality of second bit line contact openings 403 in the first insulating film 501 and the buffer layer 109. Center portions of others of the plurality of source/drain regions 107 may be exposed through the plurality of second bit line contact openings 403 as viewed from above. For simplicity, the isolation layer 103, the buffer layer 109, and the first insulating film 501 are not shown in FIG. 51.

With reference to FIGS. 55 to 58, in the embodiment depicted, a conductive material, for example, doped polysilicon, a metal, or a metal silicide may be deposited into the plurality of second bit line contact openings 403 by a metallization process. After the metallization process, a planarization process, such as chemical mechanical polishing, may be performed to remove excess material, provide a substantially flat surface for subsequent processing steps, and conformally form the plurality of second bit line contacts 401. The plurality of second bit line contacts 401 may be electrically connected to the center portions of the others of the plurality of source/drain regions 107. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. Top surfaces of the plurality of second bit line contacts 401 may be at a vertical level higher than a vertical level of the top surfaces of the plurality of mask patterns 311. For simplicity, the isolation layer 103, the buffer layer 109, and the first insulating film 501 are not shown in FIG. 55.

Figure 59:
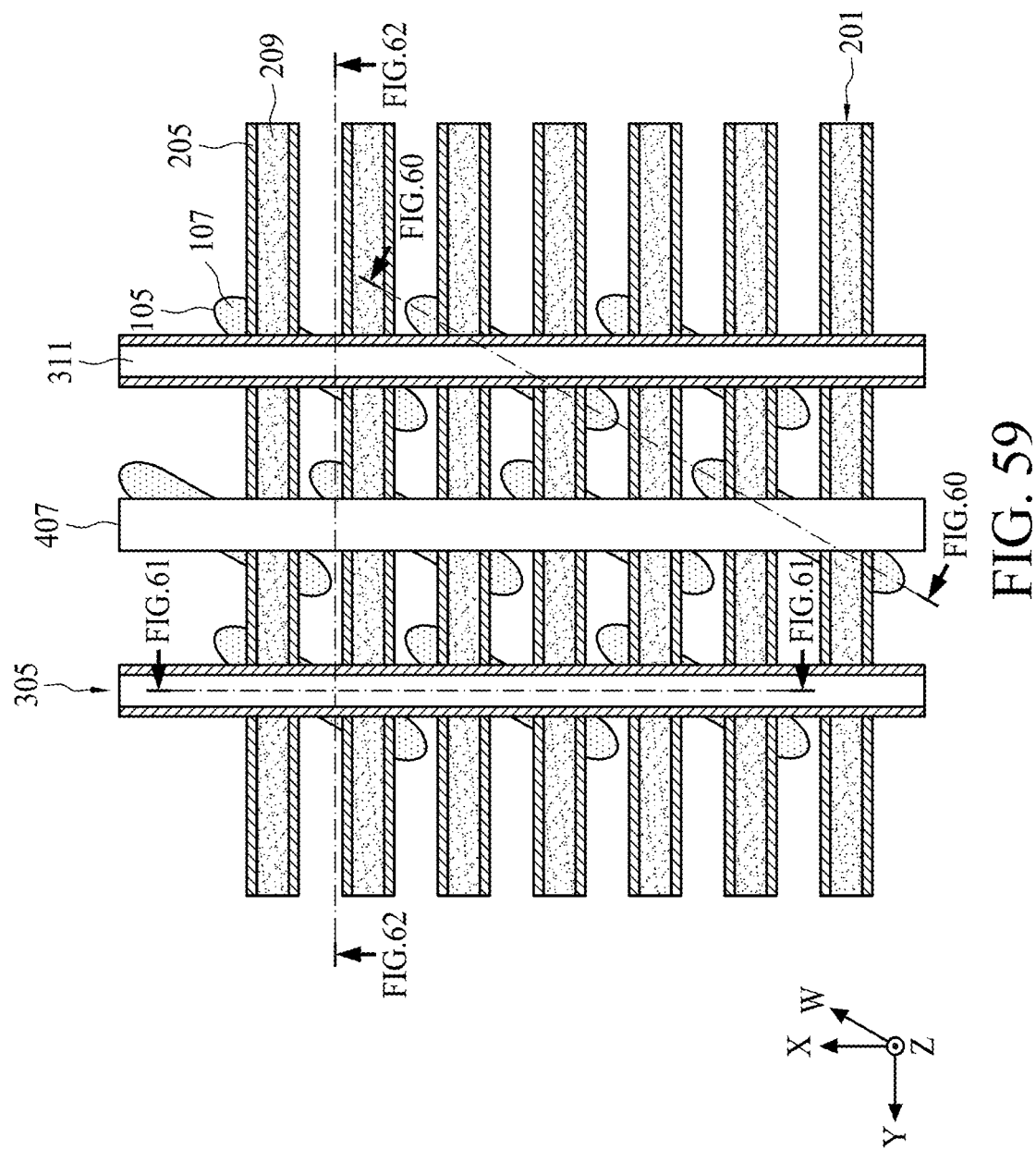
FIG. 59 illustrates, in a schematic top-view diagram, part of the flow of fabricating the semiconductor device in accordance with one embodiment of the present disclosure.
Figure 60:
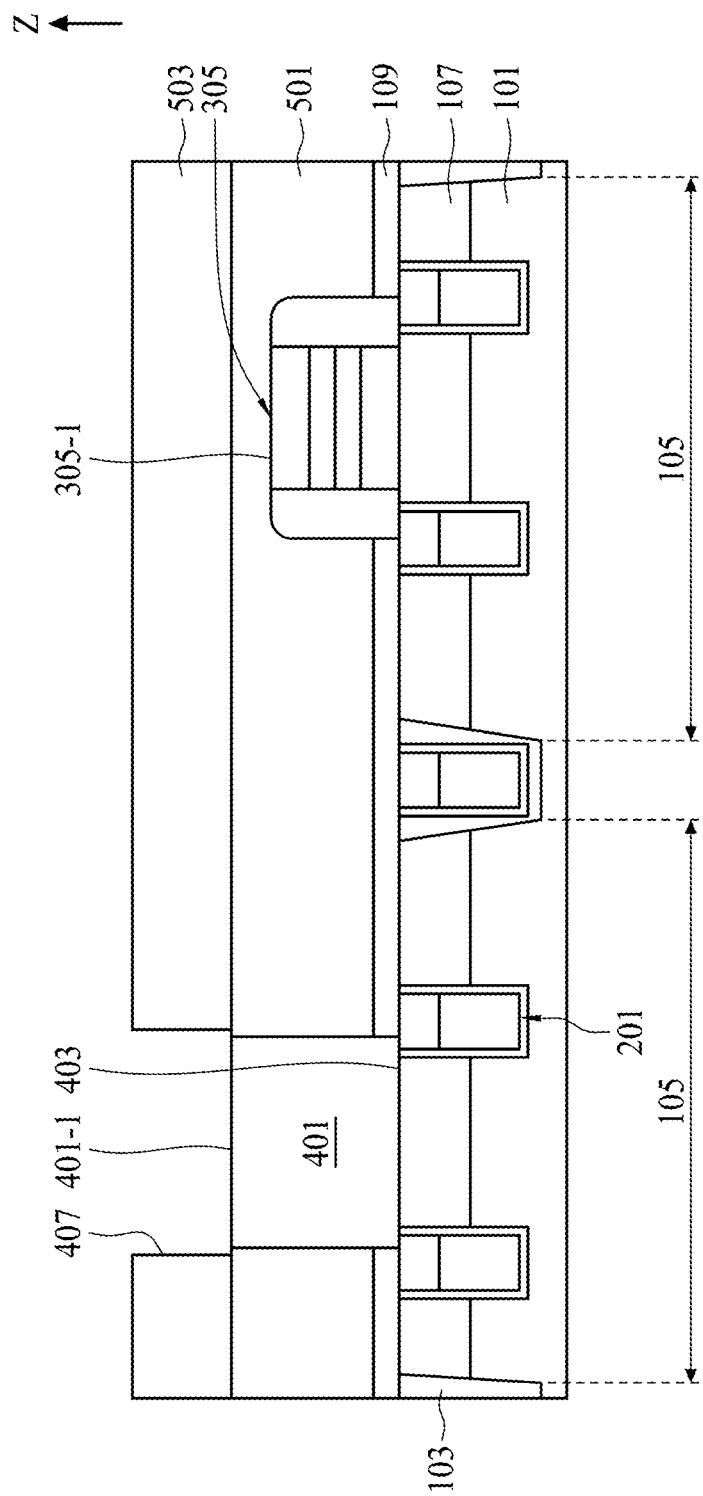
FIGS. 60 to 62 illustrate, in schematic cross-sectional diagrams, part of the flow of fabricating the semiconductor device in accordance with FIG. 59.
Figure 61:
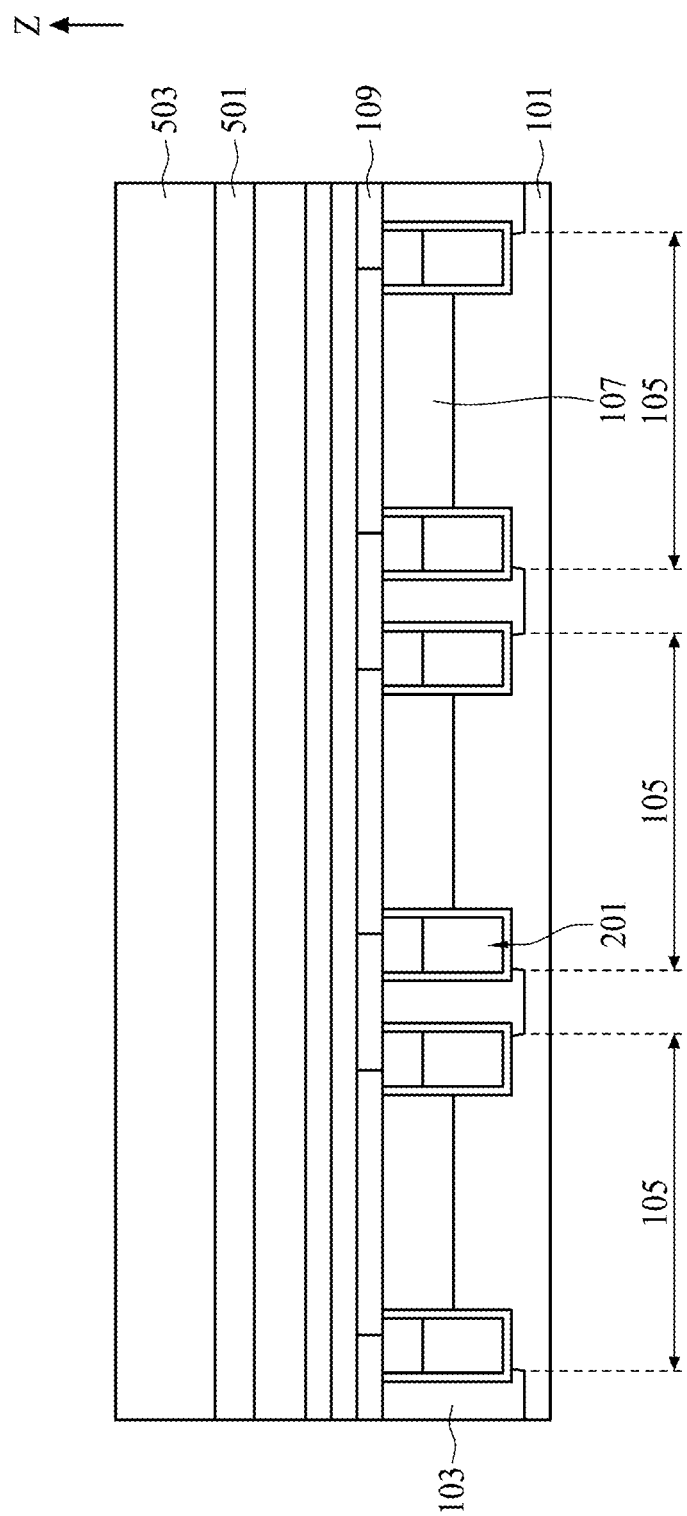
Figure 62:
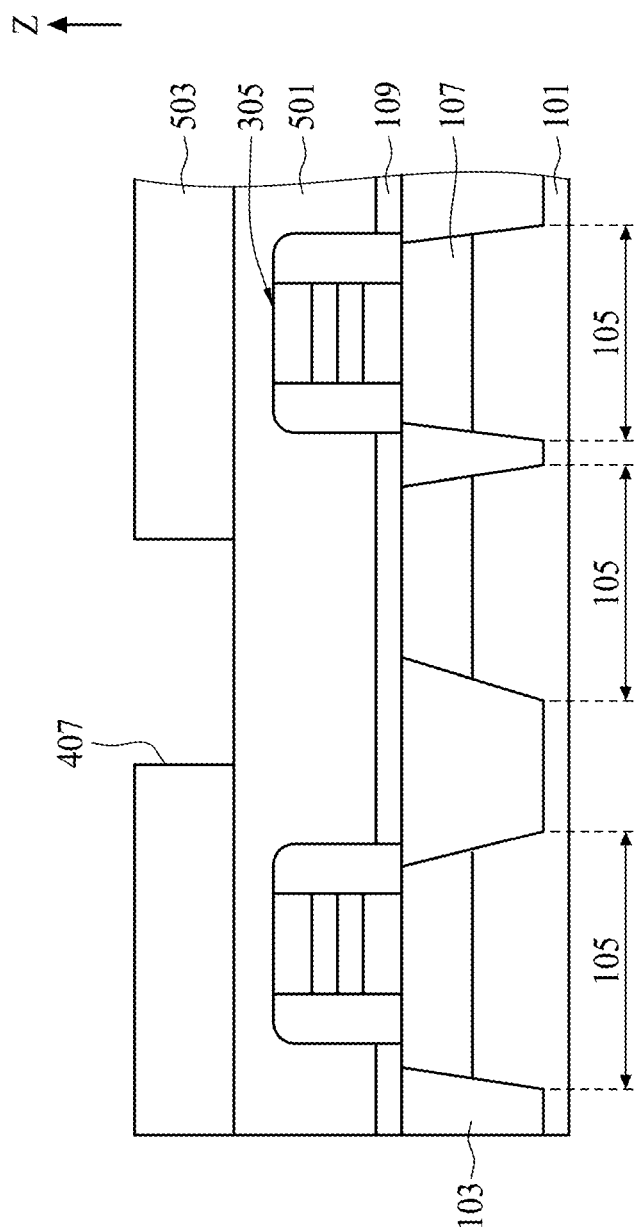

FIG. 59 illustrates, in a schematic top-view diagram, part of the flow of fabricating the semiconductor device in accordance with one embodiment of the present disclosure. FIGS. 60 to 62 illustrate, in schematic cross-sectional diagrams, part of the flow of fabricating the semiconductor device in accordance with FIG. 59.

Figure 63:
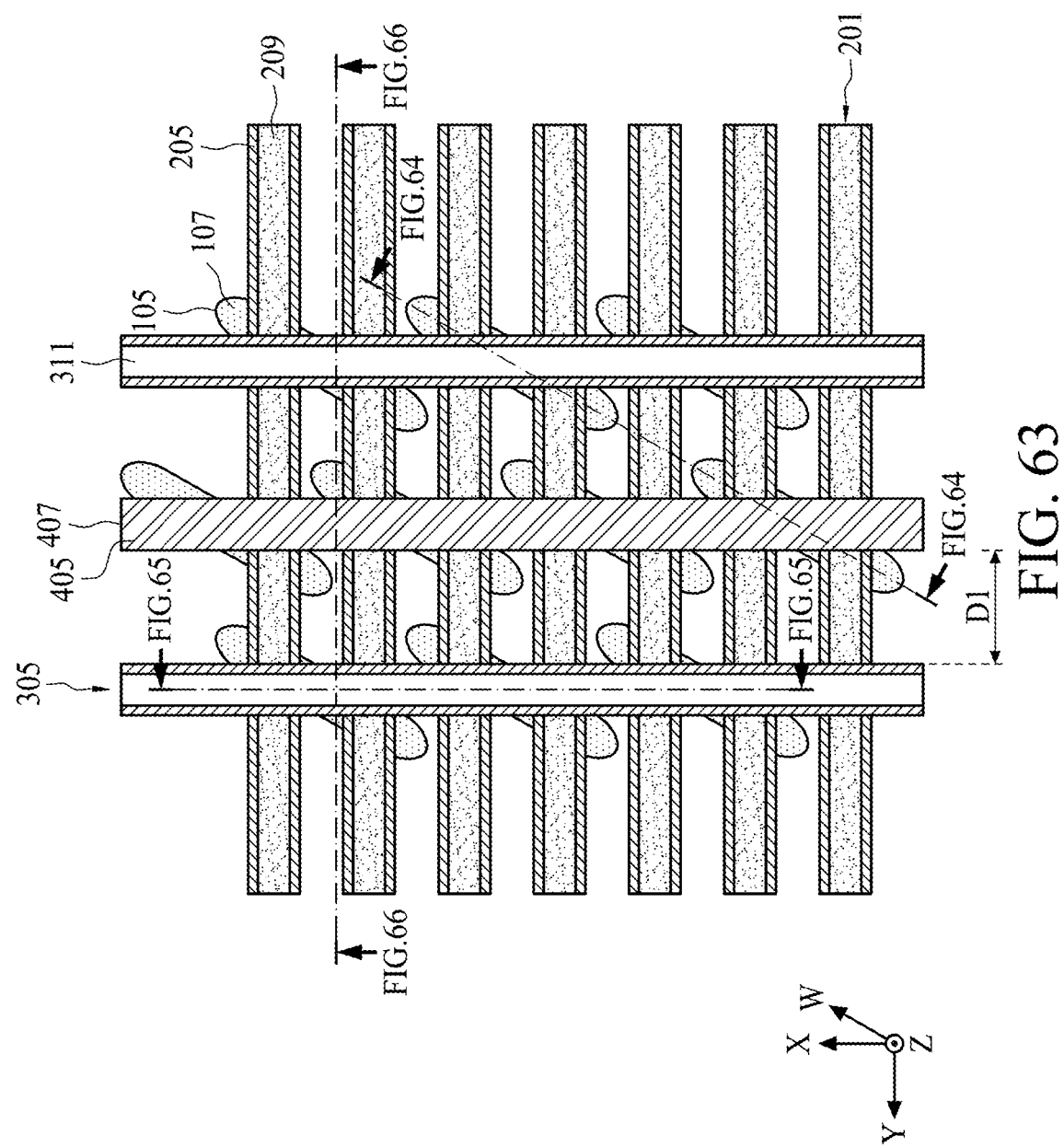
FIG. 63 illustrates, in a schematic top-view diagram, part of the flow of fabricating the semiconductor device in accordance with one embodiment of the present disclosure.
Figure 64:
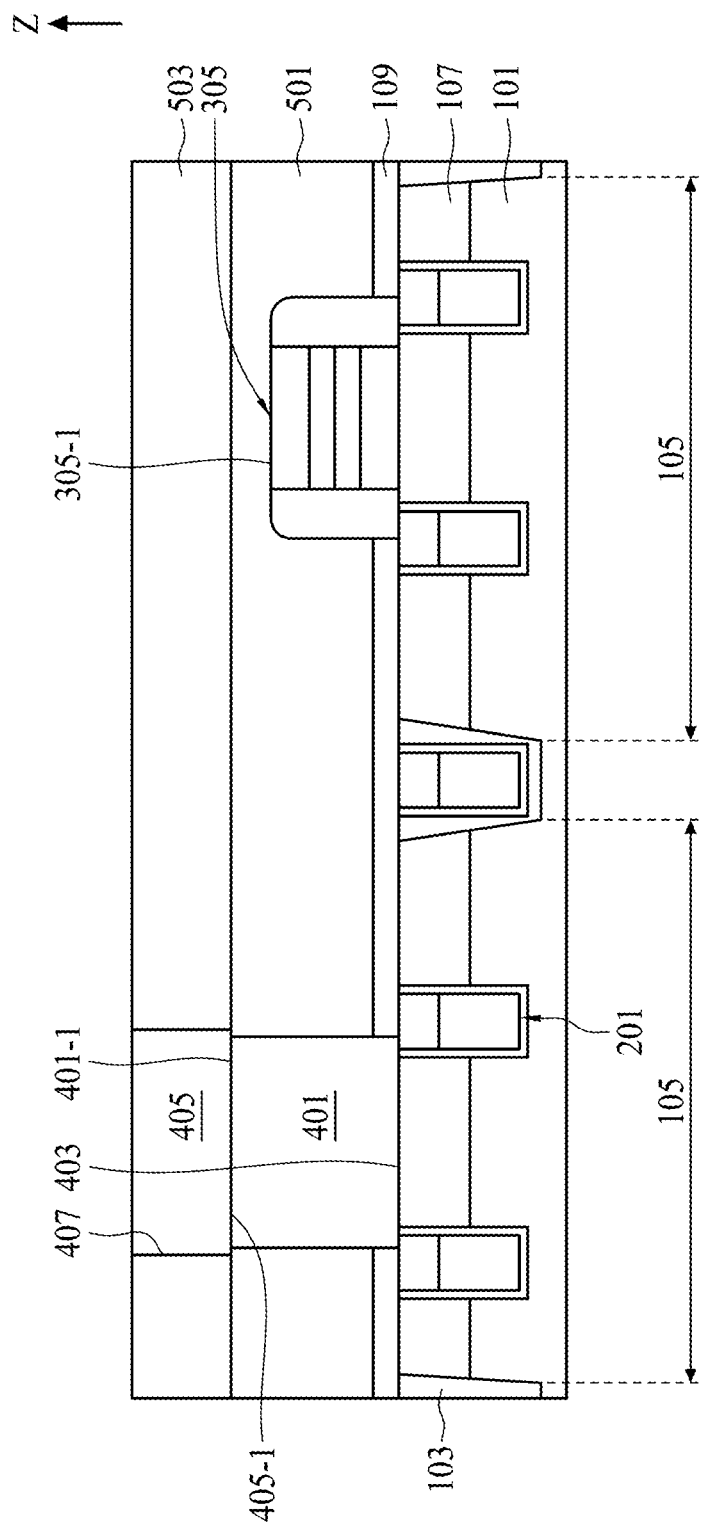
FIGS. 64 to 66 illustrate, in schematic cross-sectional diagrams, part of the flow of fabricating the semiconductor device in accordance with FIG. 63.
Figure 65:
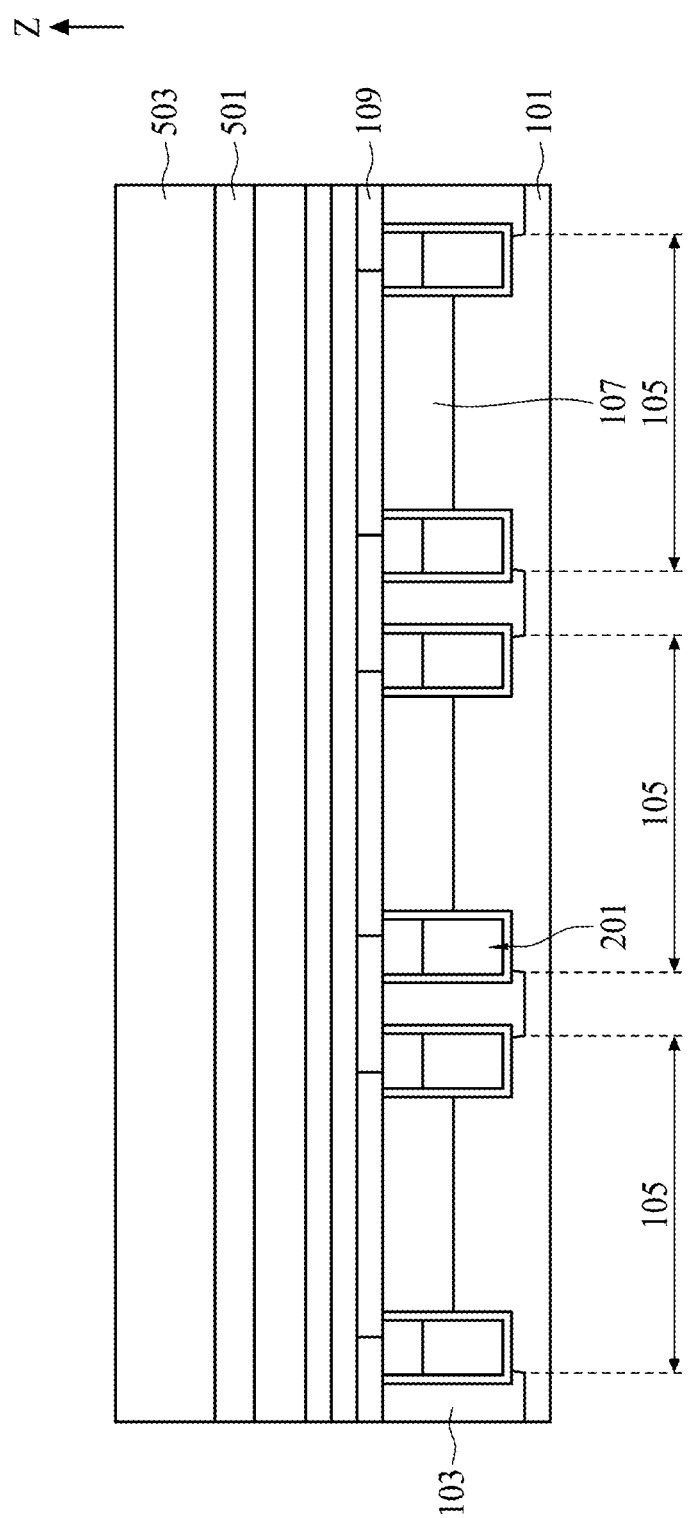
Figure 66:
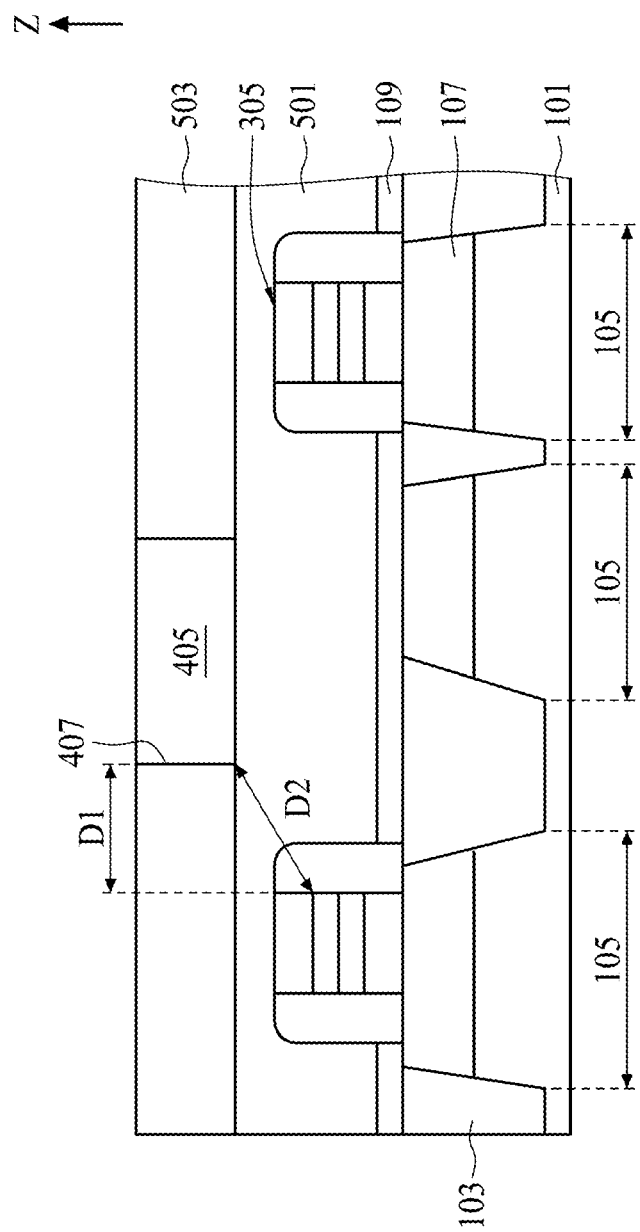

FIG. 63 illustrates, in a schematic top-view diagram, part of the flow of fabricating the semiconductor device in accordance with one embodiment of the present disclosure. FIGS. 64 to 66 illustrate, in schematic cross-sectional diagrams, part of the flow of fabricating the semiconductor device in accordance with FIG. 63.

With reference to FIG. 1 and FIGS. 59 to 66, at step S29, a plurality of second bit lines 405 may be formed above the first insulating film 501 and contacts the second bit line contacts 401. (For simplicity, only one second bit line is shown in FIGS. 59 to 60, 62 to 64, and 66.) With reference to FIGS. 59 to 62, a second insulating film 503 may be formed, by a deposition process, on the first insulating film 501. A planarization process, such as chemical mechanical polishing, may be optionally performed to provide a substantially flat surface for subsequent processing steps. The second insulating film 503 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. After the planarization process, a photolithography process may be performed to pattern the second insulating film 503 to define positions of the plurality of second bit lines 405. An etch process, such as an anisotropic dry etch process, may be performed after the photolithography process to form a plurality of second bit line trenches 407 in the second insulating film 503. The plurality of second bit line contacts 401 may be exposed through the plurality of second bit line trenches 407. Each of the plurality of second bit line trenches 407 may extend in the direction X and may be disposed between an adjacent pair of the plurality of first bit lines 305 as viewed from above. For simplicity, the isolation layer 103, the buffer layer 109, the first insulating film 501, and the second insulating film 503 are not shown in FIG. 59.

With reference to FIGS. 63 to 66, in the embodiment depicted, a conductive material, for example, copper, nickel, cobalt, aluminum, or tungsten, may be deposited into the plurality of second bit line trenches 407 by a metallization process. After the metallization process, a planarization process, such as chemical mechanical polishing, may be performed to remove excess material, provide a substantially flat surface for subsequent processing steps, and conformally form the plurality of second bit lines 405. Bottom surfaces of the plurality of second bit lines 405 may be at a vertical level higher than the vertical level of the top surfaces of the plurality of mask patterns 311. A horizontal distance D1 between one of the plurality of first bit lines 305 and an adjacent one of the plurality of second bit lines 405 is less than a diagonal distance D2 between the one of the plurality of first bit lines 305 and the adjacent one of the plurality of second bit lines 405. For simplicity, the isolation layer 103, the buffer layer 109, the first insulating film 501, and the second insulating film 503 are not shown in FIG. 63. In some embodiment, the second bit lines 405 and the second bit line contacts 401 may be integrally formed by a damascene process.

Figure 67:
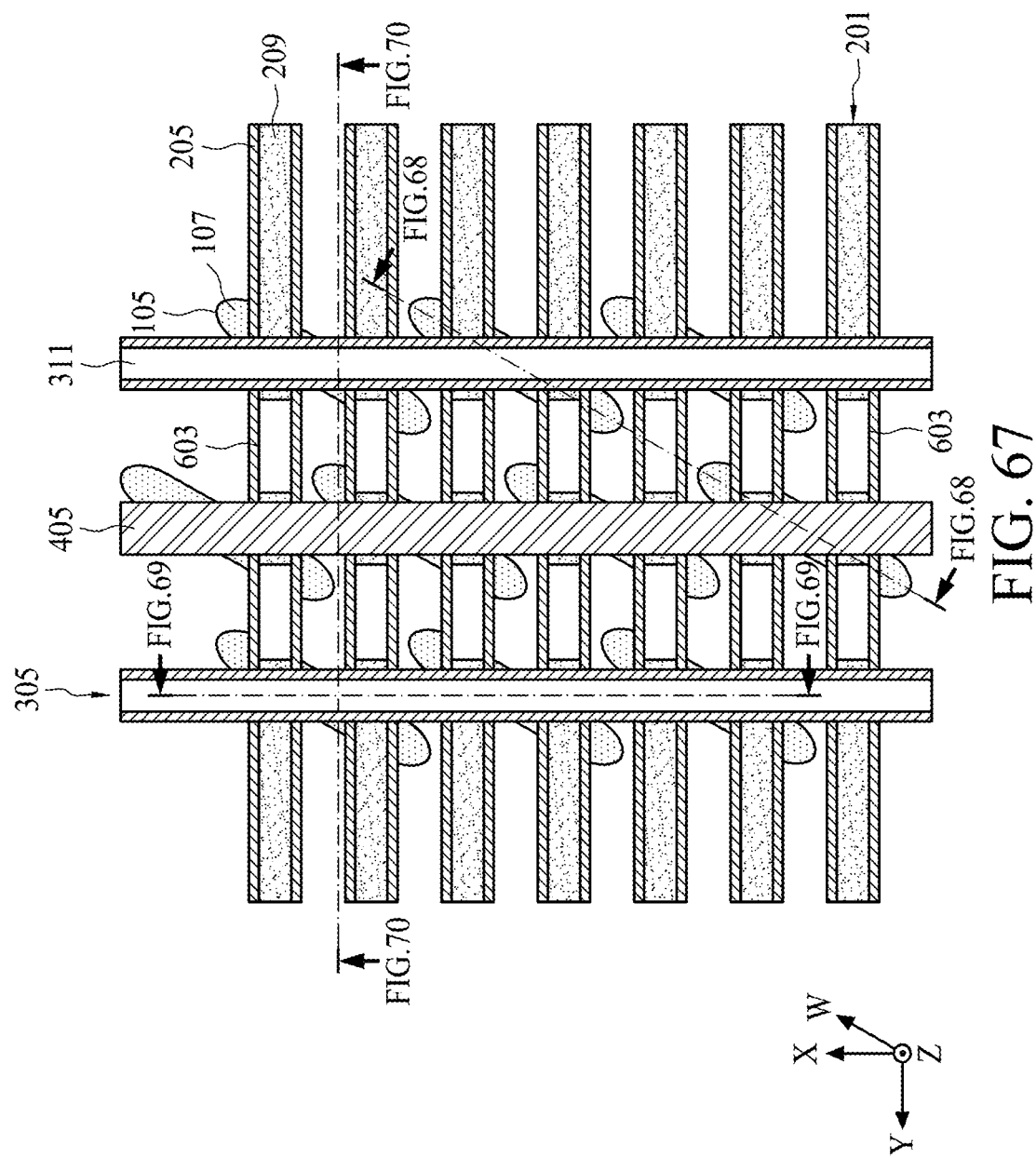
FIG. 67 illustrates, in a schematic top-view diagram, part of the flow of fabricating the semiconductor device in accordance with one embodiment of the present disclosure.
Figure 68:
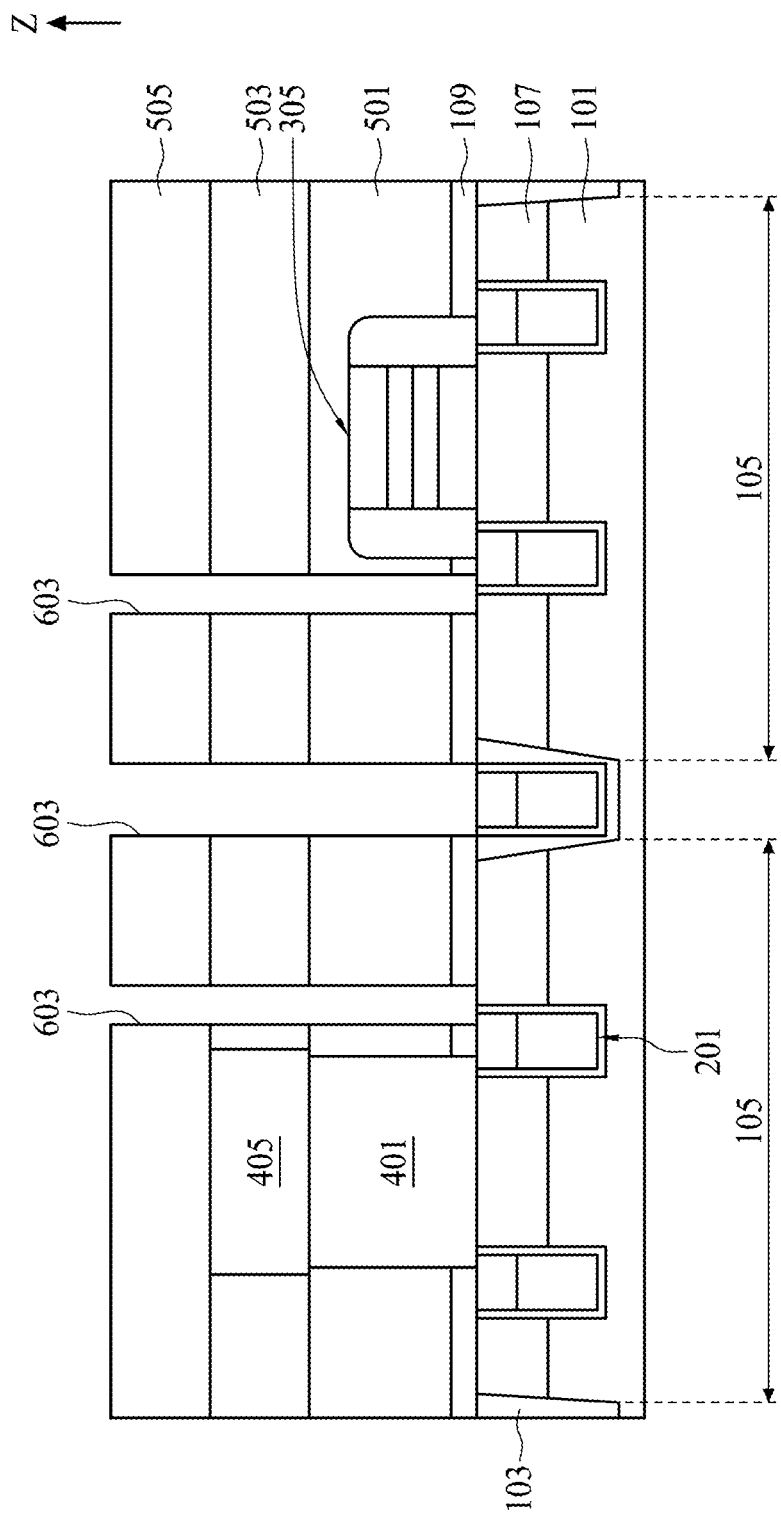
FIGS. 68 to 70 illustrate, in schematic cross-sectional diagrams, part of the flow of fabricating the semiconductor device in accordance with FIG. 67.
Figure 69:
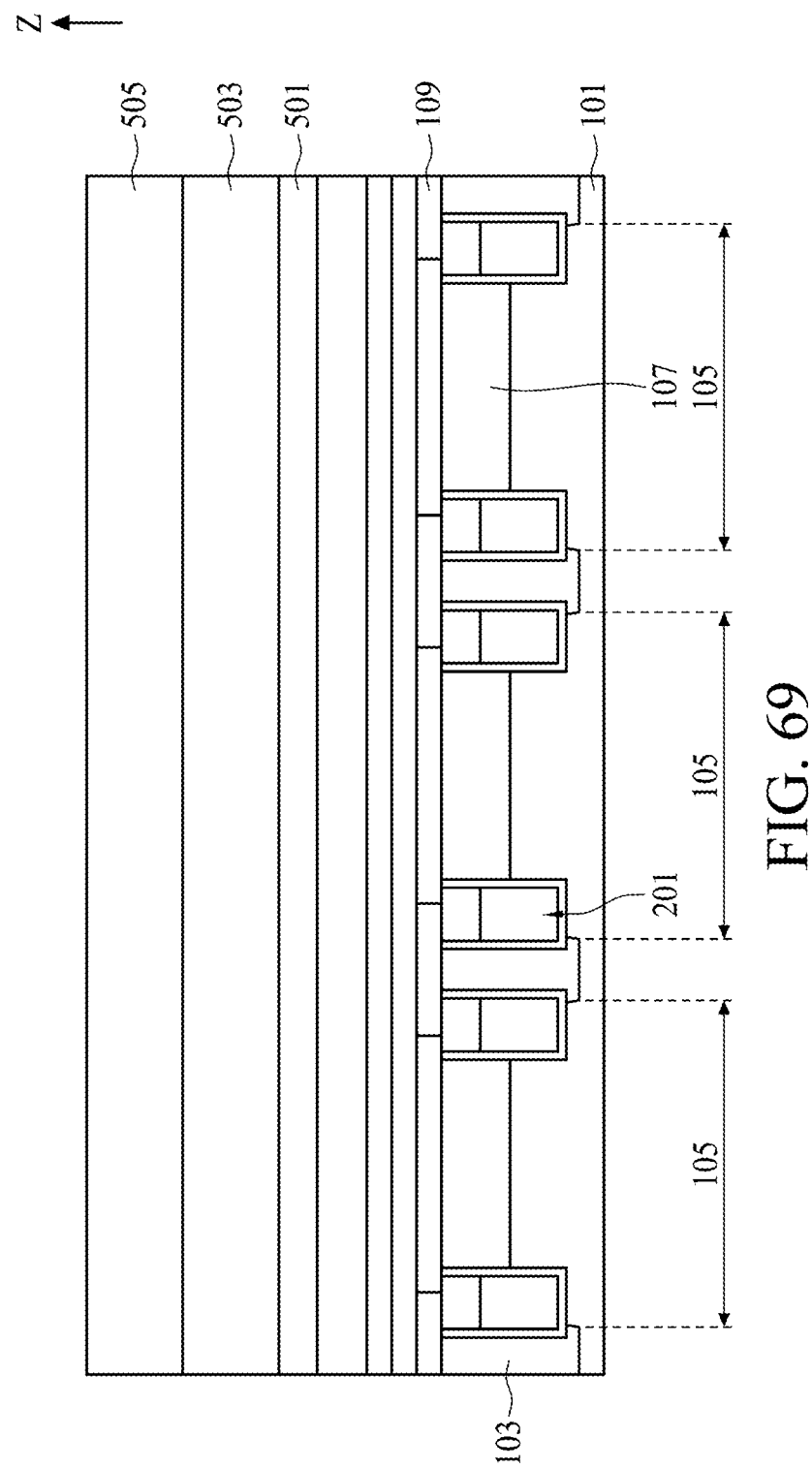
Figure 70:
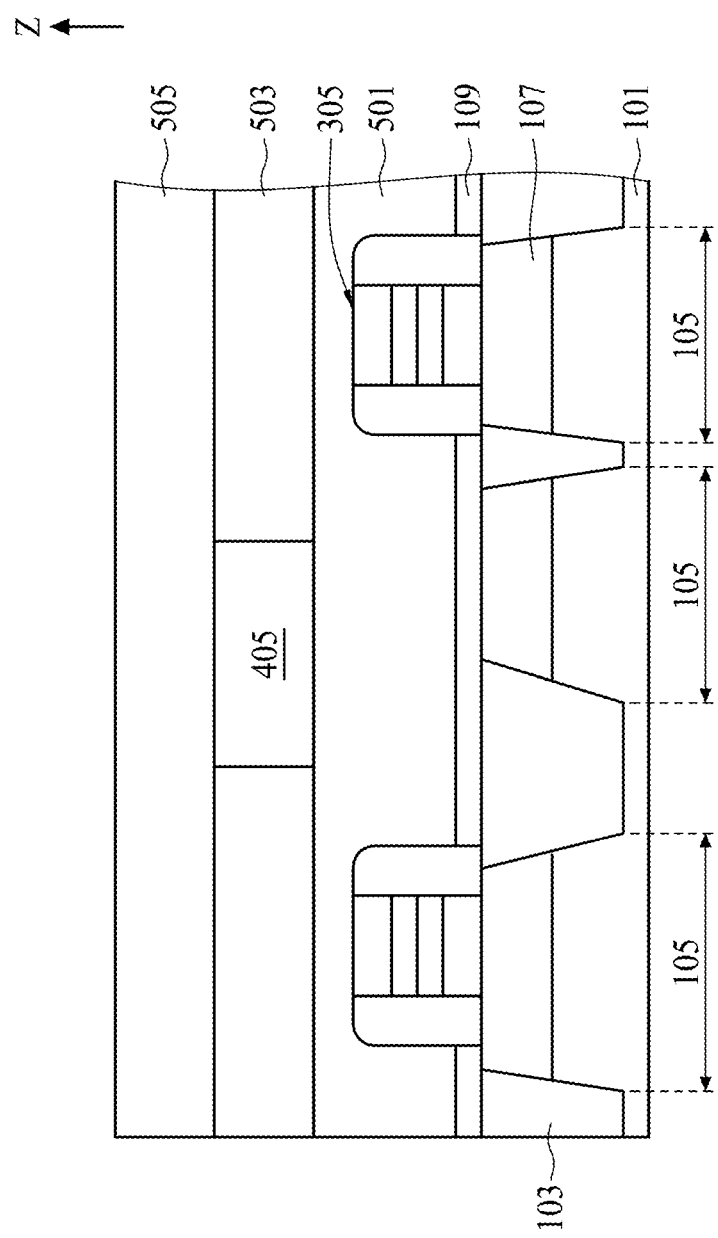

FIG. 67 illustrates, in a schematic top-view diagram, part of the flow of fabricating the semiconductor device in accordance with one embodiment of the present disclosure. FIGS. 68 to 70 illustrate, in schematic cross-sectional diagrams, part of the flow of fabricating the semiconductor device in accordance with FIG. 67.

Figure 71:
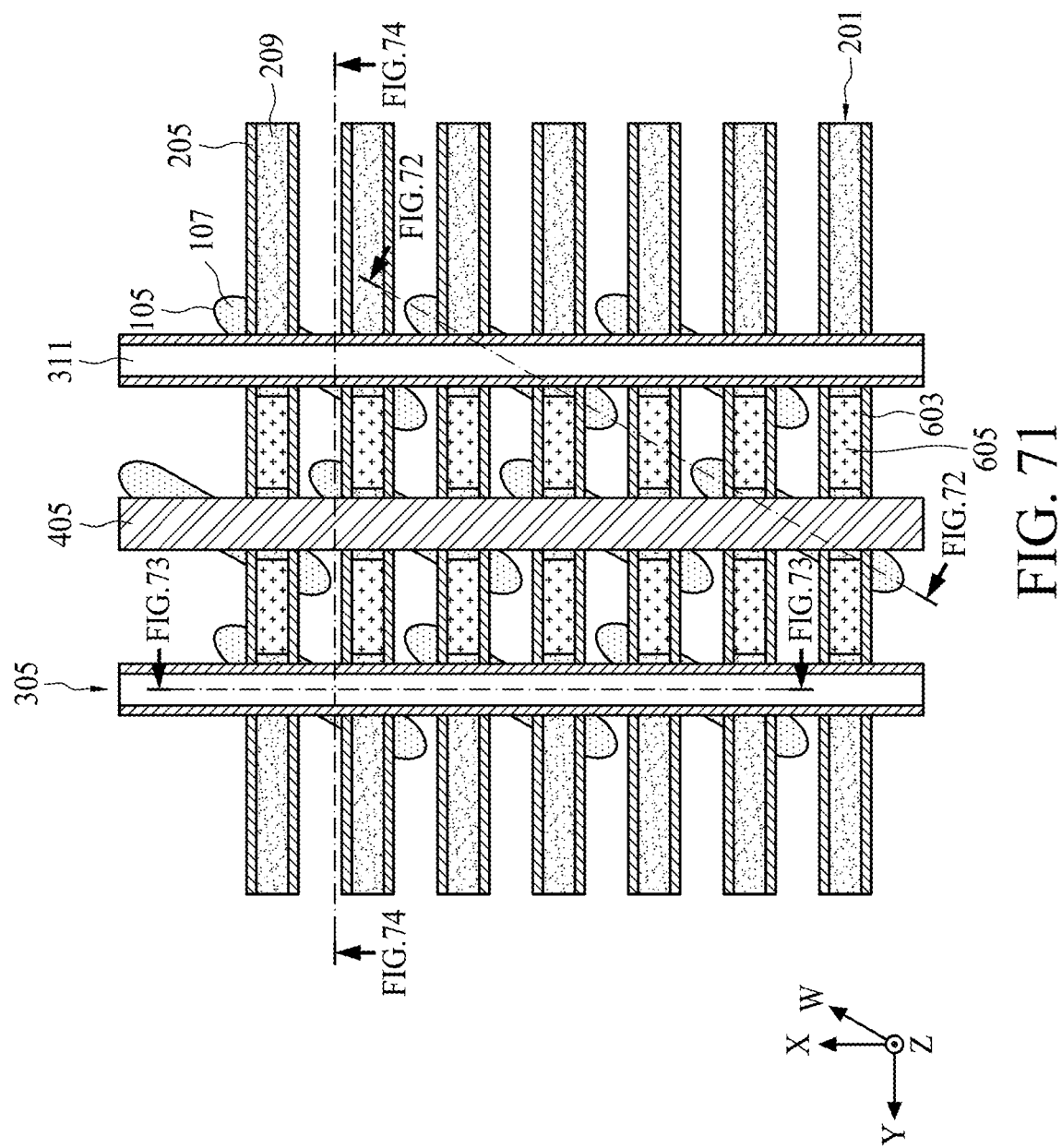
FIG. 71 illustrates, in a schematic top-view diagram, part of the flow of fabricating the semiconductor device in accordance with one embodiment of the present disclosure.
Figure 72:
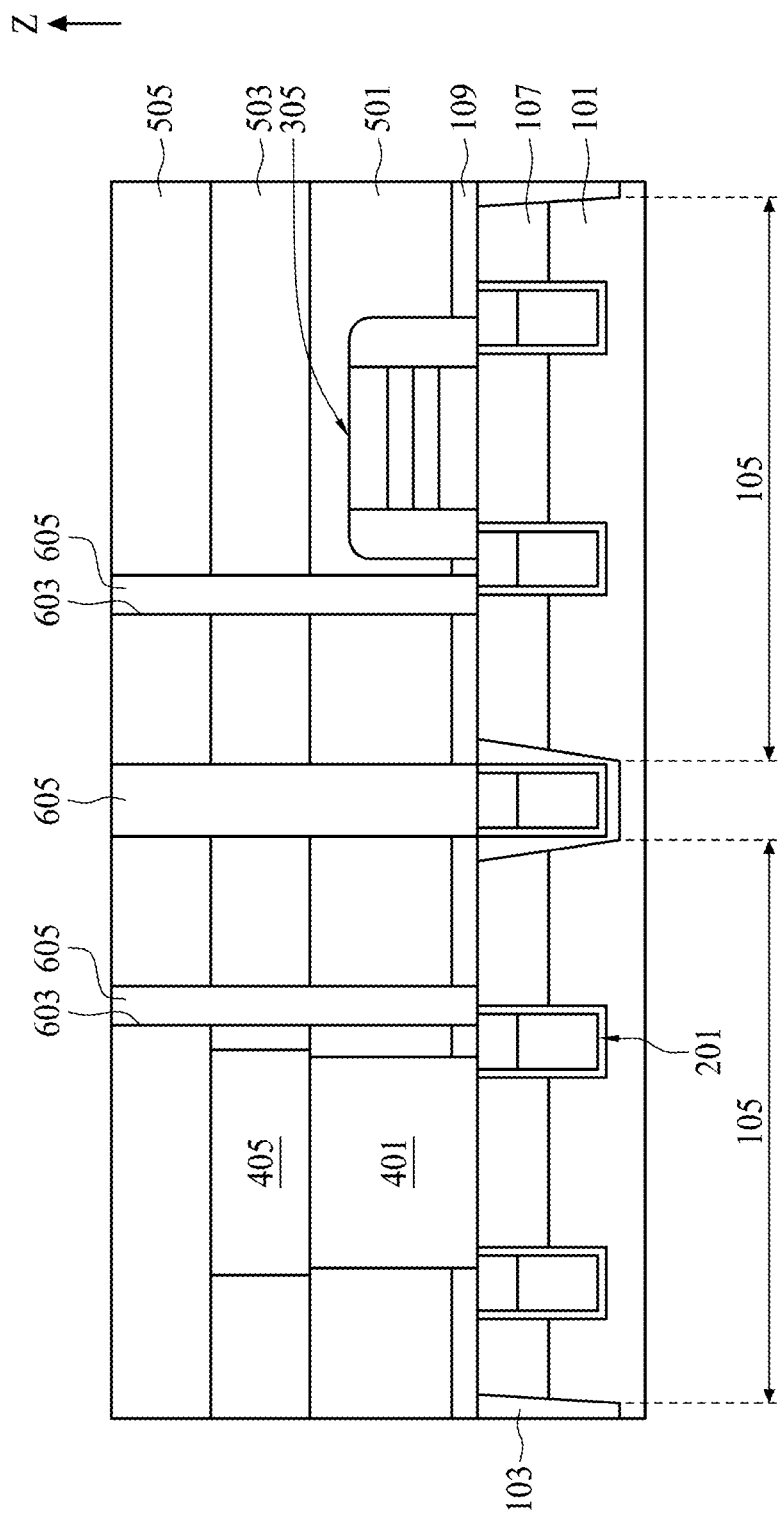
FIGS. 72 to 74 illustrate, in schematic cross-sectional diagrams, part of the flow of fabricating the semiconductor device in accordance with FIG. 71.
Figure 73:
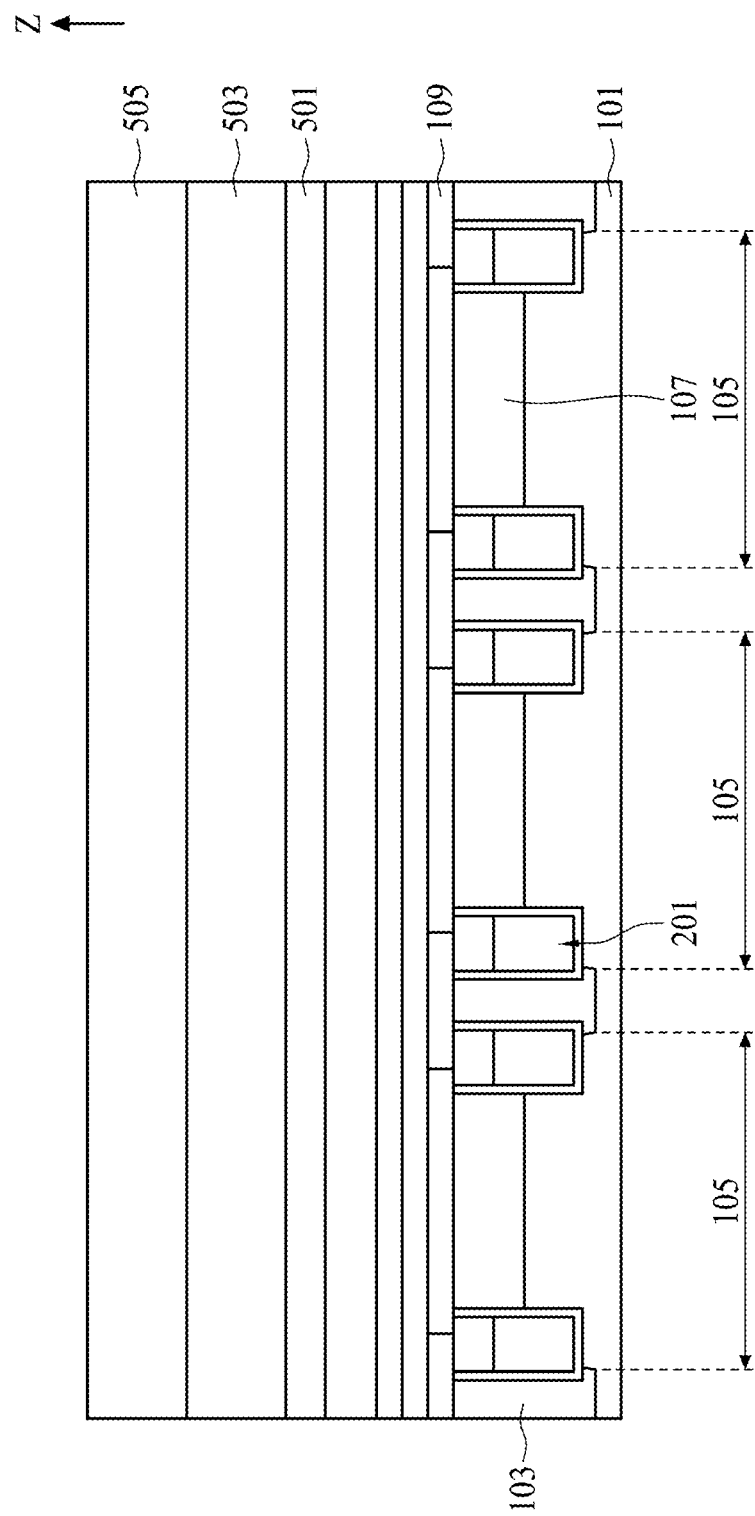
Figure 74:
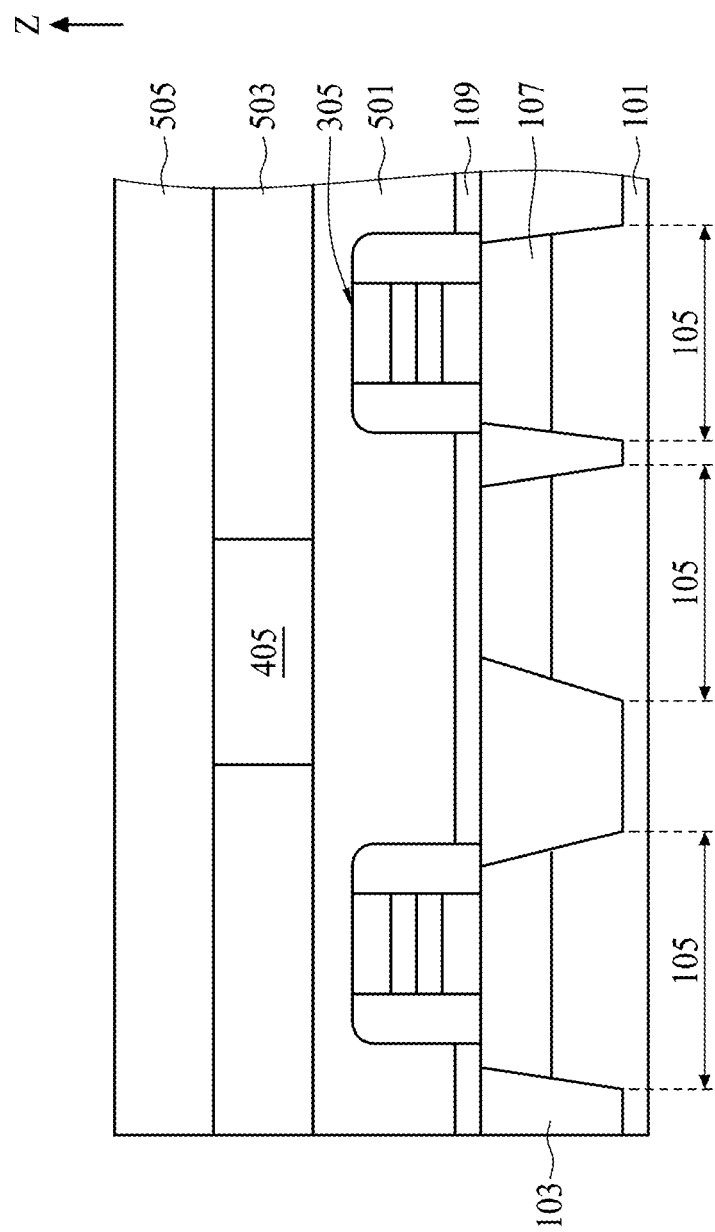

FIG. 71 illustrates, in a schematic top-view diagram, part of the flow of fabricating the semiconductor device in accordance with one embodiment of the present disclosure. FIGS. 72 to 74 illustrate, in schematic cross-sectional diagrams, part of the flow of fabricating the semiconductor device in accordance with FIG. 71.

Figure 75:
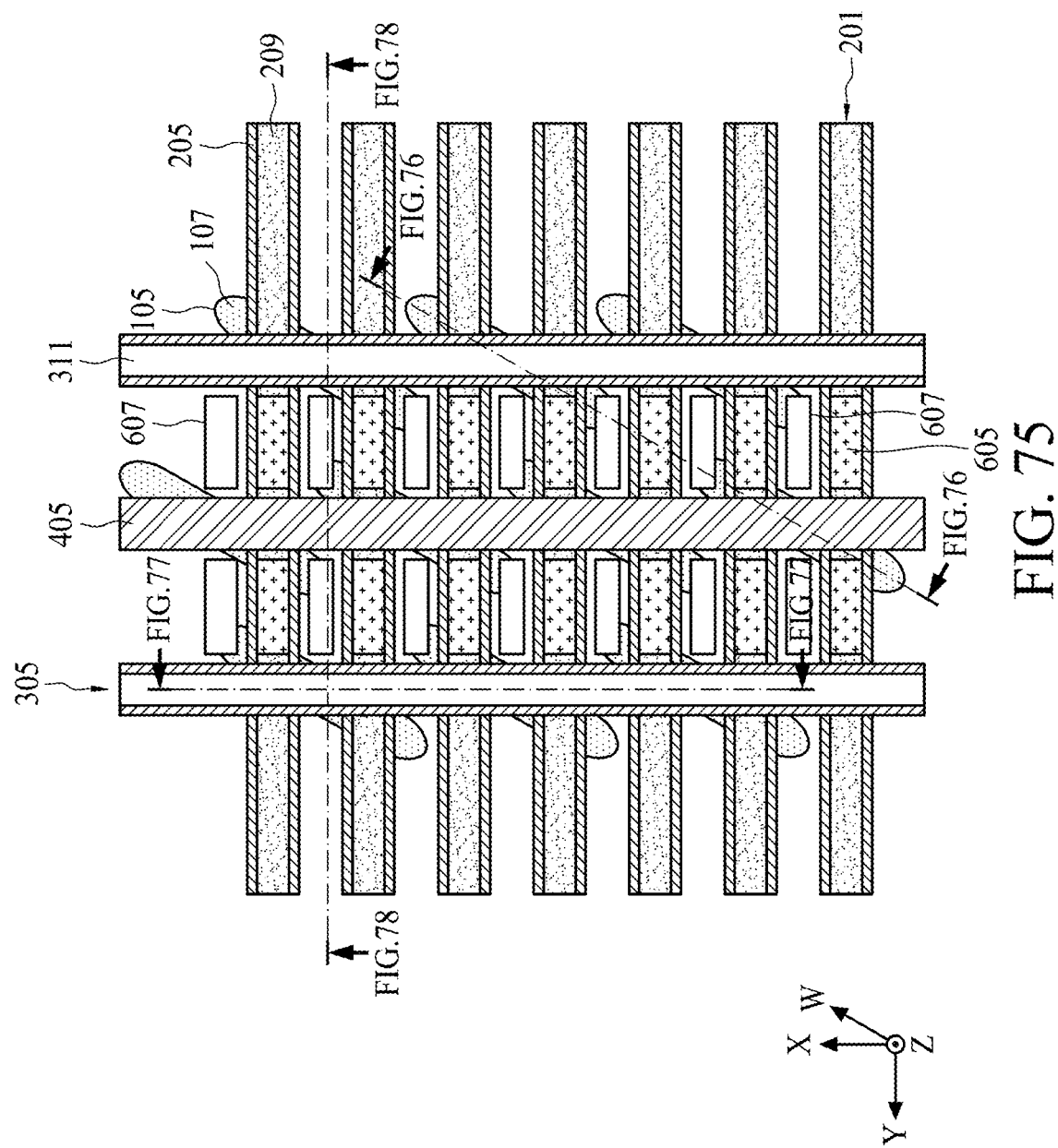
FIG. 75 illustrates, in a schematic top-view diagram, part of the flow of fabricating the semiconductor device in accordance with one embodiment of the present disclosure.
Figure 76:
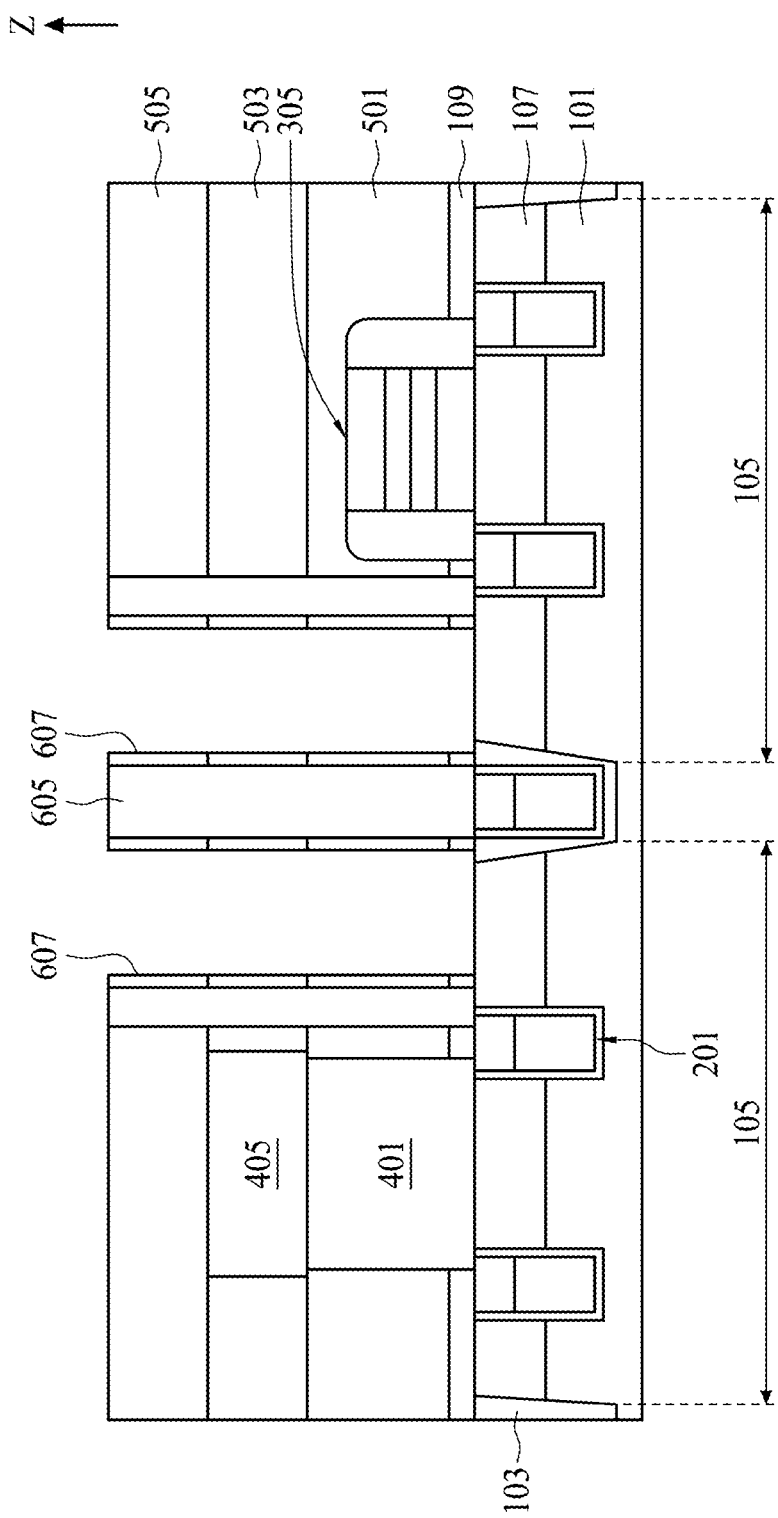
FIGS. 76 to 78 illustrate, in schematic cross-sectional diagrams, part of the flow of fabricating the semiconductor device in accordance with FIG. 75.
Figure 77:
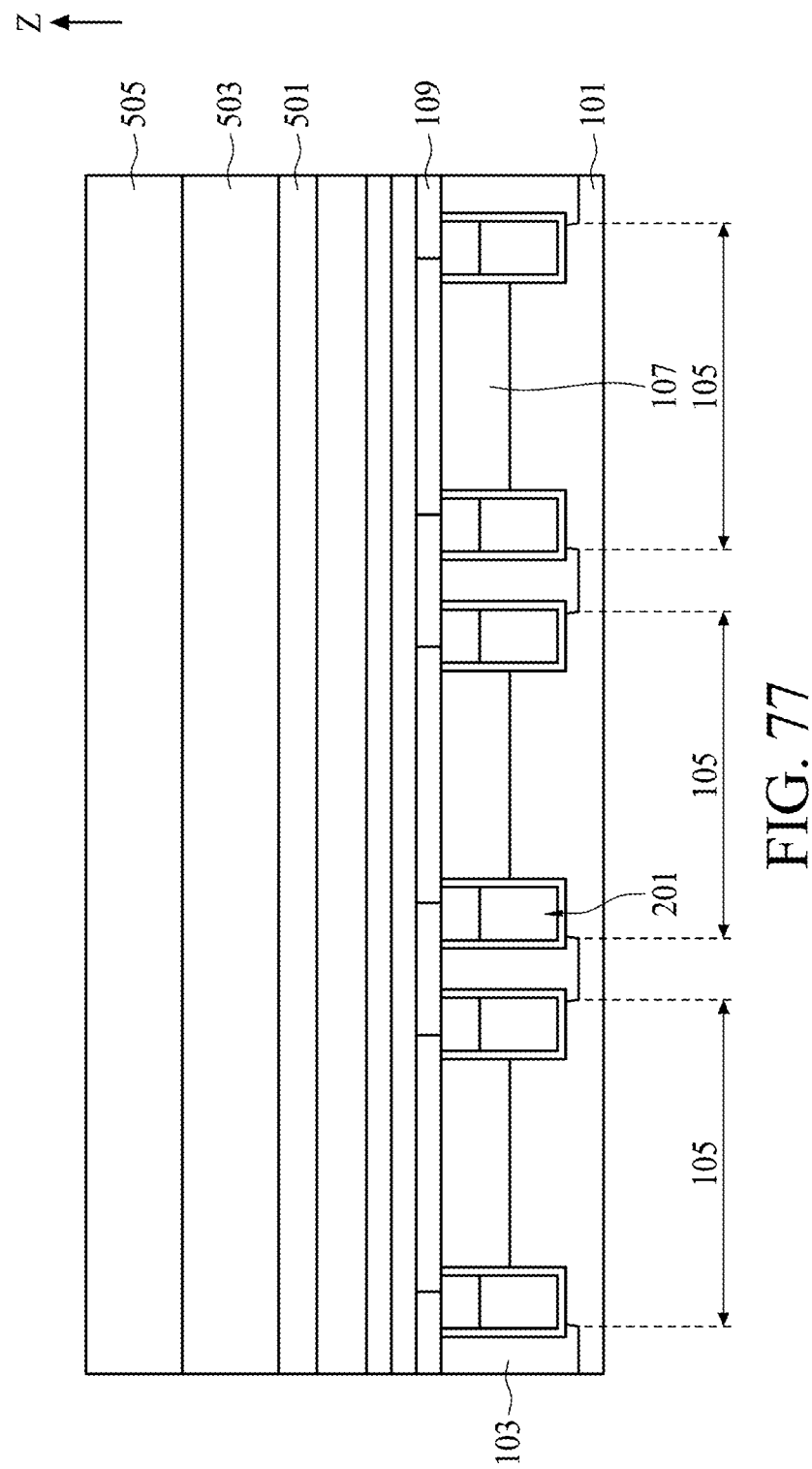
Figure 78:
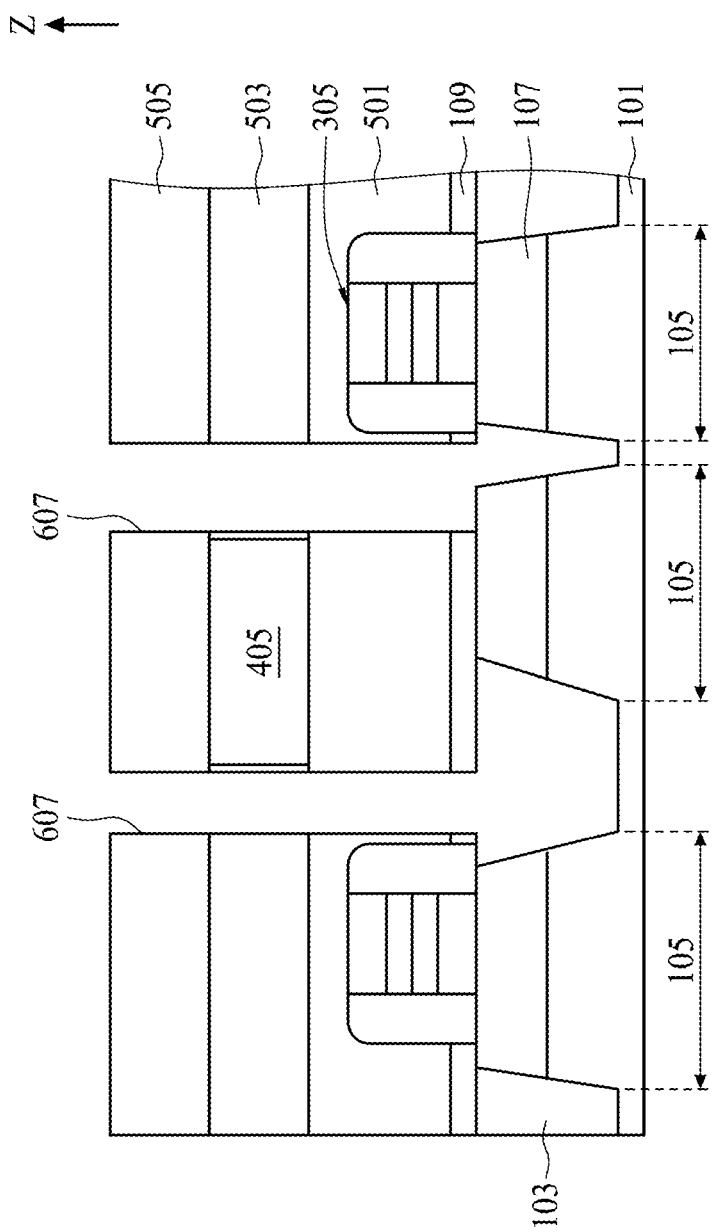

FIG. 75 illustrates, in a schematic top-view diagram, part of the flow of fabricating the semiconductor device in accordance with one embodiment of the present disclosure. FIGS. 76 to 78 illustrate, in schematic cross-sectional diagrams, part of the flow of fabricating the semiconductor device in accordance with FIG. 75.

Figure 79:
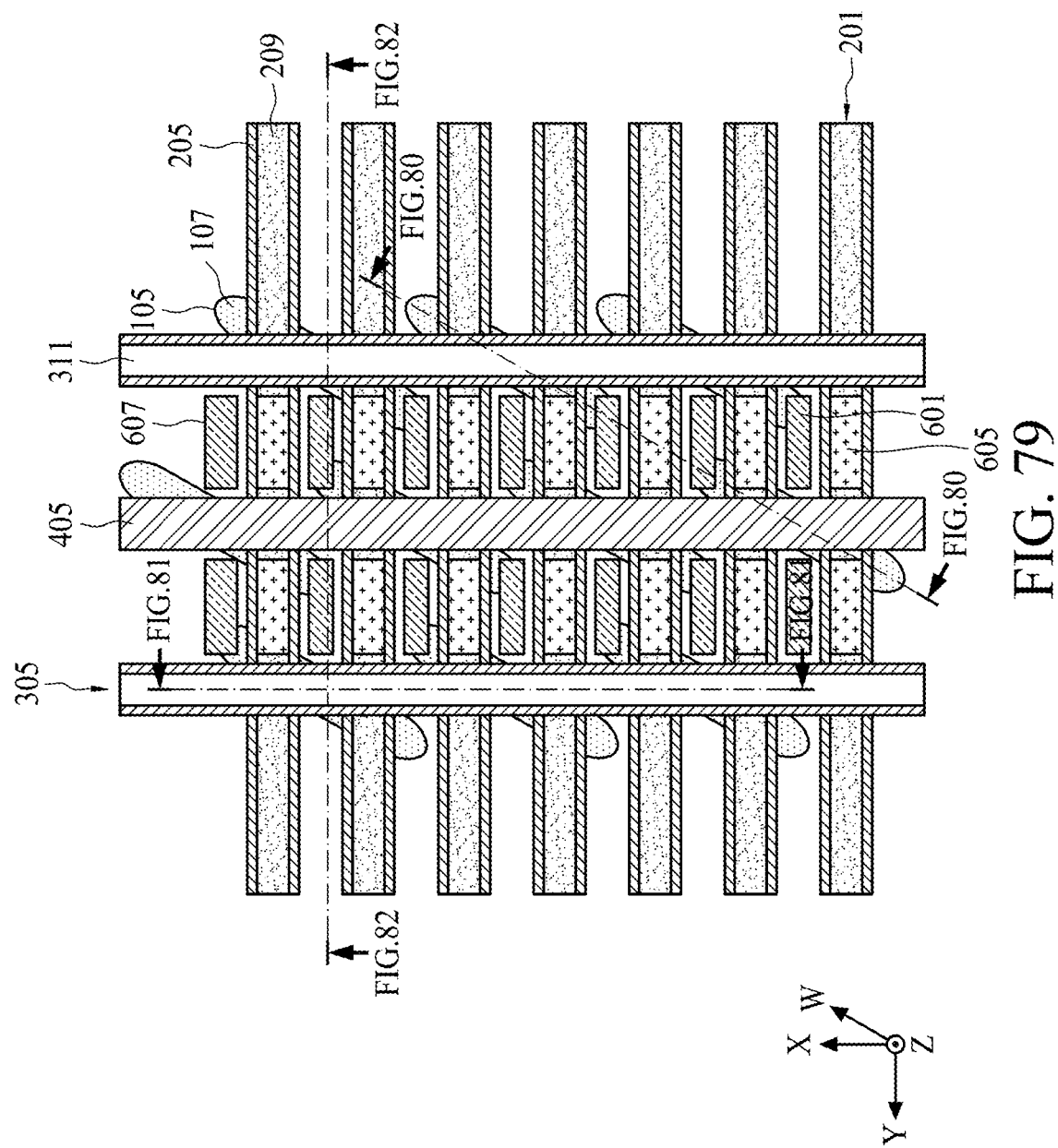
FIG. 79 illustrates, in a schematic top-view diagram, part of the flow of fabricating the semiconductor device in accordance with one embodiment of the present disclosure.
Figure 80:
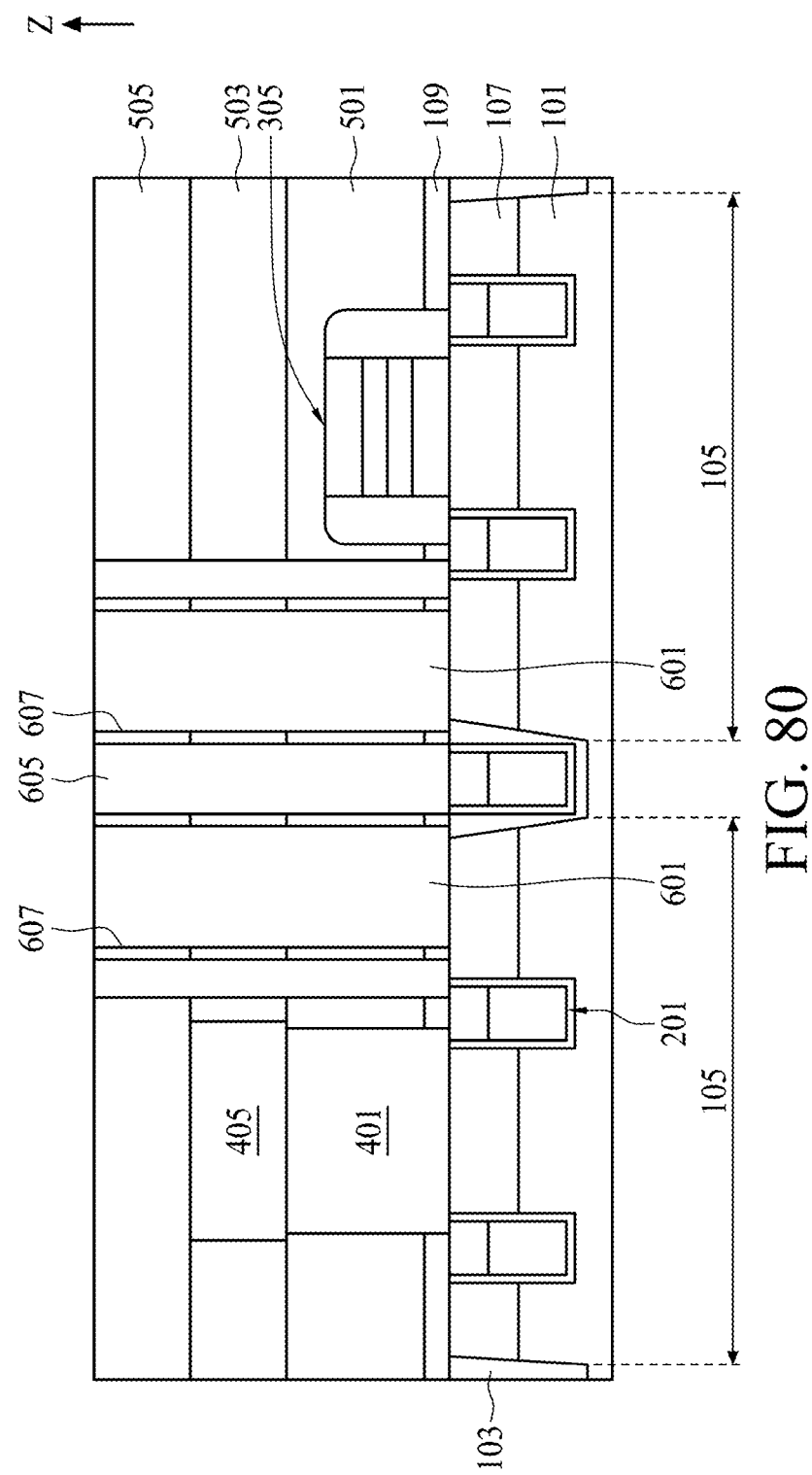
FIGS. 80 to 82 illustrate, in schematic cross-sectional diagrams, part of the flow of fabricating the semiconductor device in accordance with FIG. 79.
Figure 81:
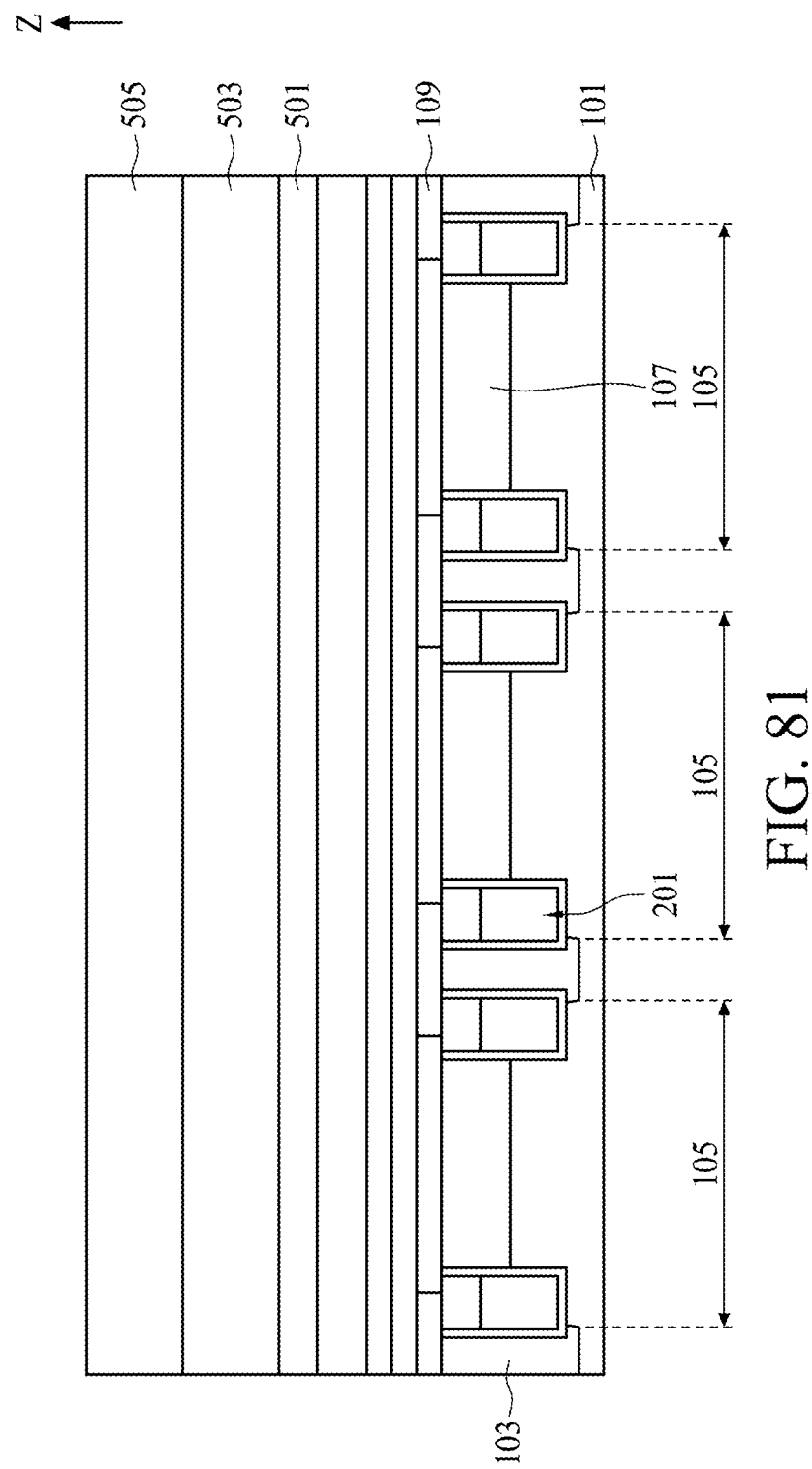
Figure 82:
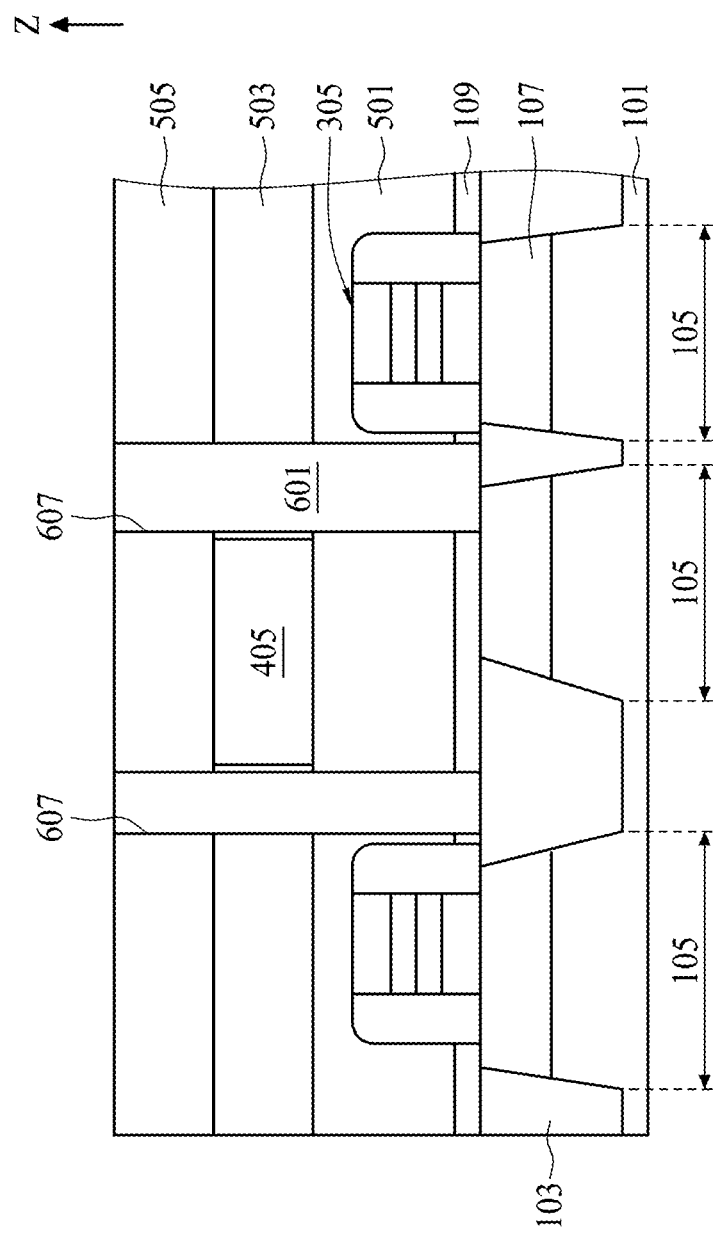

FIG. 79 illustrates, in a schematic top-view diagram, part of the flow of fabricating the semiconductor device in accordance with one embodiment of the present disclosure. FIGS. 80 to 82 illustrate, in schematic cross-sectional diagrams, part of the flow of fabricating the semiconductor device in accordance with FIG. 79.

With reference to FIG. 1 and FIGS. 67 to 82, at step S31, a plurality of conductive plugs 601 may be formed above the substrate 101. With reference to FIGS. 67 to 70, in the embodiment depicted, a third insulating film 505 may be formed, by a deposition process, on the second insulating film 503. A planarization process, such as chemical mechanical polishing, may be optionally performed to provide a substantially flat surface for subsequent processing steps. The third insulating film 505 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. After the planarization process, a photolithography process may be performed to pattern the third insulating film 505 to define positions of a plurality of first openings 603. An etch process, such as an anisotropic dry etch process, may be performed after the photolithography process to form the plurality of first openings 603 in the third insulating film 505, the second insulating film 503, the first insulating film 501, and the buffer layer 109. The positions of the plurality of first openings 603 may be between the plurality of first bit lines 305 and the plurality of second bit lines 405 and respectively correspondingly overlap portions of the s plurality of word lines 201 as viewed from above. For simplicity, the isolation layer 103, the buffer layer 109, the first insulating film 501, the second insulating film 503, and the third insulating film 505 are not shown in FIG. 67. Alternatively, in another embodiment depicted, the plurality of first openings 603 may penetrate into only the third insulating film 505, the second insulating film 503, and the first insulating film 501.

With reference to FIGS. 71 to 74, in the embodiment depicted, an isolation material having an etch selectivity with respect to the first insulating film 501, the second insulating film 503, the third insulating film 505, and the buffer layer 109 may be deposited into the plurality of first openings 603 by a deposition process. After the deposition process, a planarization process, such as chemical mechanical polishing, may be performed to remove excess material, provide a substantially flat surface for subsequent processing steps, and conformally form a plurality of isolation units 605 disposed between the plurality of first bit lines 305 and the plurality of second bit lines 405 and respectively correspondingly overlap portions of the plurality of word lines 201 as viewed from above. The isolation material may include, for example, quaternary silicon boron carbon nitride material, quaternary silicon oxygen carbon nitride material, ternary silicon carbon nitride material, or silicon nitride. For simplicity, the isolation layer 103, the buffer layer 109, the first insulating film 501, the second insulating film 503, and the third insulating film 505 are not shown in FIG. 71.

With reference to FIGS. 75 to 78, in the embodiment depicted, a photolithography process may be performed to pattern the third insulating film 505 to define positions of the plurality of conductive plugs 601. An etch process, such as an anisotropic dry etch process, may be performed after the photolithography process to form a plurality of plug openings 607 in the third insulating film 505, the second insulating film 503, the first insulating film 501 and the buffer layer 109. The etch process has a high etch rate on the third insulating film 505, the second insulating film 503, the first insulating film 501 and the buffer layer 109 compared to the plurality of isolation units 605 formed of the isolation material. Positions of the plurality of plug openings 607 may be between the plurality of first bit lines 305, the plurality of second bit lines 405, and areas which do not overlap the plurality of word lines 201 as viewed from above. The positions of the plurality of plug openings 607 may be respectively correspondingly between the plurality of isolation units 605. Ends of the plurality of source/drain regions 107 may be exposed through the plurality of plug openings 607. For simplicity, the isolation layer 103, the buffer layer 109, the first insulating film 501, the second insulating film 503, and the third insulating film 505 are not shown in FIG. 75. Alternatively, in another embodiment depicted, sidewalls of the plurality of spacers 313 may be exposed through the plurality of plug openings 607.

With reference to FIGS. 79 to 82, in the embodiment depicted, a conductive material, for example, copper, nickel, cobalt, aluminum, or tungsten, may be deposited into the plurality of plug openings 607 by a metallization process. After the metallization process, a planarization process, such as chemical mechanical polishing, may be performed to remove excess material, provide a substantially flat surface for subsequent processing steps, and conformally form the plurality of conductive plugs 601. The plurality of conductive plugs 601 may be respectively correspondingly electrically connected to the ends of the plurality of source/drain regions 107. For simplicity, the isolation layer 103, the buffer layer 109, the first insulating film 501, the second insulating film 503, and the third insulating film 505 are not shown in FIG. 79.

Figure 83:
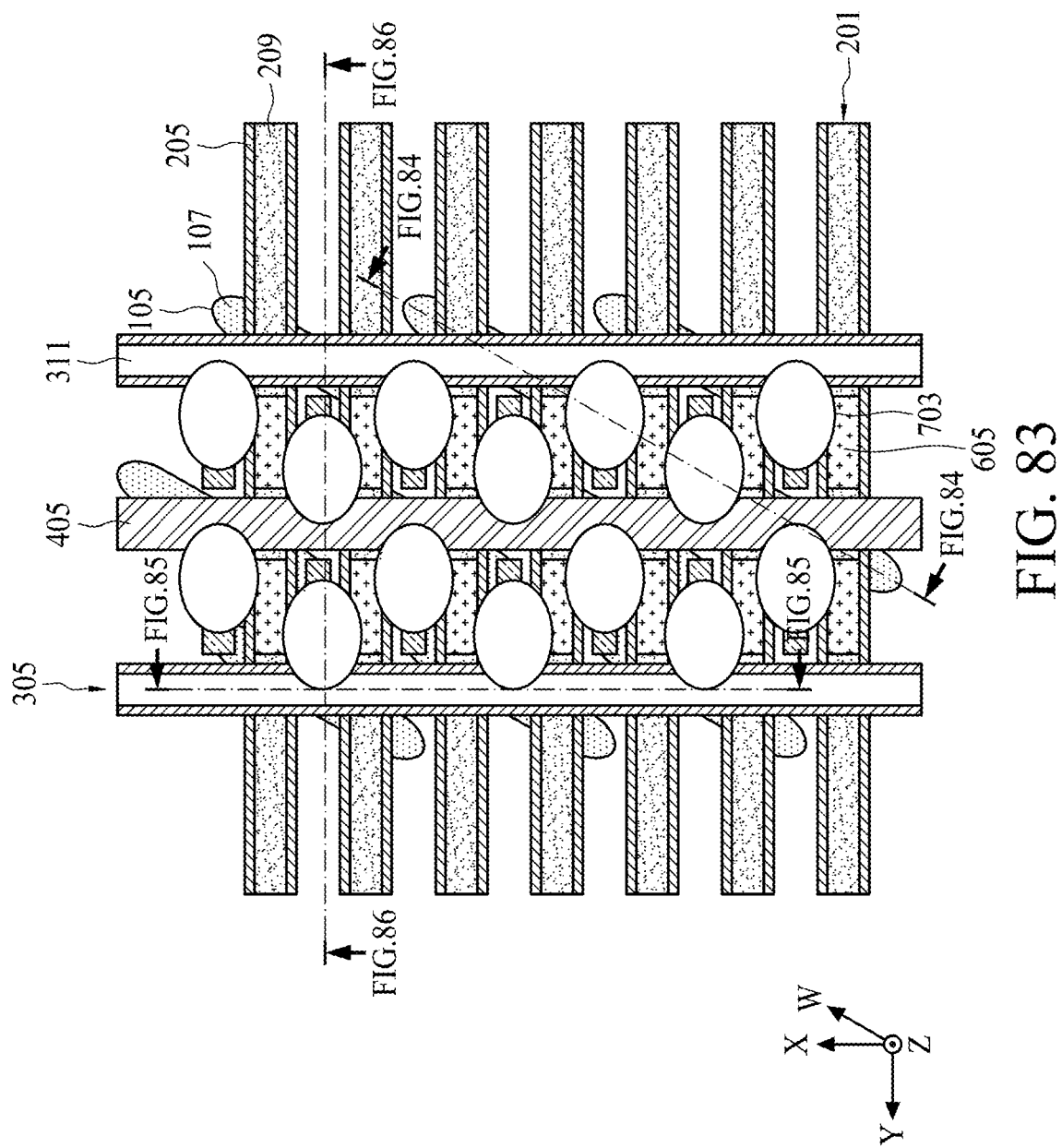
FIG. 83 illustrates, in a schematic top-view diagram, part of the flow of fabricating the semiconductor device in accordance with one embodiment of the present disclosure.
Figure 84:
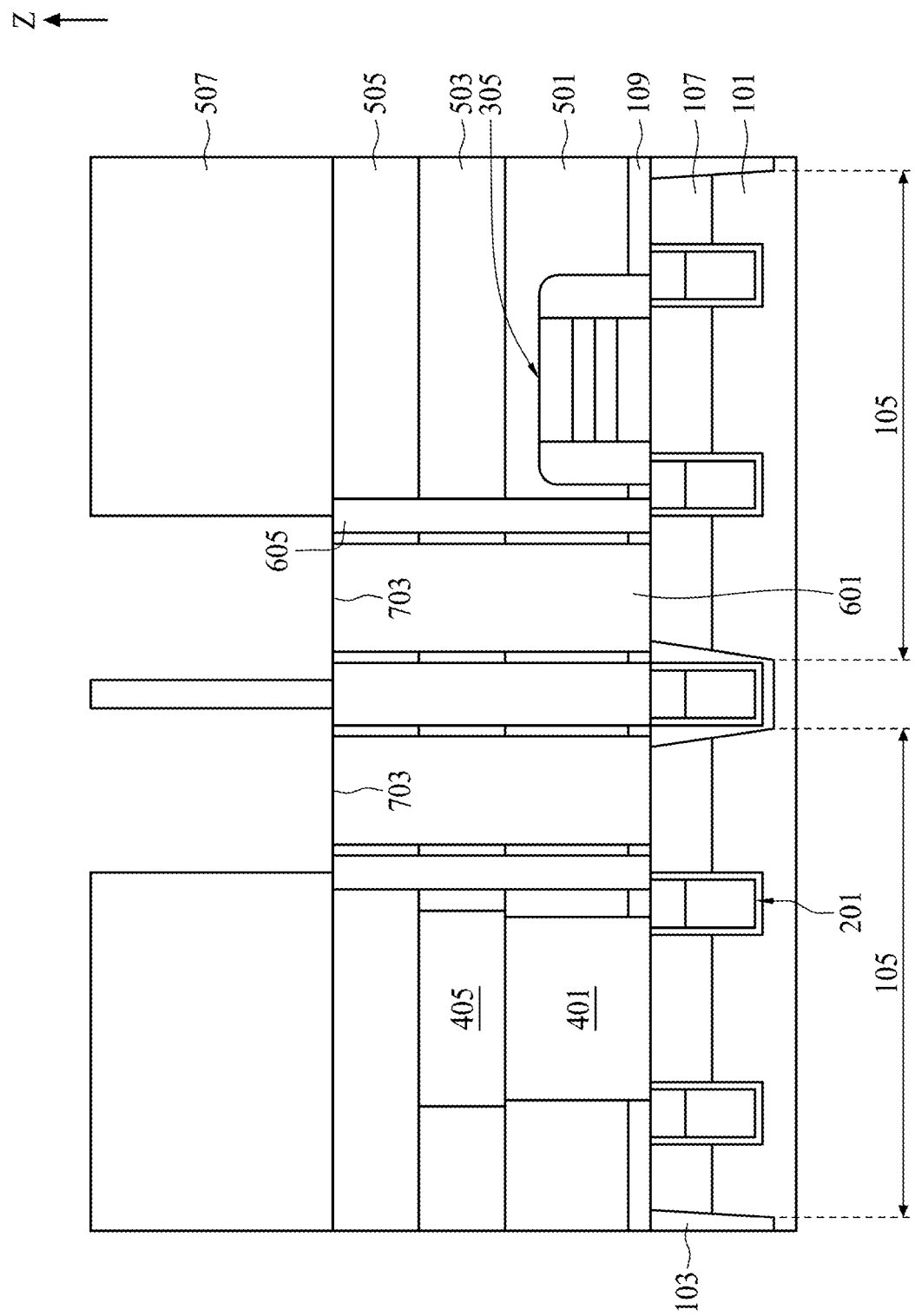
FIGS. 84 to 86 illustrate, in schematic cross-sectional diagrams, part of the flow of fabricating the semiconductor device in accordance with FIG. 83.
Figure 85:
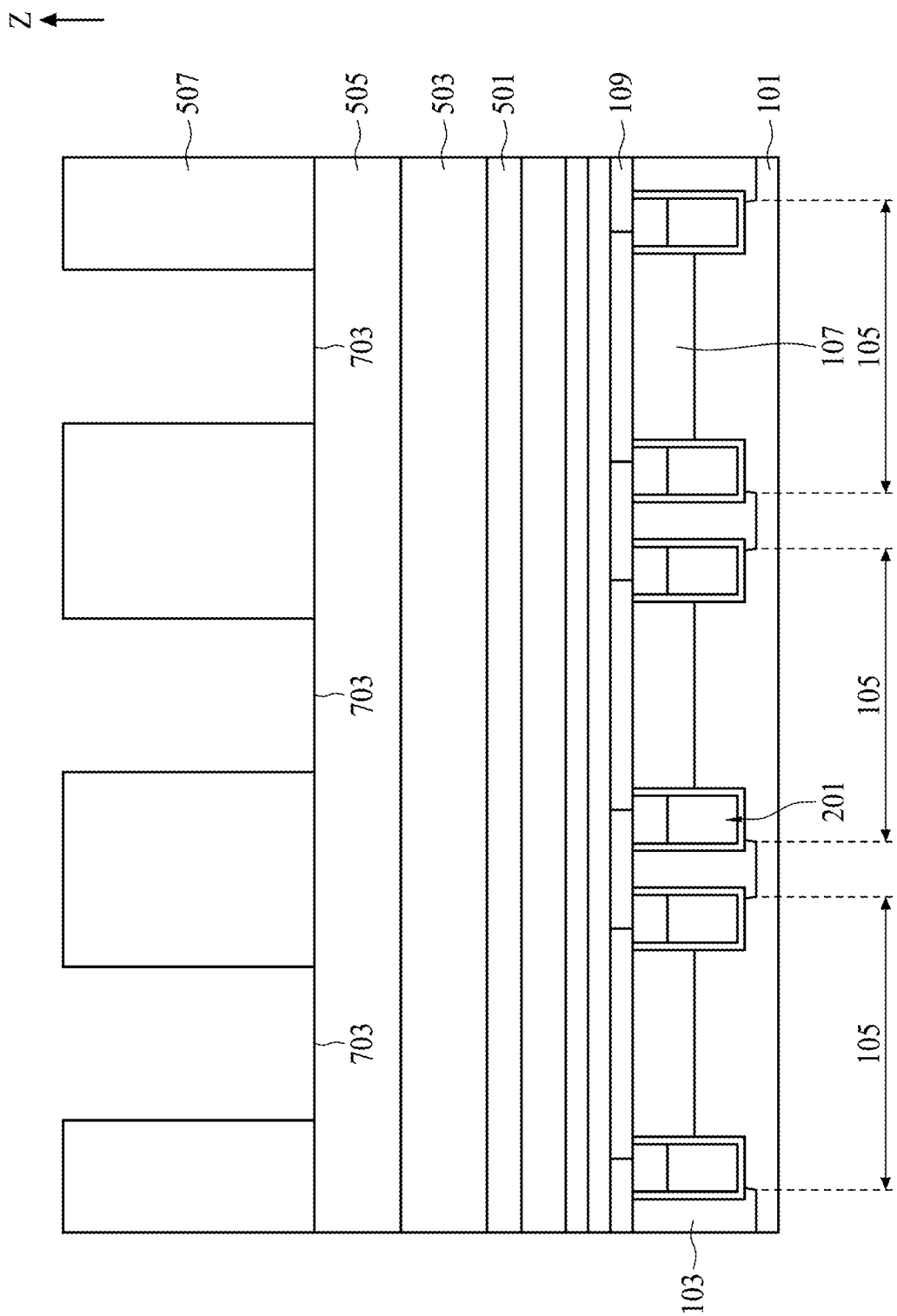
Figure 86:
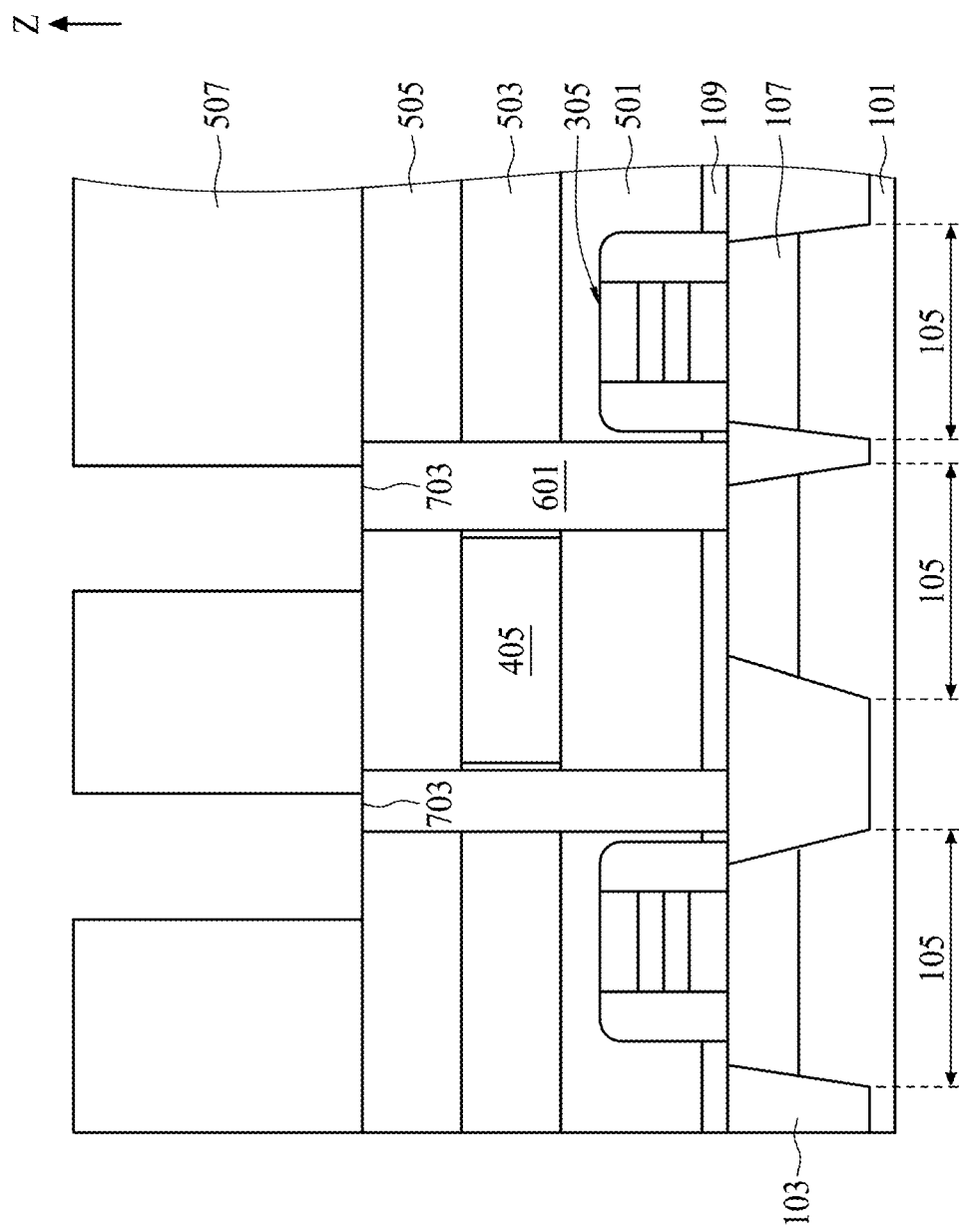

FIG. 83 illustrates, in a schematic top-view diagram, part of the flow of fabricating the semiconductor device in accordance with one embodiment of the present disclosure. FIGS. 84 to 86 illustrate, in schematic cross-sectional diagrams, part of the flow of fabricating the semiconductor device in accordance with FIG. 83.

Figure 87:
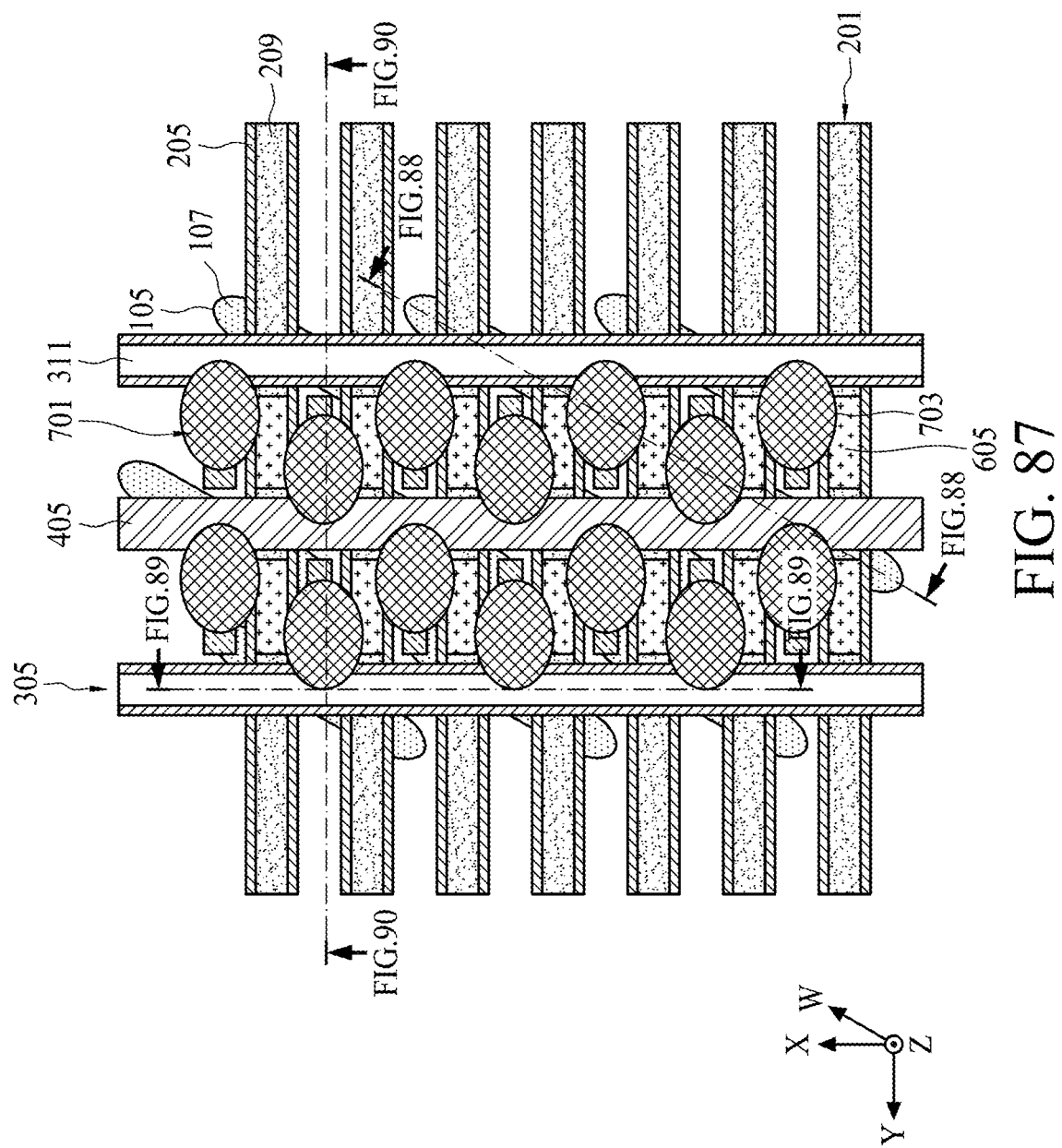
FIG. 87 illustrates, in a schematic top-view diagram, part of the flow of fabricating the semiconductor device in accordance with one embodiment of the present disclosure.
Figure 88:
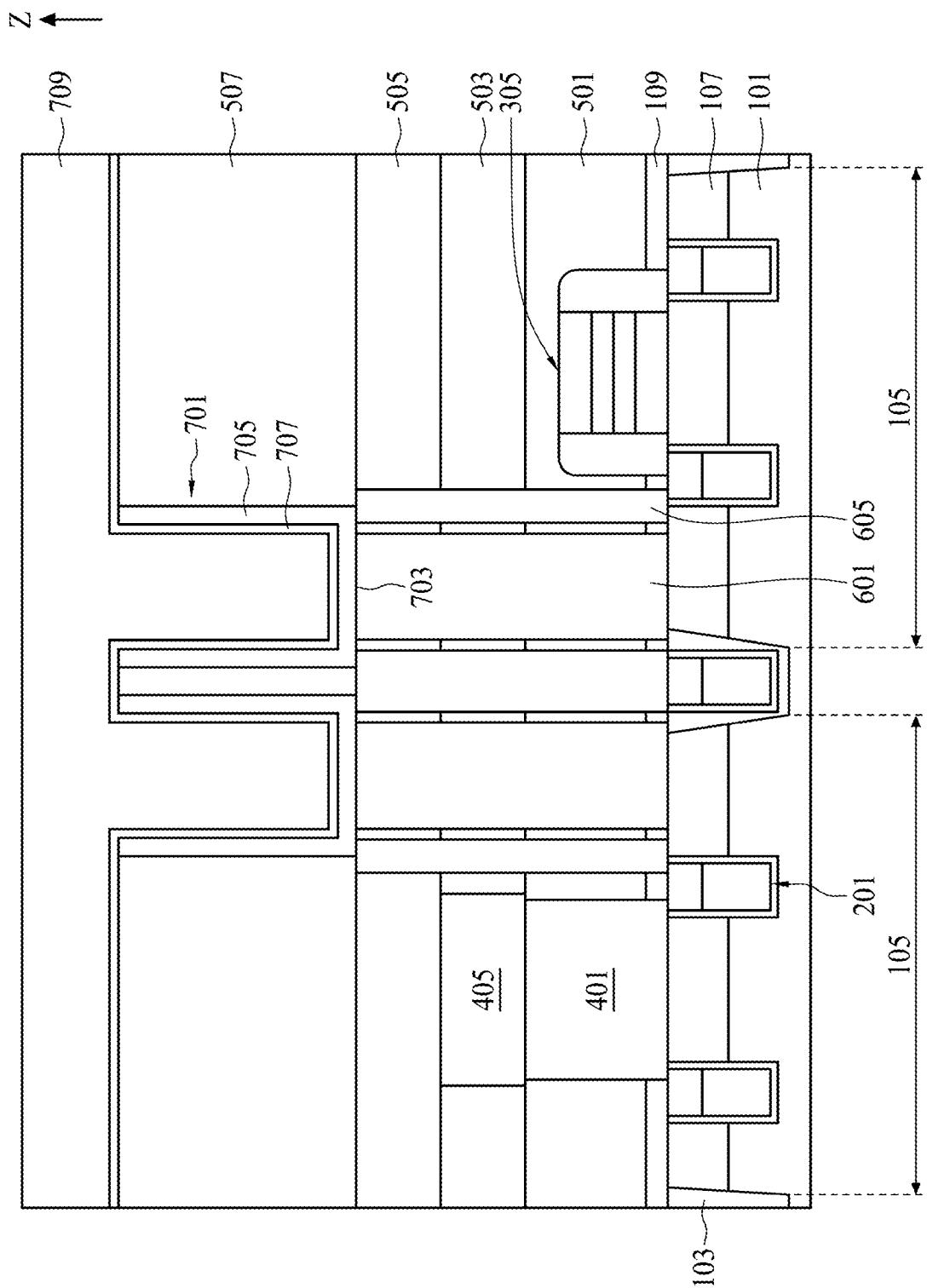
FIGS. 88 to 90 illustrate, in schematic cross-sectional diagrams, part of the flow of fabricating the semiconductor device in accordance with FIG. 87.
Figure 89:
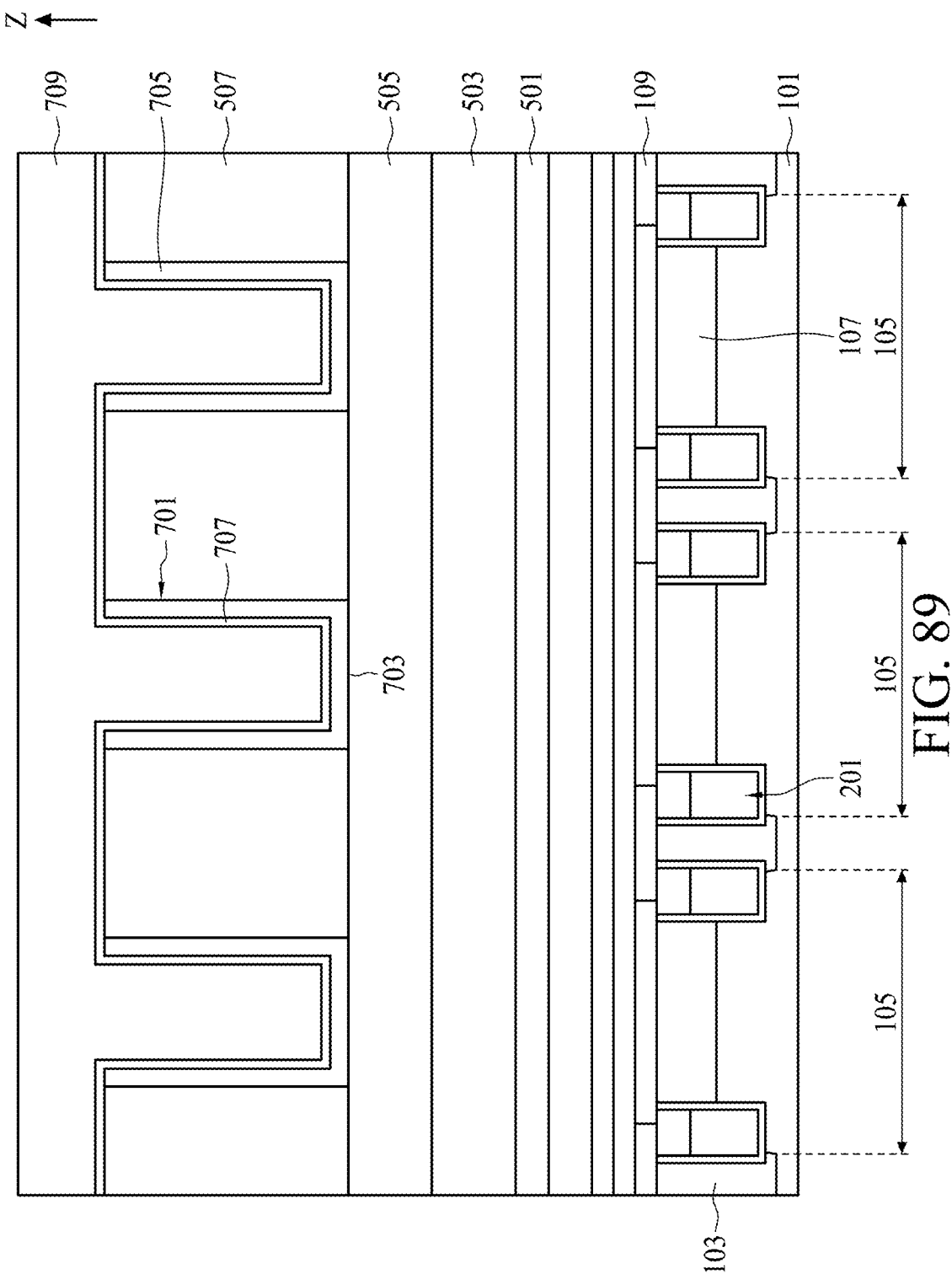
Figure 90:
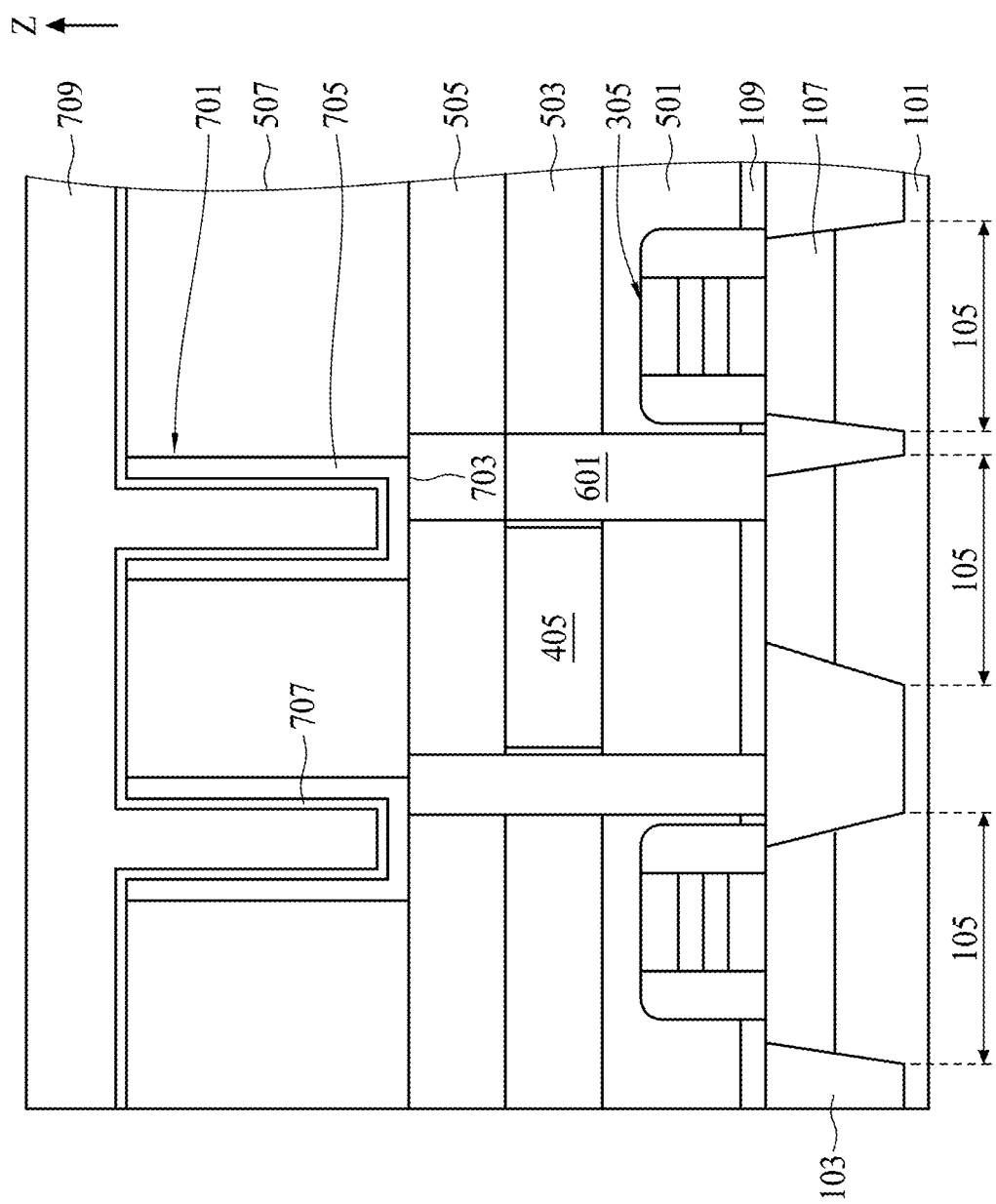

FIG. 87 illustrates, in a schematic top-view diagram, part of the flow of fabricating the semiconductor device in accordance with one embodiment of the present disclosure. FIGS. 88 to 90 illustrate, in schematic cross-sectional diagrams, part of the flow of fabricating the semiconductor device in accordance with FIG. 87.

With reference to FIG. 1 and FIGS. 83 to 90, at step S33, a plurality of capacitor structures 701 may be formed above the third insulating film 505. With reference to FIGS. 83 to 86, in the embodiment depicted, a fourth insulating film 507 may be formed, by a deposition process, on the third insulating film 505. A planarization process, such as chemical mechanical polishing, may be optionally performed to provide a substantially flat surface for subsequent processing steps. The fourth insulating film 507 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. After the planarization process, a photolithography process may be performed to pattern the fourth insulating film 507 to define positions of the plurality of capacitor structures 701. An etch process, such as an anisotropic dry etch process, may be performed after the photolithography process to form a plurality of capacitor openings 703 in the fourth insulating film 507. Positions of the plurality of first openings 603 may respectively correspondingly partially overlap the plurality of conductive plugs 601 as viewed from above; in other words, the plurality of first openings 603 may be respectively correspondingly above the plurality of conductive plugs 601 from a cross-sectional view. For simplicity, the isolation layer 103, the buffer layer 109, the first insulating film 501, the second insulating film 503, the third insulating film 505, and the fourth insulating film 507 are not shown in FIG. 83.

With reference to FIGS. 87 to 90, a plurality of bottom capacitor electrodes 705 may be respectively correspondingly formed to conformally cover inner surfaces of the plurality of capacitor openings 703. The plurality of bottom capacitor electrodes 705 may be respectively correspondingly electrically connected to the plurality of conductive plugs 601; in other words, the plurality of bottom capacitor electrodes 705 may be respectively correspondingly electrically connected to the ends of the plurality of source/drain regions 107. In the embodiment depicted, the plurality of bottom capacitor electrodes 705 may be formed of, for example, doped polysilicon, metal silicide, aluminum, copper, or tungsten. The metal silicide may be, for example, nickel silicide, platinum silicide, titanium silicide, molybdenum silicide, cobalt silicide, tantalum silicide, tungsten silicide, or the like.

With reference to FIGS. 87 to 90, a capacitor insulating layer 707 may be formed on the plurality of bottom capacitor electrodes 705 in the plurality of capacitor openings 703. The capacitor insulating layer 707 may be a single layer or multiple layers. In the embodiment depicted, the capacitor insulating layer 707 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment depicted, the capacitor insulating layer 707 may be formed of multiple layers consisting of silicon oxide, silicon nitride, and silicon oxide.

With reference to FIGS. 87 to 90, a top capacitor electrode 709 may be respectively correspondingly formed on the capacitor insulating layer 707 in the plurality of capacitor openings 703. The top capacitor electrode 709 may fill the plurality of capacitor openings 703 and cover the capacitor insulating layer 707. The top capacitor electrode 709 may be formed of, for example, doped polysilicon, copper, or aluminum. The plurality of bottom capacitor electrodes 705, the capacitor insulating layer 707, and the top capacitor electrode 709 together form the plurality of capacitor structures 701. For simplicity, the isolation layer 103, the buffer layer 109, the first insulating film 501, the second insulating film 503, the third insulating film 505, the fourth insulating film 507, the capacitor insulating layer 707, and the top capacitor electrode 709 are not shown in FIG. 87.

Figure 91:
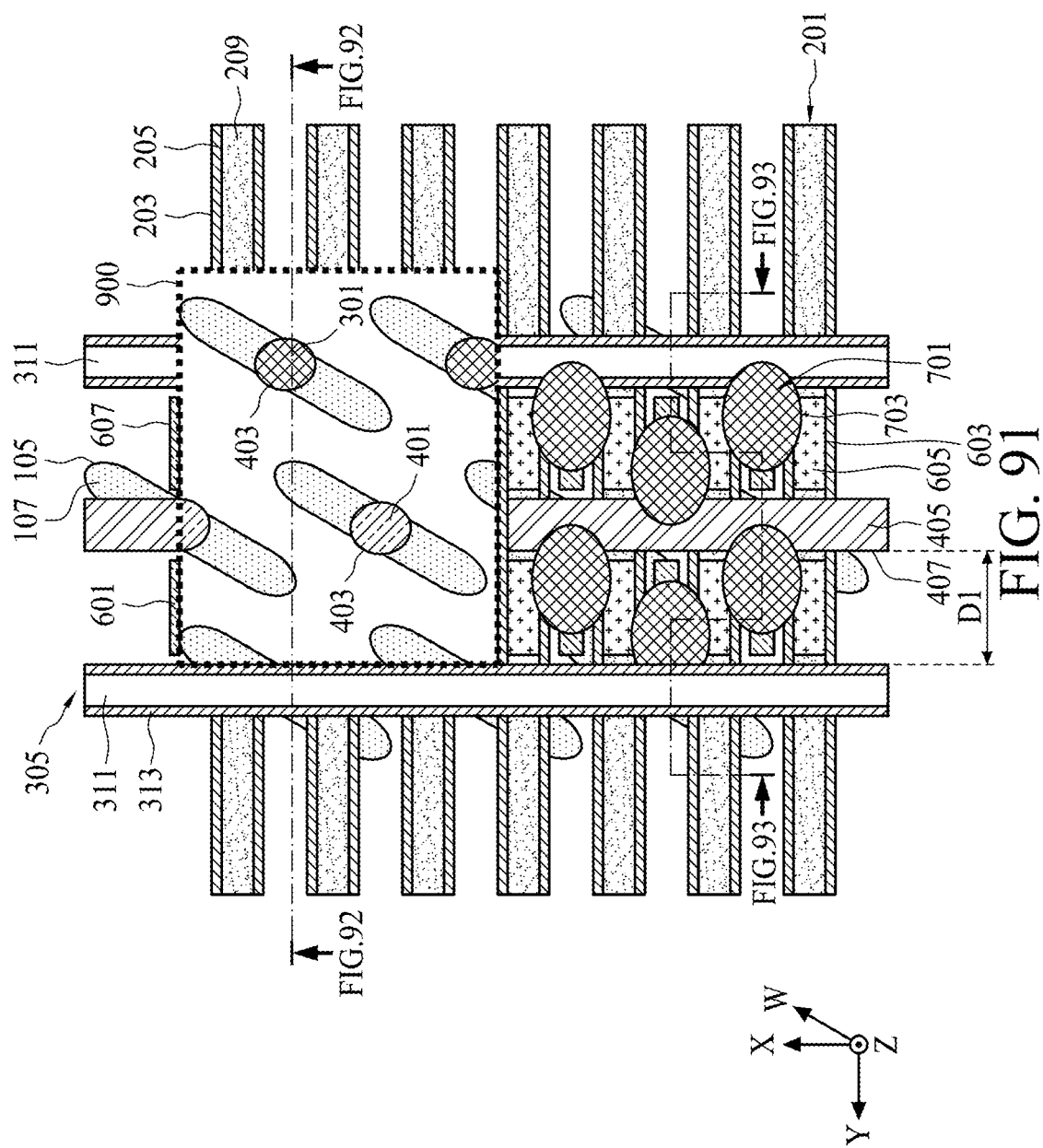
FIG. 91 illustrates, in a schematic top-view diagram, a semiconductor device in accordance with one embodiment of the present disclosure.
Figure 92:
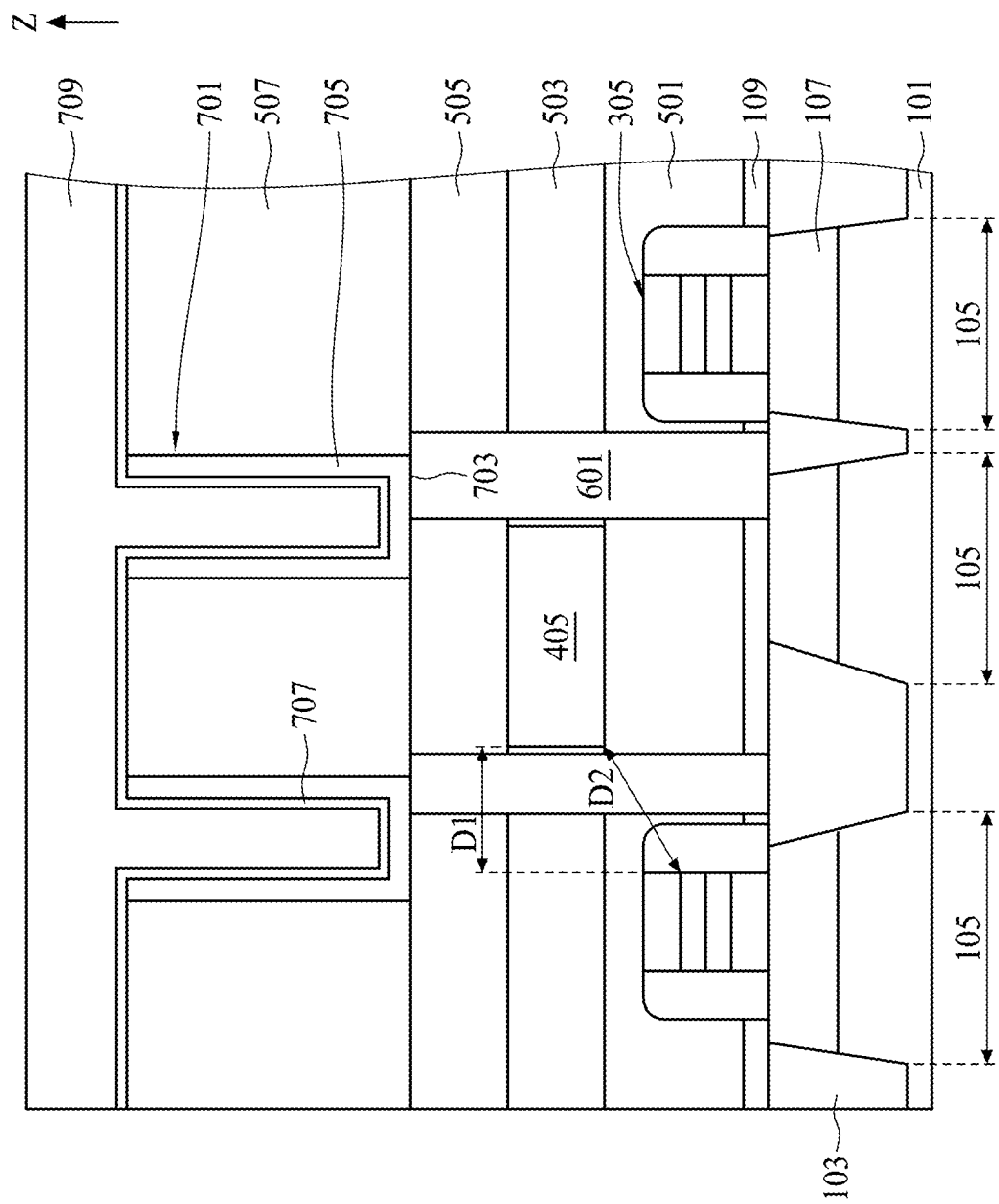
FIGS. 92 and 93 illustrate, in schematic cross-sectional diagrams, the semiconductor devices in accordance with FIG. 91.
Figure 93:
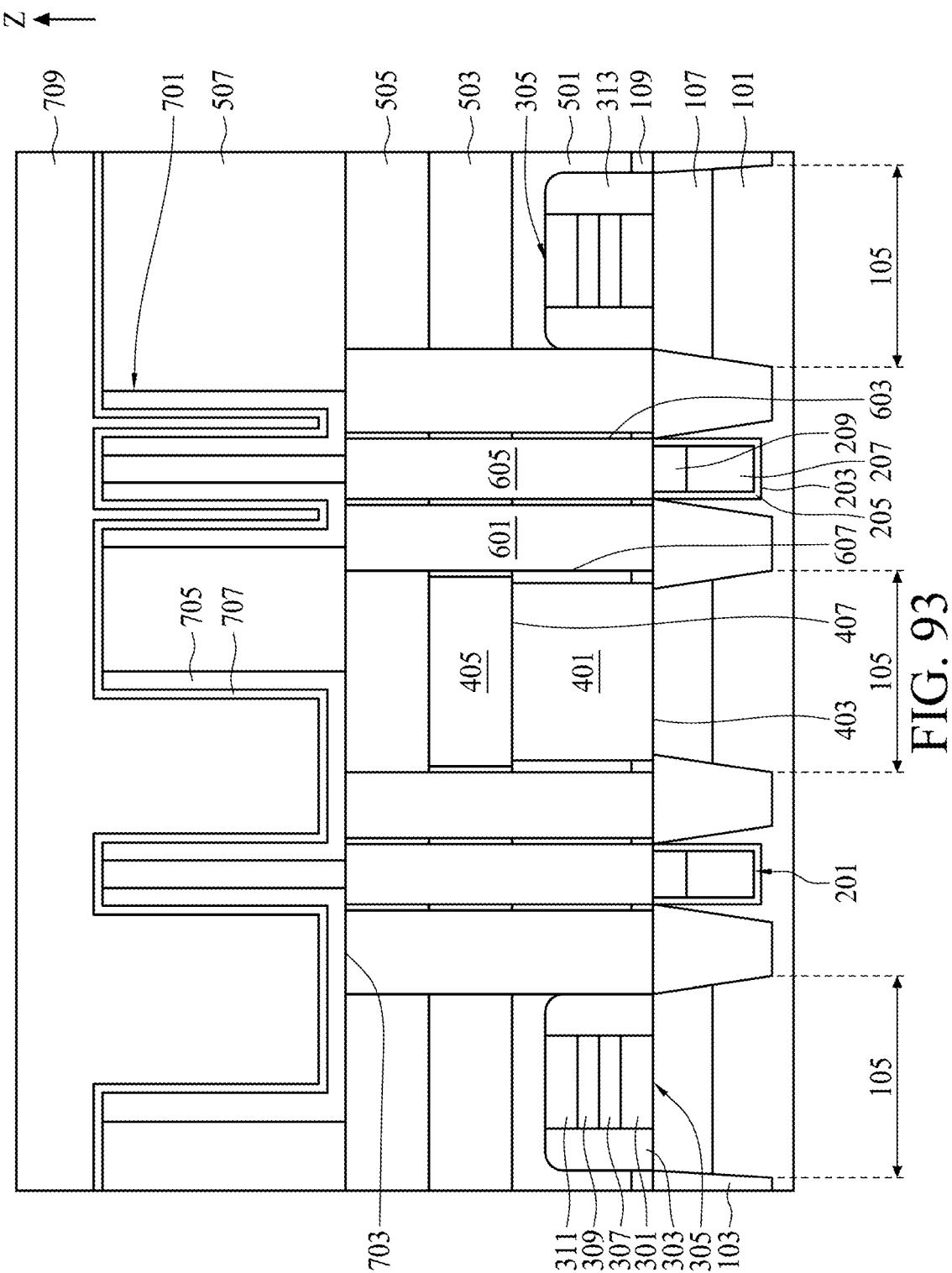

FIG. 91 illustrates, in a schematic top-view diagram, a semiconductor device in accordance with one embodiment of the present disclosure. FIGS. 92 and 93 illustrate, in schematic cross-sectional diagrams, the semiconductor devices in accordance with FIG. 91.

With reference to FIGS. 91 to 93, the semiconductor device includes a substrate 101, an isolation layer 103, a plurality of active regions 105, a plurality of source/drain regions 107, a buffer layer 109, a plurality of word lines 201, a plurality of first bit line contacts 301, a plurality of first bit lines 305, a plurality of spacers 313, a plurality of second bit line contacts 401, a plurality of second bit lines 405, a first insulating film 501, a second insulating film 503, a third insulating film 505, a fourth insulating film 507, a plurality of conductive plugs 601, a plurality of isolation units 605, and a plurality of capacitor structures 701.

For simplicity, the isolation layer 103, the buffer layer 109, the first insulating film 501, the second insulating film 503, the third insulating film 505, the fourth insulating film 507, the capacitor insulating layer 707, and the top capacitor electrode 709 are not shown in FIG. 91. In addition, in an area 900, the plurality of word lines 201, the plurality of first bit lines 305, the plurality of spacers 313, the plurality of second bit lines 405, the plurality of conductive plugs 601, the plurality of isolation units 605, and the plurality of capacitor structures 701 are not shown, in order to clearly illustrate positions of the plurality of active regions 105, the plurality of source/drain regions 107, the plurality of first bit line contacts 301, and the plurality of second bit line contacts 401.

With reference to FIGS. 91 to 93, the substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or II-VI semiconductor material.

With reference to FIGS. 91 to 93, the isolation layer 103 may be disposed in the substrate 101 and a plurality of active regions 105 of the substrate 101 may be defined by the isolation layer 103. The isolation layer 103 may be formed of an insulating material such as silicon oxide, silicon nitride, silicon oxynitride, silicon nitride oxide, or fluoride-doped silicate. The plurality of active regions 105 may have bar shapes, which extend in a direction W as viewed from above. The plurality of active regions 105 may be parallel to each other.

With reference to FIGS. 91 to 93, the plurality of source/drain regions 107 may be disposed in the plurality of active regions 105. The plurality of source/drain regions 107 may be doped with phosphorus, arsenic, or antimony and may respectively have a dopant concentration ranging from about 1E17 atoms/cm$^3$ to about 1E19 atoms/cm$^3$.

With reference to FIGS. 91 to 93, the plurality of word lines 201 may be disposed in the substrate 101. Each of the plurality of word lines 201 may include a word line trench 203, a word line insulating layer 205, a word line electrode 207, and a word line capping structure 209. The plurality of word line trenches 203 may be disposed in the substrate 101. The plurality of word line trenches 203 may extend in a direction Y diagonally intersecting the direction W to intersect the plurality of active regions 105. In the embodiment depicted, each of the plurality of active regions 105 may intersect two of the plurality of word line trenches 203.

With reference to FIGS. 91 to 93, the plurality of word line insulating layers 205 may respectively correspondingly cover inner surfaces of the plurality of word line trenches 203. In the embodiment depicted, the plurality of word line insulating layers 205 may be formed of, for example, silicon oxide, silicon nitride, silicon oxynitride, silicon nitride oxide, fluoride-doped silicate, or the like. Alternatively, in another embodiment depicted, the plurality of word line insulating layers 205 may be formed of, for example, barium strontium titanate, lead zirconium titanate, titanium oxide, aluminum oxide, hafnium oxide, yttrium oxide, zirconium oxide, or the like.

With reference to FIGS. 91 to 93, the plurality of word line electrodes 207 may be respectively correspondingly disposed on the plurality of word line insulating layers 205 in the plurality of word line trenches 203. The plurality of word line electrodes 207 may be formed of for example, a conductive material such as doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

With reference to FIGS. 91 to 93, the plurality of word line capping structures 209 may be respectively correspondingly disposed on the plurality of word line electrodes 207 in the plurality of word line trenches 203. The plurality of word line capping structures 209 may respectively correspondingly fill the plurality of word line trenches 203. Top surfaces of the capping structures 209 may be at the same vertical level as a vertical level of a top surface of the substrate 101. Each of the plurality of word line capping structures 209 may be formed of a stacked layer or a single layer. For example, in the embodiment depicted, the plurality of word line capping structures 209 may be formed of single layers including barium strontium titanate, lead zirconium titanate, titanium oxide, aluminum oxide, hafnium oxide, yttrium oxide, zirconium oxide, or the like. Alternatively, in another embodiment depicted, the plurality of word line capping structures 209 may be formed of stacked layers. Each stacked layer may include a bottom layer and a top layer. The bottom layer may be respectively correspondingly disposed on the plurality of word line electrodes 207. The top layer may be disposed on the bottom layer and top surfaces of the top layers may be at the same vertical level as the vertical level of the top surface of the substrate 101. The bottom layers may be formed of, for example, a high dielectric-constant material such as barium strontium titanate, lead zirconium titanate, titanium oxide, aluminum oxide, hafnium oxide, yttrium oxide, zirconium oxide, or the like. The top layers may be formed of for example, a low dielectric-constant material such as silicon oxide, silicon nitride, silicon oxynitride, silicon nitride oxide, fluoride-doped silicate, or the like. The top layers formed of the low dielectric-constant material may reduce an electric field at the top surface of the substrate 101; therefore, leakage current may be reduced. The plurality of word line trenches 203, the plurality of word line insulating layers 205, the plurality of word line electrodes 207, and the plurality of word line capping structures 209 together form the plurality of word lines 201.

With reference to FIGS. 91 to 93, the buffer layer 109 may be disposed on the substrate 101. The buffer layer 109 may be formed of a stacked layer or a single layer including silicon oxide, silicon nitride, silicon oxynitride, silicon nitride oxide, fluoride-doped silicate, or the like.

With reference to FIGS. 91 to 93, a plurality of first bit line contact openings 303 may be disposed in the buffer layer 109 and in the upper portion of the substrate 101. The plurality of first bit line contact openings 303 may be disposed in center portions of some of the plurality of active regions 105 and between adjacent pairs of the plurality of word lines 201 as viewed from above. The plurality of first bit line contact openings 303 may expose some of the plurality of source/drain regions 107 disposed between the adjacent pairs of the plurality of word lines 201. The plurality of first bit line contacts 301 may be respectively correspondingly formed in the plurality of first bit line contact openings 303. The plurality of first bit line contacts 301 may be respectively correspondingly distanced from sidewalls of the plurality of first bit line contact openings 303. The plurality of first bit line contacts 301 may be formed of, for example, doped polysilicon, a metal, or a metal silicide. The plurality of first bit line contacts 301 may be electrically connected to center portions of the some of the plurality of source/drain regions 107 disposed between the adjacent pairs of the plurality of word lines 201. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

With reference to FIGS. 91 to 93, the plurality of first bit lines 305 may be correspondingly disposed above the plurality of first bit line contacts 301. The plurality of bit lines 305 are separated from each other and parallel to each other. The plurality of bit lines 305 may extend in the direction X diagonally intersecting the direction W and orthogonally intersecting the direction Y as viewed from above. Each of the plurality of first bit lines 305 may include a bottom bit line electrode layer 307, a top bit line electrode layer 309, and a mask pattern 311. The plurality of bottom bit line electrode layers 307 may be correspondingly disposed on the plurality of first bit line contacts 301. The plurality of top bit line electrode layers 309 may be respectively correspondingly disposed on the plurality of bottom bit line electrode layers 307. The plurality of mask patterns 311 may be respectively correspondingly disposed on the plurality of top bit line electrode layers 309. The plurality of bottom bit line electrode layers 307 may be formed of, for example, polysilicon. The plurality of top bit line electrode layers 309 may be formed of, for example, copper, nickel, cobalt, aluminum, or tungsten. The plurality of mask patterns 311 may be formed of, for example, silicon oxide or silicon nitride.

With reference to FIGS. 91 to 93, the plurality of spacers 313 may respectively correspondingly cover sidewalls of the plurality of mask patterns 311, sidewalls of the plurality of top bit line electrode layers 309, sidewalls of the plurality of bottom bit line electrode layers 307, and sidewalls of the plurality of first bit line contacts 301. The plurality of spacers 313 may be formed of, for example, silicon oxide, silicon nitride, silicon oxynitride, or silicon nitride oxide.

With reference to FIGS. 91 to 93, the first insulating film 501 may be disposed on the buffer layer 109 and encloses the plurality of bit lines 305 and the plurality of spacers 313. The first insulating film 501 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 91 to 93, a plurality of second bit line contact openings 403 may disposed in the first insulating film 501 and the buffer layer 109. The plurality of second bit line contact openings 403 may be disposed in center portions of others of the plurality of source/drain regions 107. The plurality of second bit line contacts 401 may be respectively correspondingly disposed in the plurality of second bit line contact openings 403. The plurality of second bit line contacts 401 may be electrically connected to the center portions of the others of the plurality of source/drain regions 107. The plurality of second bit line contacts 401 may be formed of, for example, doped polysilicon, a metal, or a metal silicide. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like. Top surfaces of the plurality of second bit line contacts 401 may be at a vertical level higher than a vertical level of the top surfaces of the plurality of mask patterns 311.

With reference to FIGS. 91 to 93, the second insulating film 503 may be disposed on the first insulating film 501. The second insulating film 503 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. A plurality of second bit line trenches 407 may be disposed in second insulating film 503. The plurality of second bit line contacts 401 may be exposed through the plurality of second bit line trenches 407. Each of the plurality of second bit line trenches 407 may extend in the direction X and may be disposed between an adjacent pair of the plurality of first bit lines 305 as viewed from above.

With reference to FIGS. 91 to 93, the plurality of second bit lines 405 may be respectively correspondingly disposed in the plurality of second bit line trenches 407. Bottom surfaces of the plurality of second bit lines 405 may be at a vertical level higher than the vertical level of the top surfaces of the plurality of mask patterns 311. A horizontal distance D1 between one of the plurality of first bit lines 305 and an adjacent one of the plurality of second bit lines 405 is less than a diagonal distance D2 between the one of the plurality of first bit lines 305 and the adjacent one of the plurality of second bit lines 405. The plurality of second bit lines 405 may be formed of, for example, copper, nickel, cobalt, aluminum, or tungsten.

With reference to FIGS. 91 to 93, a third insulating film 505 may be disposed on the second insulating film 503. The third insulating film 505 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. A plurality of first openings 603 may be disposed in the third insulating film 505, the second insulating film 503, the first insulating film 501, and the buffer layer 109. The plurality of first openings 603 may be disposed between the plurality of first bit lines 305 and the plurality of second bit lines 405 and respectively correspondingly overlap portions of the plurality of word lines 201 as viewed from above. The plurality of isolation units 605 may be respectively correspondingly disposed in the plurality of first openings 603. The plurality of isolation units 605 may be formed of, for example, an isolation material having etch selectivity with respect to the first insulating film 501, the second insulating film 503, the third insulating film 505, and the buffer layer 109. The isolation material may include, for example, quaternary silicon boron carbon nitride material, quaternary silicon oxygen carbon nitride material, ternary silicon carbon nitride material, or silicon nitride.

With reference to FIGS. 91 to 93, a plurality of plug openings 607 may be disposed in the third insulating film 505, the second insulating film 503, the first insulating film 501 and the buffer layer 109. Positions of the plurality of plug openings 607 may be between the plurality of first bit lines 305, the plurality of second bit lines 405, and areas which do not overlap the plurality of word lines 201 as viewed from above. The positions of the plurality of plug openings 607 may be respectively correspondingly between the plurality of isolation units 605. The plurality of conductive plugs 601 may be respectively correspondingly disposed in the plurality of plug openings 607. The plurality of conductive plugs 601 may be respectively correspondingly electrically connected to ends of the plurality of source/drain regions 107. The plurality of conductive plugs 601 may be formed of, for example, copper, nickel, cobalt, aluminum, or tungsten.

With reference to FIGS. 91 to 93, a fourth insulating film 507 may be disposed on the third insulating film 505. The fourth insulating film 507 may be formed of, for example, silicon nitride, silicon oxide, silicon oxynitride, flowable oxide, tonen silazen, undoped silica glass, borosilica glass, phosphosilica glass, borophosphosilica glass, plasma enhanced tetra-ethyl orthosilicate, fluoride silicate glass, carbon doped silicon oxide, xerogel, aerogel, amorphous fluorinated carbon, organo silicate glass, parylene, bis-benzocyclobutenes, polyimide, porous polymeric material, or a combination thereof, but is not limited thereto. A plurality of capacitor openings 703 may be disposed in the fourth insulating film 507. Positions of the plurality of first openings 603 may respectively correspondingly partially overlap the plurality of conductive plugs 601 as viewed from above; in other words, the plurality of first openings 603 may be respectively correspondingly above the plurality of conductive plugs 601 as seen in a cross-sectional view.

With reference to FIGS. 91 to 93, a plurality of bottom capacitor electrodes 705 may respectively correspondingly cover inner surfaces of the plurality of capacitor openings 703. The plurality of bottom capacitor electrodes 705 may be respectively correspondingly electrically connected to the plurality of conductive plugs 601; in other words, the plurality of bottom capacitor electrodes 705 may be respectively correspondingly electrically connected to the ends of the plurality of source/drain regions 107. In the embodiment depicted, the plurality of bottom capacitor electrodes 705 may be formed of for example, doped polysilicon, metal silicide, aluminum, copper, or tungsten. The metal silicide may be, for example, nickel silicide, platinum silicide, titanium silicide, molybdenum silicide, cobalt silicide, tantalum silicide, tungsten silicide, or the like.

With reference to FIGS. 91 to 93, a capacitor insulating layer 707 may be disposed on the plurality of bottom capacitor electrodes 705 in the plurality of capacitor openings 703. The capacitor insulating layer 707 may be a single layer or multiple layers. In the embodiment depicted, the capacitor insulating layer 707 may be a single layer formed of a high dielectric constant material such as barium strontium titanate, lead zirconium titanate, titanium oxide, aluminum oxide, hafnium oxide, yttrium oxide, zirconium oxide, or the like. Alternatively, in another embodiment depicted, the capacitor insulating layer 707 may be formed of multiple layers consisting of silicon oxide, silicon nitride, and silicon oxide.

With reference to FIGS. 91 to 93, a top capacitor electrode 709 may be respectively correspondingly disposed on the capacitor insulating layer 707 in the plurality of capacitor openings 703. The top capacitor electrode 709 may fill the plurality of capacitor openings 703 and cover the capacitor insulating layer 707. The top capacitor electrode 709 may be formed of, for example, doped polysilicon, copper, or aluminum. The plurality of bottom capacitor electrodes 705, the capacitor insulating layer 707, and the top capacitor electrode 709 together form the plurality of capacitor structures 701.

Due to the design of the semiconductor device of the present disclosure, the distance between one of the plurality of first bit lines 305 and an adjacent one of the plurality of second bit lines 405 may be extended as compared to the prior art; therefore, the resistive-capacitive delay induced by the parasitic capacitance originating from adjacent bit lines may be alleviated.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate having an upper surface;
a plurality of first bit line contacts contacting the upper surface of the substrate;
a plurality of first bit lines respectively correspondingly positioned on the plurality of first bit line contacts;
a plurality of second bit line contacts contacting the upper surface of the substrate; and
a plurality of second bit lines respectively correspondingly positioned on the plurality of first bit line contacts;
wherein top surfaces of the plurality of second bit line contacts are positioned at a vertical level higher than top surfaces of the plurality of first bit lines.

2. The semiconductor device of claim 1, wherein the plurality of first bit lines are separated from each other and parallel to each other.

3. The semiconductor device of claim 2, wherein the plurality of second bit lines are positioned between adjacent pairs of the plurality of first bit lines.

4. The semiconductor device of claim 3, wherein the plurality of first bit line contacts are formed of doped polysilicon, a metal, or a metal silicide.

5. The semiconductor device of claim 3, wherein the as plurality of second bit lines are formed of copper, nickel, cobalt, aluminum, or tungsten.

6. The semiconductor device of claim 3, wherein at least one of the plurality of first bit lines comprises a bottom bit line electrode layer, a top bit line electrode layer, and a mask pattern, wherein the bottom bit line electrode layer is correspondingly positioned on one of the plurality of first bit line contacts, the top bit line electrode layer is positioned on the bottom bit line electrode layer, and the mask pattern is positioned on the top bit line electrode layer.

7. The semiconductor device of claim 6, wherein the bottom bit line electrode layer is formed of polysilicon.

8. The semiconductor device of claim 6, wherein the top bit line electrode layer is formed of copper, nickel, cobalt, aluminum, or tungsten.

9. The semiconductor device of claim 6, wherein the mask pattern is formed of silicon oxide or silicon nitride.

10. The semiconductor device of claim 1, wherein bottom surfaces of the plurality of second bit lines are positioned at a vertical level higher than the top surfaces of the plurality of first bit lines.

11. A method for fabricating a semiconductor device, comprising:
providing a substrate having an upper surface;

forming a plurality of first bit line contacts contacting the upper surface of the substrate;

forming a plurality of first bit lines respectively correspondingly positioned on the plurality of first bit line contacts;

a plurality of second bit line contacts contacting the upper surface of the substrate; and forming a plurality of second bit lines respectively correspondingly positioned on the plurality of first bit line contacts;

wherein top surfaces of the plurality of second bit line contacts are positioned at a vertical level higher than top surfaces of the plurality of first bit lines.

12. The method for fabricating the semiconductor device of claim 11, wherein the plurality of first bit line contacts are formed of doped polysilicon, a metal, or a metal silicide.

13. The method for fabricating the semiconductor device of claim 11, wherein bottom surfaces of the plurality of second bit lines are positioned at a vertical level higher than the top surfaces of the plurality of first bit lines.

14. The method for fabricating the semiconductor device of claim 11, wherein the plurality of first bit lines are separated from each other and parallel to each other.

15. The method for fabricating the semiconductor device of claim 14, wherein the plurality of second bit lines are positioned between adjacent pairs of the plurality of first bit lines.

16. The method for fabricating the semiconductor device of claim 11, wherein the plurality of first bit line contacts are formed of doped polysilicon, a metal, or a metal silicide.

17. The method for fabricating the semiconductor device of claim 11, wherein the plurality of second bit lines are formed of copper, nickel, cobalt, aluminum, or tungsten.

18. The method for fabricating the semiconductor device of claim 11, wherein the plurality of second bit line contacts are formed of doped polysilicon, a metal, or a metal silicide.

19. The method for fabricating the semiconductor device of claim 11, further comprising: forming a plurality of plugs contacting the upper surface of the substrate.

20. The method for fabricating the semiconductor device of claim 19, further comprising: forming a plurality of capacitors respectively correspondingly positioned on the plurality of plugs.

* * * * *